US012648251B2

(12) United States Patent
Ikeda et al.

(10) Patent No.: US 12,648,251 B2
(45) Date of Patent: Jun. 2, 2026

(54) IMAGING DEVICE AND ELECTRONIC DEVICE

(71) Applicant: SEMICONDUCTOR ENERGY LABORATORY CO., LTD., Atsugi (JP)

(72) Inventors: Takayuki Ikeda, Atsugi (JP); Tatsuya Onuki, Atsugi (JP); Kiyoshi Kato, Atsugi (JP); Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 345 days.

(21) Appl. No.: 18/567,132

(22) PCT Filed: Jun. 6, 2022

(86) PCT No.: PCT/IB2022/055227
§ 371 (c)(1),
(2) Date: Dec. 5, 2023

(87) PCT Pub. No.: WO2022/263967
PCT Pub. Date: Dec. 22, 2022

(65) Prior Publication Data
US 2024/0266378 A1    Aug. 8, 2024

(30) Foreign Application Priority Data
Jun. 17, 2021    (JP) ................................. 2021-101091

(51) Int. Cl.
*H10F 39/00* (2025.01)
*H10W 90/00* (2026.01)

(52) U.S. Cl.
CPC ......... *H10F 39/809* (2025.01); *H10W 90/792* (2026.01)

(58) Field of Classification Search
CPC ...... H10F 39/809; H10F 39/12; H10F 39/811; H10F 39/8037; H10F 39/182;
(Continued)

(56) References Cited

U.S. PATENT DOCUMENTS

| 5,501,989 A | 3/1996 | Takayama et al. |
| 7,265,402 B2 | 9/2007 | Koyanagi |

(Continued)

FOREIGN PATENT DOCUMENTS

| CN | 001871708 A | 11/2006 |
| CN | 110574164 A | 12/2019 |

(Continued)

OTHER PUBLICATIONS

International Search Report (Application No. PCT/IB2022/055227) Dated Aug. 16, 2022.
(Continued)

*Primary Examiner* — Douglas W Owens
(74) *Attorney, Agent, or Firm* — NIXON PEABODY LLP; Jeffrey L. Costellia

(57) ABSTRACT

One embodiment of the present invention relates to a highly functional imaging device that can be manufactured through a small number of steps. The imaging device is formed by bonding a plurality of layers or stacks each including a device to each other. A pixel circuit; a memory circuit; and a pixel driver circuit, a driver circuit of the memory circuit, and the like can be provided for a first layer, a second layer, and a third layer, respectively.

19 Claims, 30 Drawing Sheets

(58) Field of Classification Search

CPC ... H10F 39/184; H10W 90/792; H10D 30/67; H10D 84/00; H10D 84/0126; H10D 84/038; H10D 84/83; H10D 84/811; H10D 30/6755; H01L 24/08

See application file for complete search history.

(56) References Cited

U.S. PATENT DOCUMENTS

| | | | |
|---|---|---|---|
| 7,495,206 | B2 | 2/2009 | Park |
| 7,674,650 | B2 | 3/2010 | Akimoto et al. |
| 7,701,029 | B2 | 4/2010 | Mabuchi |
| 7,812,874 | B2 | 10/2010 | Iwabuchi et al. |
| 8,314,870 | B2 | 11/2012 | Itonaga et al. |
| 8,378,341 | B2 | 2/2013 | Hayashi et al. |
| 8,378,391 | B2 | 2/2013 | Koyama et al. |
| 8,440,954 | B2 | 5/2013 | Masaaki |
| 8,466,403 | B2 | 6/2013 | Endo et al. |
| 8,629,524 | B2 | 1/2014 | Wang et al. |
| 8,669,602 | B2 | 3/2014 | Hayashi |
| 8,735,263 | B2 | 5/2014 | Yamazaki et al. |
| 8,749,679 | B2 | 6/2014 | Shinohara |
| 8,772,130 | B2 | 7/2014 | Ohki |
| 8,928,795 | B2 | 1/2015 | Kusaka |
| 9,093,575 | B2 | 7/2015 | Yokoyama |
| 9,123,529 | B2 | 9/2015 | Hanaoka et al. |
| 9,136,141 | B2 | 9/2015 | Koezuka |
| 9,293,496 | B2 | 3/2016 | Kashihara |
| 9,349,766 | B2 | 5/2016 | Sugiura |
| 9,473,714 | B2 | 10/2016 | Aoki et al. |
| 9,502,450 | B2 | 11/2016 | Yanagita et al. |
| 9,553,120 | B2 | 1/2017 | Park et al. |
| 9,748,291 | B2 | 8/2017 | Ikeda et al. |
| 9,876,946 | B2 | 1/2018 | Ikeda |
| 9,905,598 | B2 | 2/2018 | Yamazaki et al. |
| 10,020,336 | B2 | 7/2018 | Ikeda et al. |
| 10,645,328 | B2 | 5/2020 | Gomi |
| 11,289,526 | B2 | 3/2022 | Shohji et al. |
| 12,212,873 | B2 * | 1/2025 | Negoro ................. H10D 30/67 |

| | | | |
|---|---|---|---|
| 2005/0029643 | A1 | 2/2005 | Koyanagi |
| 2011/0101333 | A1 | 5/2011 | Shionoiri et al. |
| 2012/0104523 | A1 | 5/2012 | Ikeda |
| 2013/0285046 | A1 | 10/2013 | Yamazaki |
| 2015/0162371 | A1 | 6/2015 | Fujii et al. |
| 2015/0263053 | A1 | 9/2015 | Yamazaki et al. |
| 2015/0279884 | A1 | 10/2015 | Kusumoto |
| 2015/0349129 | A1 | 12/2015 | Ikeda |
| 2016/0118425 | A1 | 4/2016 | Kurokawa |
| 2016/0133660 | A1 | 5/2016 | Inoue et al. |
| 2016/0225808 | A1 | 8/2016 | Kurokawa |
| 2017/0041517 | A1 | 2/2017 | Ikeda |
| 2019/0289239 | A1 | 9/2019 | Gomi |
| 2021/0104571 | A1 | 4/2021 | Shohji et al. |
| 2022/0157877 | A1 | 5/2022 | Shohji et al. |
| 2022/0320172 | A1 * | 10/2022 | Negoro ................. H10F 39/802 |
| 2022/0399390 | A1 | 12/2022 | Washio et al. |
| 2023/0307397 | A1 * | 9/2023 | Okada ..................... H01L 25/18 |
| 2023/0396899 | A1 | 12/2023 | Negoro et al. |

FOREIGN PATENT DOCUMENTS

| | | | |
|---|---|---|---|
| EP | 1453097 | A | 9/2004 |
| JP | 2011-119711 | A | 6/2011 |
| JP | 2016-213298 | A | 12/2016 |
| JP | 2017-034677 | A | 2/2017 |
| JP | 2021-100025 | A | 7/2021 |
| KR | 2005-0043754 | A | 5/2005 |
| KR | 2019-0131489 | A | 11/2019 |
| TW | 200300291 | | 5/2003 |
| TW | 201842660 | | 12/2018 |
| WO | WO-2003/041174 | | 5/2003 |
| WO | WO-2018/109821 | | 6/2018 |
| WO | WO-2018/186192 | | 10/2018 |

OTHER PUBLICATIONS

Written Opinion (Application No. PCT/IB2022/055227) Dated Aug. 16, 2022.

* cited by examiner 201    210

202b    220b 202a    220a    208

203    230

204    240

204    240

203    230

A 202b    220b 202a    220a    208

B 201    210

352

203    331 PIX

321b MEM 202b    323

321a MEM 202a    322

353

201    311 RC

331 PIX

321b MEM

321a MEM

314

311 RC 204    240

203    230

- - - A 201    210

- - - B 202b    220b 202a    220a 206    260

204    240

203    230     331 PIX

A - - →

33
31
34
32

201    210    311 RC    314    332 PDRV

36
B - - →
35
39
40
37 38
41 42

202b    220b    321b MEM 202a    220a    321a MEM 206    260    325 MEM    312 MD

331

331

FIG. 16A
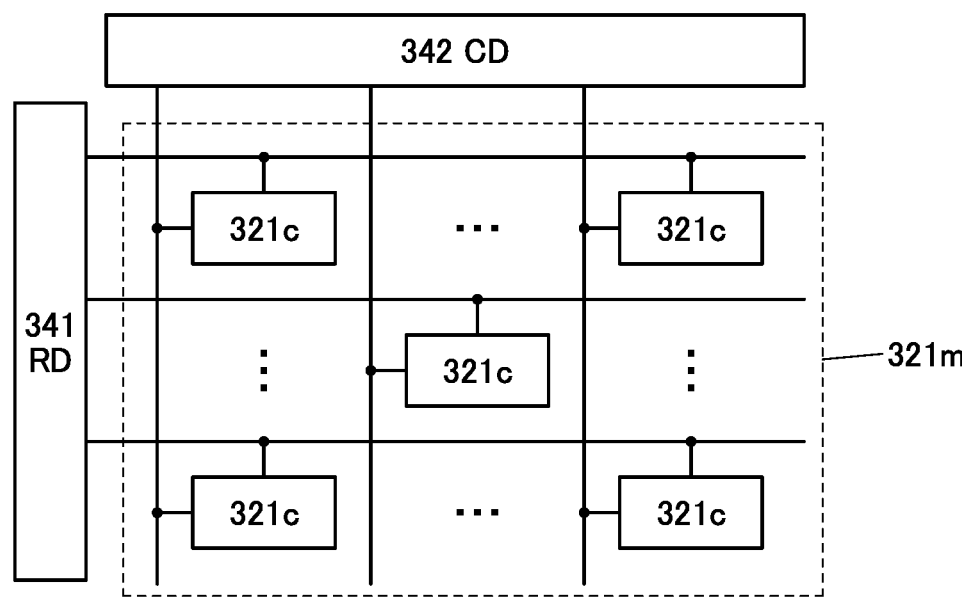
FIG. 16B
321c1
FIG. 16C
321c2
FIG. 16D
321c3
FIG. 16E
321d
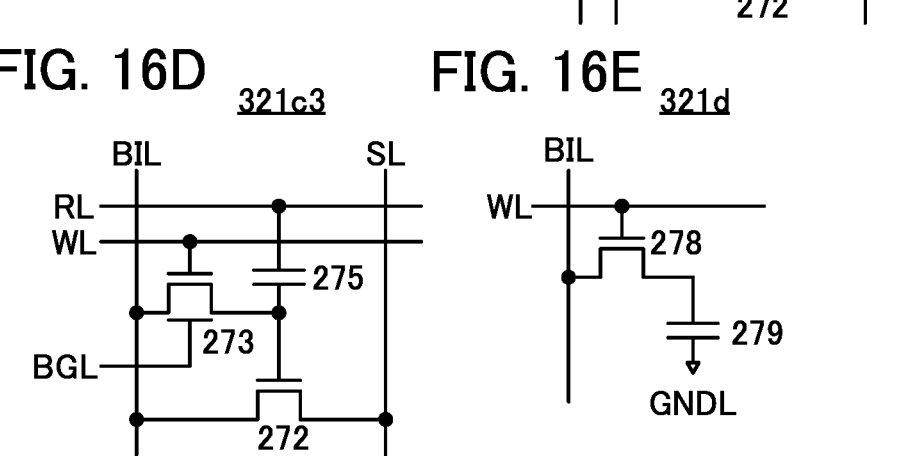

FIG. 21A
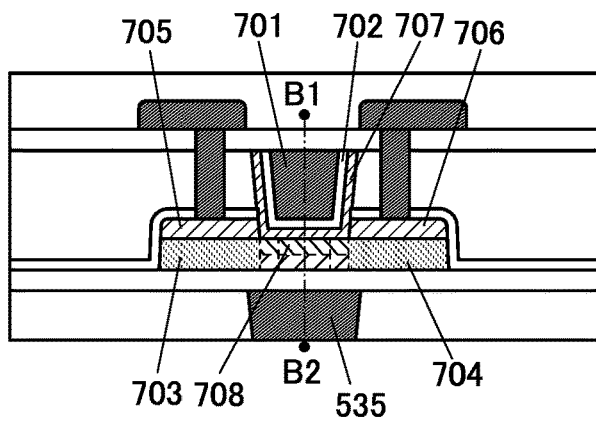
FIG. 21B
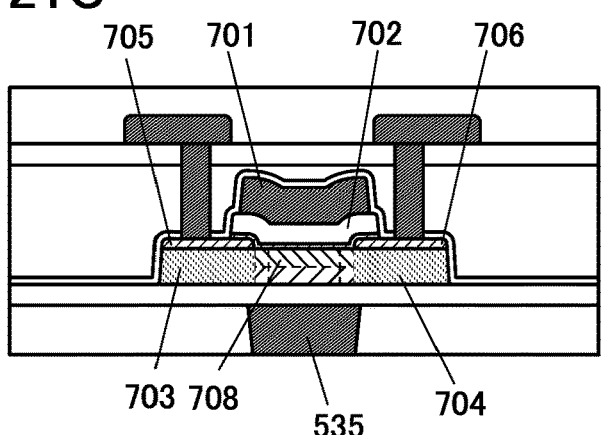
FIG. 21C
FIG. 21D
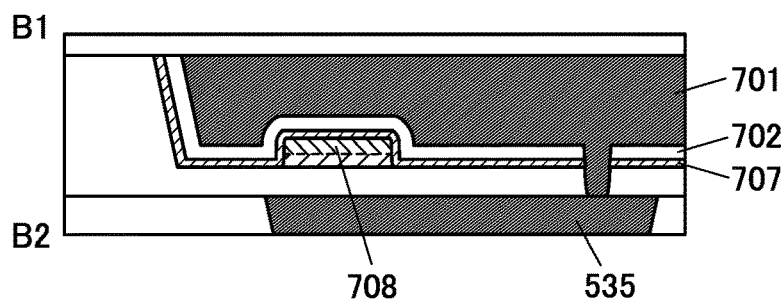

250R  250G  250B

204

251

250R  250G  250B  250IR

204

251

250R  250G  250B  250UV

204

251

FIG. 29A
985 987 984
982
983
981
986
FIG. 29B
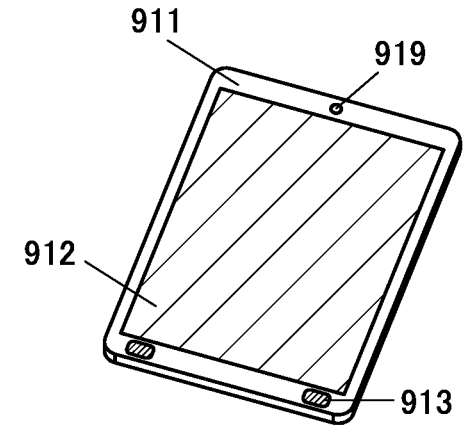
911
919
912
913
FIG. 29C
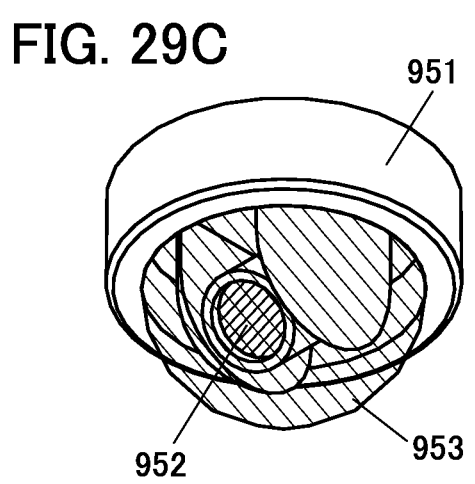
951
952
953
FIG. 29D
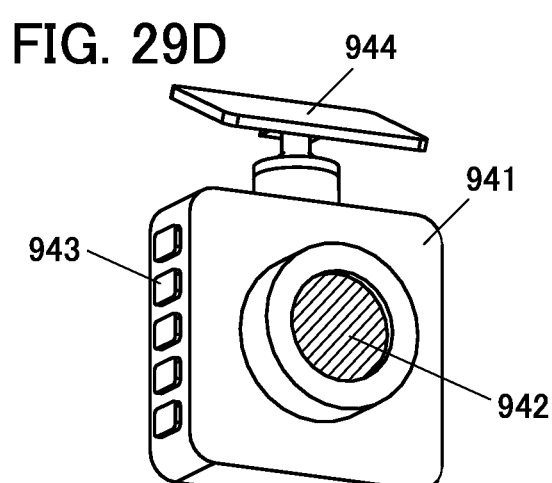
944
941
943
942
FIG. 29E
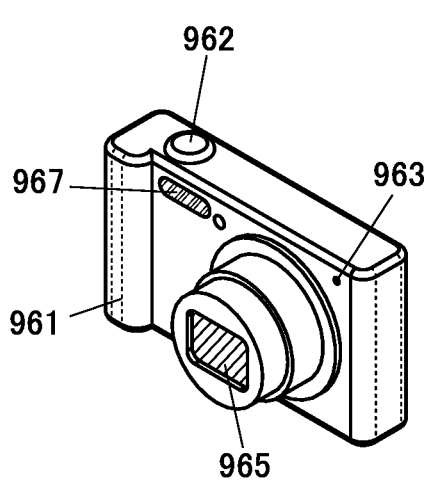
962
967
963
961
965
FIG. 29F
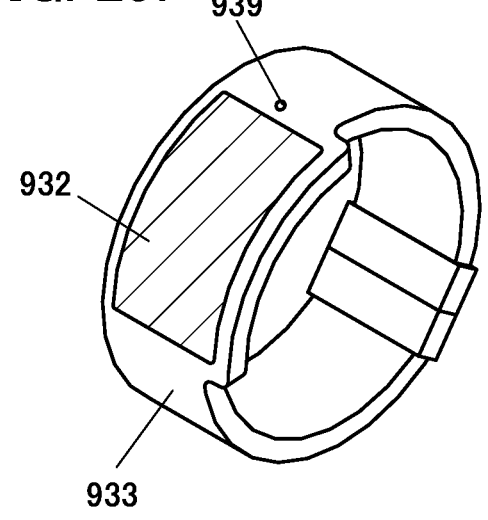
939
932
933

IMAGING DEVICE AND ELECTRONIC DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, more specific examples of the technical field of one embodiment of the present invention disclosed in this specification include a semiconductor apparatus, a display device, a liquid crystal display device, a light-emitting device, a lighting device, a power storage device, a memory device, an imaging device, an operation method thereof, and a manufacturing method thereof.

Note that in this specification and the like, a semiconductor apparatus generally means an apparatus that can function by utilizing semiconductor characteristics. A transistor and a semiconductor circuit are embodiments of semiconductor apparatuses. In addition, in some cases, a memory device, a display device, an imaging device, or an electronic device includes a semiconductor apparatus.

BACKGROUND ART

A technique for forming a transistor using an oxide semiconductor thin film formed over a substrate has attracted attention. For example, Patent Document 1 discloses an imaging device with a structure in which a transistor including an oxide semiconductor and having extremely low off-state current is used in a pixel circuit.

REFERENCE

Patent Document

[Patent Document 1] Japanese Published Patent Application No. 2011-119711

SUMMARY OF THE INVENTION

Problems to be Solved by the Invention

With development in technology, a high-quality image can be easily captured with an imaging device such as a CMOS image sensor. In the next generation, an imaging device is required to be more highly functional.

In contrast, an imaging device is also required to reduce its size because the imaging device is incorporated into a variety of devices. Thus, even in the case where a function is added, a sensor chip is desired to reduce its size. Accordingly, a component to add a function to an imaging device is preferably placed to be stacked.

However, in the case where a plurality of semiconductor devices are stacked, a polishing step, a bonding step, and the like are required to be performed a plurality of times. Thus, improvement in the yield is a challenge.

Therefore, an object of one embodiment of the present invention is to provide a highly functional imaging device. Another object is to provide an imaging device that can be manufactured through a small number of steps. Another object is to provide an imaging device that can be manufactured with a high yield. Another object is to provide a small imaging device. Another object is to provide an imaging device or the like capable of a high-speed operation. Another object is to provide an imaging device with high reliability. Another object is to provide a novel imaging device or the like. Another object is to provide a method for driving the above imaging device. Another object is to provide a novel semiconductor device or the like.

Note that the description of these objects does not preclude the existence of other objects. Note that in one embodiment of the present invention, there is no need to achieve all of these objects. Note that other objects will be apparent from the description of the specification, the drawings, the claims, and the like, and other objects can be derived from the description of the specification, the drawings, the claims, and the like.

Means for Solving the Problems

One embodiment of the present invention relates to a highly functional imaging device that can be manufactured through a small number of steps.

A first embodiment of the present invention is an imaging device including a first layer, a second layer, a third layer, a fourth layer, and a fifth layer that include an overlapping region. The second layer, the third layer, and the fourth layer are provided between the first layer and the fifth layer. The second layer is provided between the first layer and the third layer. The fourth layer is provided between the third layer and the fifth layer. The first layer includes a read circuit, a first driver circuit, and a second driver circuit. The second layer includes a first transistor included in a first memory circuit. The third layer includes a second transistor included in a second memory circuit, a first conductive layer, and a second conductive layer. The fourth layer includes a third transistor included in a pixel circuit, a third conductive layer, and a fourth conductive layer. The fifth layer includes a photoelectric conversion device included in the pixel circuit. The pixel circuit is electrically connected to the read circuit through the first conductive layer and the third conductive layer. The pixel circuit is electrically connected to the first driver circuit through the second conductive layer and the fourth conductive layer. The first memory circuit and the second memory circuit are electrically connected to the read circuit and the second driver circuit. The first transistor, the second transistor, and the third transistor each include a metal oxide in a channel formation region. The first conductive layer and the third conductive layer, and the second conductive layer and the fourth conductive layer are each directly joined to each other.

It is preferable that the first conductive layer to the fourth conductive layer be formed of the same metal material and that the metal material be Cu, Al, W, or Au.

A second embodiment of the present invention is an imaging device including a first layer, a second layer, a third layer, a fourth layer, and a fifth layer that include an overlapping region. The second layer, the third layer, and the fourth layer are provided between the first layer and the fifth layer. The second layer is provided between the first layer and the third layer. The fourth layer is provided between the third layer and the fifth layer. The first layer includes a read circuit, a first driver circuit, a second driver circuit, a first conductive layer, a second conductive layer, a third conductive layer, a fourth conductive layer, a fifth conductive layer, and a sixth conductive layer. The second layer includes a first transistor included in a first memory circuit, a seventh conductive layer, an eighth conductive layer, a ninth conductive layer, a tenth conductive layer, an eleventh conductive layer, and a twelfth conductive layer. The third layer includes a second transistor included in a second memory circuit, a thirteenth conductive layer, and a fourteenth conductive layer. The fourth layer includes a third transistor included in a pixel circuit, a fifteenth conductive layer, and a sixteenth conductive layer. The fifth layer includes a photoelectric conversion device included in the pixel circuit. The pixel circuit is electrically connected to the read circuit through the first conductive layer, the seventh conductive layer, the thirteenth conductive layer, and the fifteenth conductive layer. The pixel circuit is electrically connected to the first driver circuit through the second conductive layer, the eighth conductive layer, the fourteenth conductive layer, and the sixteenth conductive layer. The first memory circuit is electrically connected to the read circuit through the third conductive layer and the ninth conductive layer. The first memory circuit is electrically connected to the second driver circuit through the fourth conductive layer and the tenth conductive layer. The second memory circuit is electrically connected to the read circuit through the fifth conductive layer and the eleventh conductive layer. The second memory circuit is electrically connected to the second driver circuit through the sixth conductive layer and the twelfth conductive layer. The first transistor, the second transistor, and the third transistor each include a metal oxide in a channel formation region. The first conductive layer and the seventh conductive layer, the second conductive layer and the eighth conductive layer, the third conductive layer and the ninth conductive layer, the fourth conductive layer and the tenth conductive layer, the fifth conductive layer and the eleventh conductive layer, the sixth conductive layer and the twelfth conductive layer, the thirteenth conductive layer and the fifteenth conductive layer, and the fourteenth conductive layer and the sixteenth conductive layer are each directly joined to each other.

It is preferable that the first conductive layer to the twelfth conductive layer be formed of the same metal material, the thirteenth conductive layer to the sixteenth conductive layer be formed of the same metal material, and that the metal material be Cu, Al, W, or Au.

In the second embodiment of the present invention, the second layer can include a support region including a single crystal silicon substrate, and the seventh conductive layer to the twelfth conductive layer can be provided in the support region.

In addition, in the first embodiment and the second embodiment of the present invention, the first layer can include an arithmetic circuit and the arithmetic circuit can be electrically connected to the second driver circuit.

A third embodiment of the present invention is an imaging device including a first layer, a second layer, a third layer, a fourth layer, and a fifth layer that include an overlapping region. The second layer, the third layer, and the fourth layer are provided between the first layer and the fifth layer. The second layer is provided between the first layer and the third layer. The fourth layer is provided between the third layer and the fifth layer. The first layer includes a read circuit, a first driver circuit, a second driver circuit, and an arithmetic circuit. The second layer includes a first transistor included in a first memory circuit, a first conductive layer, a second conductive layer, a third conductive layer, and a fourth conductive layer. The third layer includes a second transistor included in a second memory circuit, a fifth conductive layer, a sixth conductive layer, a seventh conductive layer, an eighth conductive layer, a ninth conductive layer, and a tenth conductive layer. The fourth layer includes a third transistor included in a pixel circuit, an eleventh conductive layer, and a twelfth conductive layer. The fifth layer includes a photoelectric conversion device included in the pixel circuit. The pixel circuit is electrically connected to the read circuit through the first conductive layer, the fifth conductive layer, the ninth conductive layer, and the tenth conductive layer. The pixel circuit is electrically connected to the first driver circuit through the second conductive layer, the sixth conductive layer, the tenth conductive layer, and the twelfth conductive layer. The first memory circuit is electrically connected to the arithmetic circuit. The second memory circuit is electrically connected to the read circuit through the third conductive layer and the seventh conductive layer. The second memory circuit is electrically connected to the second driver circuit through the fourth conductive layer and the eighth conductive layer. The first transistor, the second transistor, and the third transistor each include a metal oxide in a channel formation region. The first conductive layer and the fifth conductive layer, the second conductive layer and the sixth conductive layer, the third conductive layer and the seventh conductive layer, the fourth conductive layer and the eighth conductive layer, the ninth conductive layer and the tenth conductive layer, and the tenth conductive layer and the twelfth conductive layer are each directly joined to each other.

It is preferable that the first conductive layer to the eighth conductive layer be formed of the same metal material, the ninth conductive layer to the twelfth conductive layer be formed of the same metal material, and that the metal material be Cu, Al, W, or Au.

In the third embodiment of the present invention, the third layer can include a support region including a single crystal silicon substrate, and the fifth conductive layer to the eighth conductive layer can be provided in the support region.

In the first embodiment to the third embodiment of the present invention, the first layer and the fifth layer can each include a single crystal silicon substrate. In addition, the metal oxide can include In, Zn, and M (M is one or more of Al, Ti, Ga, Ge, Sn, Y, Zr, La, Ce, Nd, and Hf).

Effect of the Invention

With the use of one embodiment of the present invention, a highly functional imaging device can be provided. An imaging device that can be manufactured through a small number of steps can be provided. Alternatively, an imaging device that can be manufactured with a high yield can be provided. Alternatively, a small imaging device can be provided. Alternatively, an imaging device or the like capable of a high-speed operation can be provided. Alternatively, an imaging device with high reliability can be provided. Alternatively, a novel imaging device or the like can be provided. Alternatively, a method for driving the above imaging device can be provided. Alternatively, a novel semiconductor device or the like can be provided.

Note that the description of these effects does not preclude the presence of other effects. One embodiment of the present invention does not necessarily have all of these effects. Other effects can be derived from the description of the specification, the drawings, and the claims.

BRIEF DESCRIPTION OF THE DRAWINGS

FIG. 16A is a diagram illustrating a memory circuit. FIG. 16B to FIG. 16E are diagrams illustrating memory cells.

FIG. 21A to FIG. 21D are diagrams illustrating OS transistors.

FIG. 29A to FIG. 29F are diagrams illustrating electronic devices.

MODE FOR CARRYING OUT THE INVENTION

Figure 1:
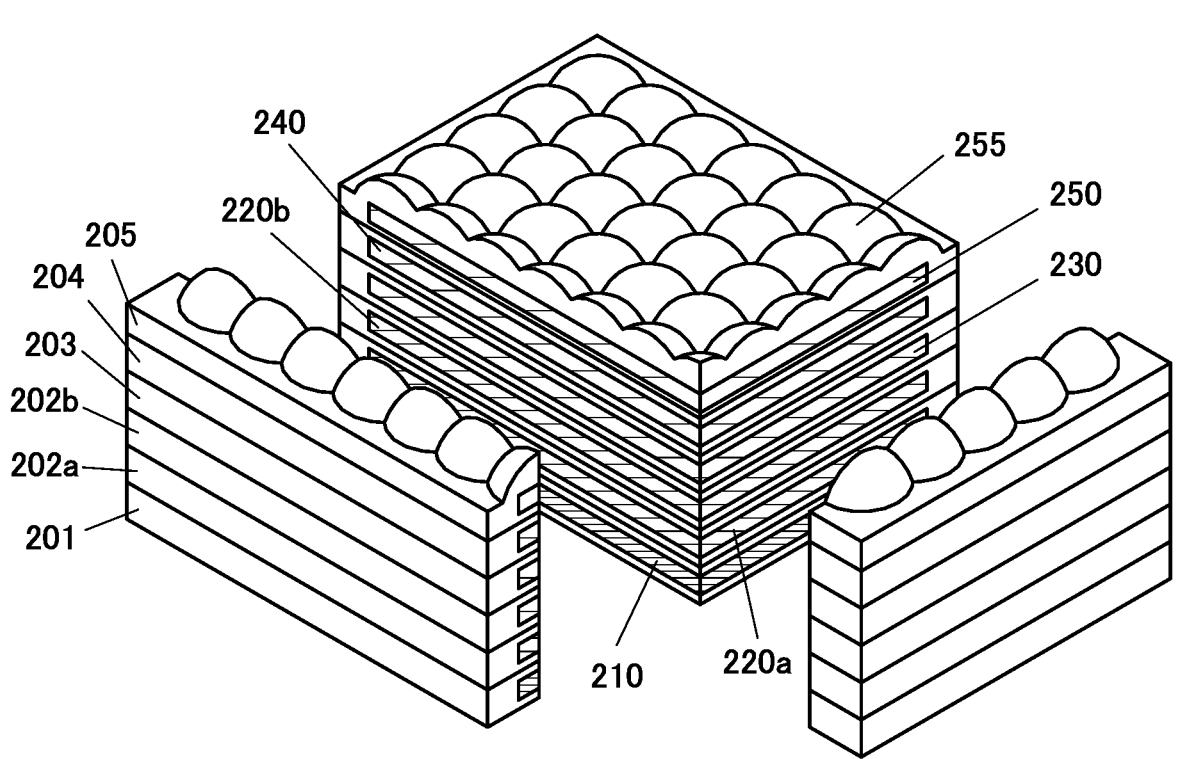
FIG. 1 is a cross-sectional perspective view illustrating an imaging device.

Embodiments will be described in detail with reference to the drawings. Note that the present invention is not limited to the following description, and it will be readily understood by those skilled in the art that modes and the details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In addition, even in the case where a single component is illustrated in a circuit diagram, the component may be composed of a plurality of parts as long as there is no functional inconvenience. For example, in some cases, a plurality of transistors that operate as a switch are connected in series or in parallel. Furthermore, in some cases, capacitors are divided and placed in a plurality of positions.

In addition, one conductor has a plurality of functions such as a wiring, an electrode, and a terminal in some cases. In this specification, a plurality of names are used for the same component in some cases. Furthermore, even in the case where elements are illustrated in a circuit diagram as if they were directly connected to each other, the elements may actually be connected to each other through one conductor or a plurality of conductors. In this specification, even such a structure is included in the category of direct connection.

Embodiment 1

In this embodiment, an imaging device according to one embodiment of the present invention will be described with reference to drawings.

One embodiment of the present invention is an imaging device including a plurality of stacked devices. The imaging device is formed by bonding a plurality of layers or stacks including the devices to each other. Thus, even when a structure is employed in which a plurality of circuits having different functions are stacked, the number of polishing steps and bonding steps can be reduced, which can improve the yield.

For example, a pixel circuit; a memory circuit; and a pixel driver circuit, a driver circuit of the memory circuit, and the like can be provided for a first layer, a second layer, and a third layer, respectively. With such a structure, a small imaging device can be formed. Furthermore, wiring delay or the like can be inhibited by stacking the circuits, so that a high-speed operation can be performed.

<Stacked Structure>

FIG. 1 is a cross-sectional perspective view illustrating an imaging device according to one embodiment of the present invention. The imaging device includes a layer 201, a layer 202*a*, a layer 202*b*, a layer 203, a layer 204, and a layer 205.

Note that although the description is made in which the imaging device is divided into a plurality of layers for clarity of the description in this embodiment, the kind, quantity, and positions of components included in each layer are not limited to those described in this embodiment. For example, components such as an insulating layer, a wiring, and a plug that are positioned near a boundary between layers sometimes belongs to a layer different from the layer described in this embodiment. In addition, a component different from these components may be included. Furthermore, the imaging device sometimes includes a layer other than the above.

The layer 201 includes a region 210. A read circuit of a pixel circuit, a driver circuit of the pixel circuit, a driver circuit of a memory circuit, an arithmetic circuit, and the like can be provided in the region 210, for example.

The layer 202a includes a region 220a. A first memory circuit and the like can be provided in the region 220a, for example.

The layer 202b includes a region 220b. A second memory circuit and the like can be provided in the region 220b, for example.

The layer 203 includes a region 230. A pixel circuit (except a photoelectric conversion device) and the like can be provided in the region 230, for example. Note that part of the driver circuit of the pixel circuit included in the region 210 may be provided in the region 230.

The layer 204 includes a region where a photoelectric conversion device 240 is provided. As the photoelectric conversion device 240, a photodiode or the like can be used, for example. Note that the photoelectric conversion device 240 can be also regarded as a component of the pixel circuit.

The layer 205 includes a region where an optical conversion layer 250 is provided. As the optical conversion layer 250, a color filter or the like can be used, for example. In addition, the layer 205 can include a microlens array 255.

As described above, the imaging device according to one embodiment of the present invention includes the photoelectric conversion device 240, the pixel circuit provided in the region 230, the first memory circuit provided in the region 220a, the second memory circuit provided in the region 220b, the read circuit of the pixel circuit provided in the region 210, the driver circuit of the pixel circuit, the driver circuit of the memory circuit, the arithmetic circuit, and the like. Note that as the arithmetic circuit, an image processing circuit or the like can be employed, for example.

Here, the photoelectric conversion device 240 preferably has sensitivity to visible light. For example, a Si photodiode that uses single crystal silicon in a photoelectric conversion layer can be used as the photoelectric conversion device 240.

A photodiode in which single crystal silicon is used for a photoelectric conversion layer has comparatively wide spectral sensitivity to light from ultraviolet light to near-infrared light and can detect light with a variety of wavelengths by being combined with an optical conversion layer to be described later. In addition, the photodiode in which single crystal silicon is used for the photoelectric conversion layer can function as a highly sensitive avalanche photodiode by being supplied with comparatively high voltage.

Alternatively, a compound semiconductor may be used for the photoelectric conversion layer of the pn junction photodiode. As the compound semiconductor, gallium arsenic phosphide (GaAsP), gallium phosphide (GaP), indium gallium arsenide (InGaAs), lead sulfide (PbS), lead selenide (PbSe), indium arsenide (InAs), indium antimonide (InSb), mercury cadmium telluride (HgCdTe), or the like can be used, for example.

The compound semiconductor is preferably a compound semiconductor including a Group 13 element (aluminum, gallium, indium, or the like) and a Group 15 element (nitrogen, phosphorus, arsenic, antimony, or the like) (such a compound semiconductor is also referred to as a Group III-V compound semiconductor) or a compound semiconductor including a Group 12 element (magnesium, zinc, cadmium, mercury, or the like) and a Group 16 element (oxygen, sulfur, selenium, tellurium, or the like) (such a compound semiconductor is also referred to as a Group II-VI compound semiconductor).

The compound semiconductor can change the bandgap depending on the combination of constituent elements or the atomic ratio of the constituent elements and thus enables formation of a photodiode having sensitivity to a wide wavelength range from ultraviolet light to infrared light.

Note that the wavelength of ultraviolet light can be generally defined as the vicinity of 0.01 μm to the vicinity of 0.38 μm; the wavelength of visible light can be generally defined as the vicinity of 0.38 μm to the vicinity of 0.75 μm; the wavelength of near-infrared light can be generally defined as the vicinity of 0.75 μm to the vicinity of 2.5 μm; the wavelength of mid-infrared light can be generally defined as the vicinity of 2.5 μm to the vicinity of 4 μm; and the wavelength of far-infrared light can be generally defined as the vicinity of 4 μm to the vicinity of 1000 μm.

For example, to form a photodiode having sensitivity to light from ultraviolet light to visible light, GaP or the like can be used for the photoelectric conversion layer. In addition, to form a photodiode having sensitivity to light from ultraviolet light to near-infrared light, silicon, GaAsP, or the like can be used for the photoelectric conversion layer. Furthermore, to form a photodiode having sensitivity to light from visible light to mid-infrared light, InGaAs or the like can be used for the photoelectric conversion layer. Furthermore, to form a photodiode having sensitivity to light from near-infrared light to mid-infrared light, PbS, InAs, or the like can be used for the photoelectric conversion layer. Moreover, to form a photodiode having sensitivity to light from mid-infrared light to far-infrared light, PbSe, InSb, HgCdTe, or the like can be used for the photoelectric conversion layer.

Note that the photodiodes using the above compound semiconductors may be pin junction photodiodes as well as pn junction photodiodes. Furthermore, the pn junction and the pin junction may have a heterojunction structure without being limited to a homojunction structure.

For example, in the heterojunction, a first compound semiconductor can be used as one layer of the pn junction structure, and a second compound semiconductor that is different from the first compound semiconductor can be used as the other layer. Furthermore, a first compound semiconductor can be used as any one layer or two layers of the pin junction structure, and a second compound semiconductor that is different from the first compound semiconductor can be used as the other layer(s). Note that one of the first compound semiconductor and the second compound semiconductor may be a semiconductor of a single element, such as silicon.

Note that different materials may be used for different pixels in forming photoelectric conversion layers of photodiodes. With this structure, an imaging device including any two kinds of pixels or three kinds of pixels among a pixel that detects ultraviolet light, a pixel that detects visible light, a pixel that detects infrared light, and the like can be formed.

In addition, a pn-junction photodiode containing a selenium-based material in a photoelectric conversion layer may be used as the photoelectric conversion device 240. A photoelectric conversion device using a selenium-based material has characteristics of high external quantum efficiency with respect to visible light. In the photoelectric conversion device, the amount of amplification of electrons with respect to the amount of incident light can be increased by utilizing avalanche multiplication. Furthermore, a selenium-based material has a high light-absorption coefficient and thus has advantages in production; for example, a photoelectric conversion layer can be manufactured using a thin film. A thin film of a selenium-based material can be formed by a vacuum evaporation method, a sputtering method, or the like.

As the selenium-based material, crystalline selenium (single crystal selenium or polycrystalline selenium) or amorphous selenium can be used. These selenium-based materials have sensitivity to light from ultraviolet light to visible light. Furthermore, a compound of copper, indium, and selenium (CIS), a compound of copper, indium, gallium, and selenium (CIGS), or the like can be used. These compounds have sensitivity to light from ultraviolet light to near-infrared light.

As components of the pixel circuit, transistors each including a metal oxide in a channel formation region (hereinafter OS transistors) are preferably used. The OS transistor has extremely low off-state current and can suppress unnecessary data leakage from the pixel circuit. Therefore, a global shutter operation in which data are acquired in a plurality of pixel circuits at once and are sequentially read can be performed with a simple circuit structure. In addition, a pixel driver circuit and the pixel circuit can be formed through common steps.

Moreover, the OS transistor has higher drain withstand voltage than a Si transistor. An avalanche photodiode is preferably operated by being supplied with comparatively high voltage (for example, higher than or equal to 10 V). Therefore, in the case where the avalanche photodiode is used, the imaging device can have high reliability through a combination with the OS transistor.

Note that a light-blocking layer is preferably provided between the avalanche photodiode and the OS transistor in the pixel. The light-blocking layer can suppress a change in characteristics due to irradiation of the OS transistor with light. In addition, the light-blocking layer can also suppress stray light corresponding to light that is delivered to the vicinity of the OS transistor, is reflected, and enters another pixel. For example, the light-blocking layer can be formed using a metal layer and may function as an electrode of the avalanche photodiode. Furthermore, when a metal is used for the light-blocking layer, light that has reached the light-blocking layer is reflected, so that the sensitivity of the avalanche photodiode can be increased.

It is preferable to use OS transistors also in the first memory circuit and the second memory circuit (hereinafter sometimes referred to as a memory circuit when they are not distinguished from each other). The use of the OS transistor as a cell transistor in the memory circuit can suppress unnecessary data leakage and can reduce the refresh frequency. Accordingly, power consumption can be reduced. Note that a transistor including silicon in a channel formation region can be also used as the cell transistor in the memory circuit. Furthermore, a ferroelectric capacitor may be used in a memory cell included in the memory circuit. Data retained in a ferroelectric capacitor is nonvolatile and thus no refresh operation is required; accordingly, power consumption can be reduced.

A high-speed operation is required for each of the read circuit of the pixel circuit, the driver circuit of the pixel circuit, the driver circuit of the memory circuit, the arithmetic circuit, and the like; thus, transistors with high mobility are preferably used. For example, Si transistors are preferably used. Examples of the Si transistor include a transistor including amorphous silicon, a transistor including crystalline silicon (microcrystalline silicon, low-temperature polysilicon, or single crystal silicon), and the like. Note that the pixel circuit may be formed using a Si transistor.

In the above structure of the imaging device according to one embodiment of the present invention, the memory circuit (high-capacity memory) can be placed close to the driver circuit and the arithmetic circuit; thus, high-speed, low-power data exchange is possible. For example, the arithmetic circuit can store data and perform arithmetic processing without access to an external memory circuit.

As a specific example, in the case where a high-resolution moving image with a high frame rate is captured, for example, the arithmetic circuit needs to access the memory circuit at high speed. Thus, data is stored in a primary storage device provided in the arithmetic circuit. Accordingly, the time to take images is limited by the capacity of the primary storage device.

In the imaging device according to one embodiment of the present invention, a high-capacity memory circuit is provided in a position that allows high-speed access to the arithmetic circuit and the like, and the memory circuit can function in a manner similar to the primary storage device provided in the arithmetic circuit. When the primary storage device has high capacity, the amount of data that can be stored can be increased; thus, higher-resolution images of operations with a higher frame rate can be taken for a longer time.

In addition, in the case where imaging data is processed by artificial intelligence so that a person or an object is recognized, an enormous amount of data needs to be subjected to arithmetic processing. The use of the high-capacity memory circuit as the primary storage device enables an enormous amount of arithmetic processing in the imaging device. The imaging device outputs only arithmetic results to the outside; thus, power consumption can be reduced as compared to the case where all imaging data are output to the outside.

Note that the application of the memory circuit included in the imaging device according to one embodiment of the present invention is not limited to the above, and can be also used as a primary storage device placed outside the arithmetic circuit or a secondary storage device.

In the case where a plurality of semiconductor devices are stacked, a polishing step and a bonding step are required to be performed a plurality of times. Consequently, there are issues such as a large number of manufacturing steps, the need for a dedicated apparatus, and a low yield, and manufacturing cost is high. In one embodiment of the present invention, a circuit using an OS transistor is formed over a Si device, so that the number of polishing steps and bonding steps can be reduced.

An OS transistor can be formed over a Si device (a Si transistor or a Si photodiode) with an insulating layer therebetween, without a complicated step such as bonding and bump bonding.

Figure 2A:
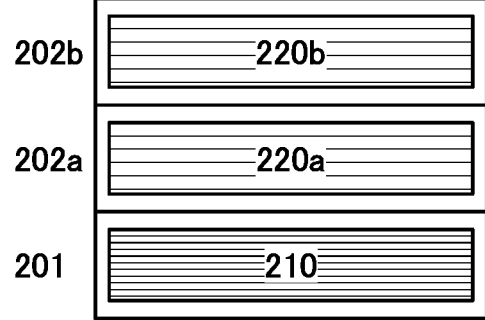
FIG. 2A to FIG. 2C are diagrams illustrating a method for manufacturing a stack.

For example, as illustrated in FIG. 2A, the layer 202a is formed over the layer 201, and the layer 202b is formed over the layer 202a. Here, the layer 201 is a layer including a silicon substrate, and a circuit including a Si transistor is formed in the region 210. In addition, memory circuits each including an OS transistor are formed in the region 220a of the layer 202a and the region 220b of the layer 202b.

Figure 2B:
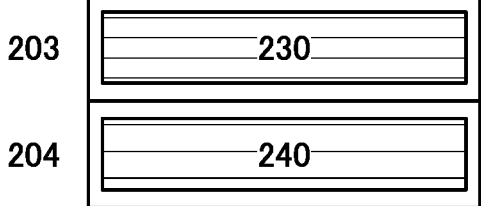

In addition, as illustrated in FIG. 2B, the layer 203 is formed over the layer 204. The layer 204 is a layer including a silicon substrate, and a Si photodiode is formed as the photoelectric conversion device 240 in the layer 204. A pixel circuit including an OS transistor is formed in the region 230 of the layer 203.

Figure 2C:
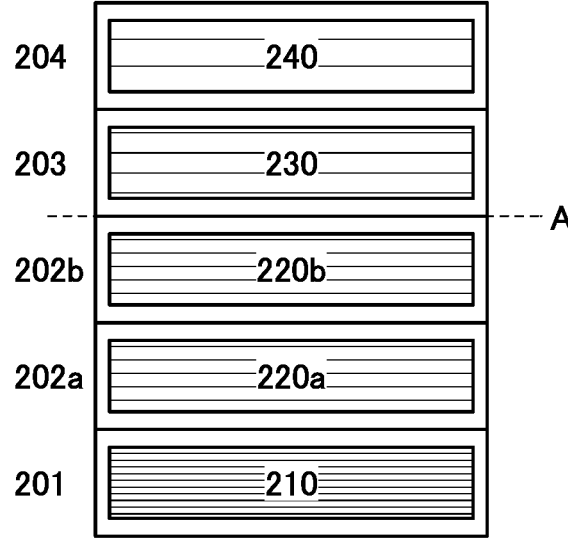

Then, as illustrated in FIG. 2C, when the layer 202b and the layer 203 are bonded to each other in the position A, the layer 201, the layer 202a, the layer 202b, the layer 203, and the layer 204 are stacked in this order, so that a stacked structure having a region where these layers overlap one another can be manufactured. Note that FIG. 1 is a structure in which the layer 205 is further provided over the layer 204 of the stack illustrated in FIG. 2C.

In the case where Si devices are stacked, a polishing step and a bonding step are each required to be performed at least multiple times in stacking six layers. However, in one embodiment of the present invention, a polishing step can be performed once or twice, and a bonding step can be performed once.

Figure 3A:
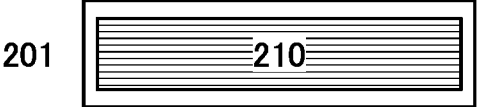
FIG. 3A to FIG. 3D are diagrams illustrating a method for manufacturing a stack.
Figure 3B:
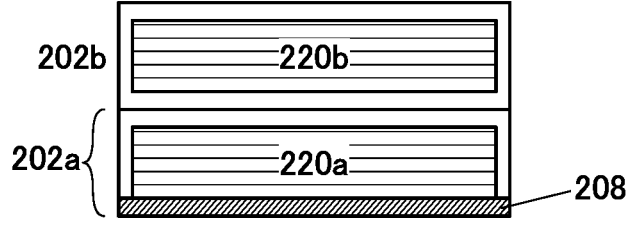
Figure 3C:
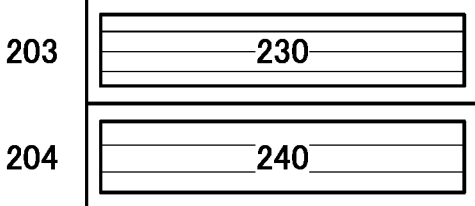
Figure 3D:
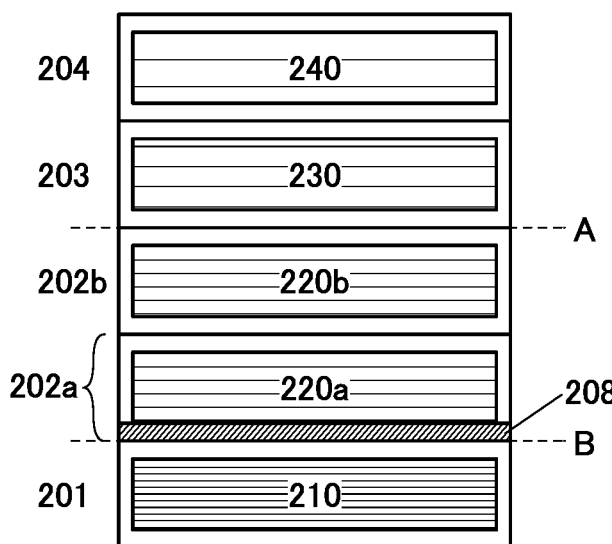

Alternatively, a stacked structure illustrated in FIG. 3D may be manufactured using the layer 201 illustrated in FIG. 3A, a stack of the layer 202a and the layer 202b illustrated in FIG. 3B, and a stack of the layer 204 and the layer 203 illustrated in FIG. 3C.

The stacked structure illustrated in FIG. 3D differs from the structure illustrated in FIG. 2C in that there is a position B between the layer 201 and the layer 202a. It is difficult to handle a thin film device alone that is provided in the region 220a of the layer 202a and the region 220b of the layer 202b illustrated in FIG. 3B; thus, the thin film device is provided over a support region 208 included in the layer 202a. The support region 208 can include a single crystal silicon substrate and an insulating layer or the like provided over the single crystal silicon substrate, for example. Note that instead of the single crystal silicon substrate, another semiconductor single crystal substrate, a quartz substrate, a glass substrate, a ceramic substrate, or the like can be used for the support region 208.

In the structure illustrated in FIG. 3D, a bonding step is performed twice. However, manufacturing cost can be reduced because a good item can be selected in each of the structures illustrated in FIG. 3A to FIG. 3C. For example, in the case where a device provided in the layer 202a or the layer 202b is defective in the structure illustrated in FIG. 2A, the entire device becomes defective even when the layer 201 is a good item. The structure illustrated in FIG. 3D can prevent the loss of the layer 201 even in the case where a similar defect occurs.

Structure Example 1

Figure 4A:
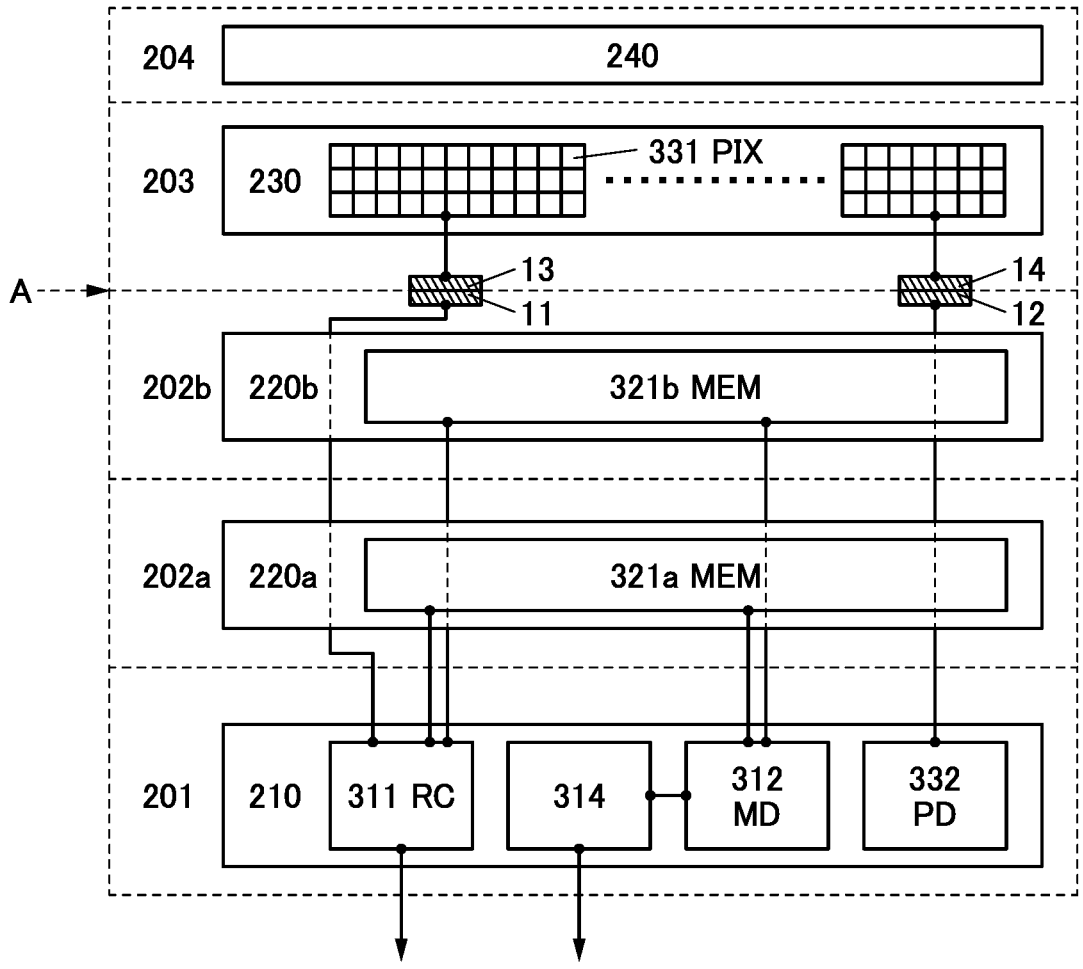
FIG. 4A to FIG. 4C are block diagrams illustrating an imaging device.

FIG. 4A is a simple block diagram of the structure illustrated in FIG. 2C that illustrates a circuit and the like formed in each layer and their electrical connection. Note that in the circuit, the photoelectric conversion device 240 included in the layer 204 is included in a pixel circuit 331 (PIX) and thus the electrical connection is not illustrated here.

In the layer 203, a plurality of pixel circuits 331 are arranged in a matrix. The pixel circuits 331 are electrically connected to a read circuit 311 (RC) included in the layer 201 through a conductive layer 11 and a conductive layer 13. In addition, the pixel circuits 331 are electrically connected to a driver circuit 332 (PD) included in the layer 201 through a conductive layer 12 and a conductive layer 14.

Here, the conductive layer 11 and the conductive layer 12 are provided in the layer 202b. The conductive layer 13 and the conductive layer 14 are provided in the layer 203. Through a bonding step, the conductive layer 11 and the conductive layer 13, and the conductive layer 12 and the conductive layer 14 are each directly joined to each other. Thus, the conductive layer 11 to the conductive layer 14 are preferably formed of the same metal material.

The read circuit 311 can include a correlated double sampling circuit (CDS circuit) for reducing noise and an A/D converter for converting analog data into digital data.

Figure 4B:

The driver circuit 332 can control a data acquisition operation, a selection operation, and the like of the pixel circuit 331. For example, as illustrated in FIG. 4B, the driver circuit 332 can include a gate driver 343 (GD) and a source driver 344 (SD). For each of the gate driver 343 and the source driver 344, a shift register or the like can be used, for example. Note that the gate driver and the source driver can be also referred to as a row driver and a column driver, respectively.

The read circuit 311 is electrically connected to a memory circuit 321a (MEM) included in the layer 202a and a memory circuit 321b (MEM) included in the layer 202b. The memory circuit 321a and the memory circuit 321b can retain digital data output from the read circuit 311. Alternatively, digital data can be output to the outside from the read circuit 311.

Here, each of the memory circuit 321a and the memory circuit 321b is a high-capacity memory including a memory cell array.

Figure 4C:
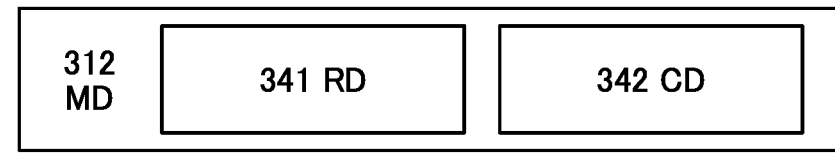

The memory circuit 321a and the memory circuit 321b are electrically connected to a driver circuit 312 (MD). For example, as illustrated in FIG. 4C, the driver circuit 312 can include a row driver 341 (RD) and a column driver 342 (CD). For each of the row driver 341 and the column driver 342, a decoder or the like can be used, for example.

Through the driver circuit 312, data read from the memory circuit 321a or the memory circuit 321b can be input to an arithmetic circuit 314 electrically connected to the driver circuit 312. For example, in the arithmetic circuit 314, pixel processing or the like can be performed, and processed data can be output to the outside.

Figures 5A, 5B:
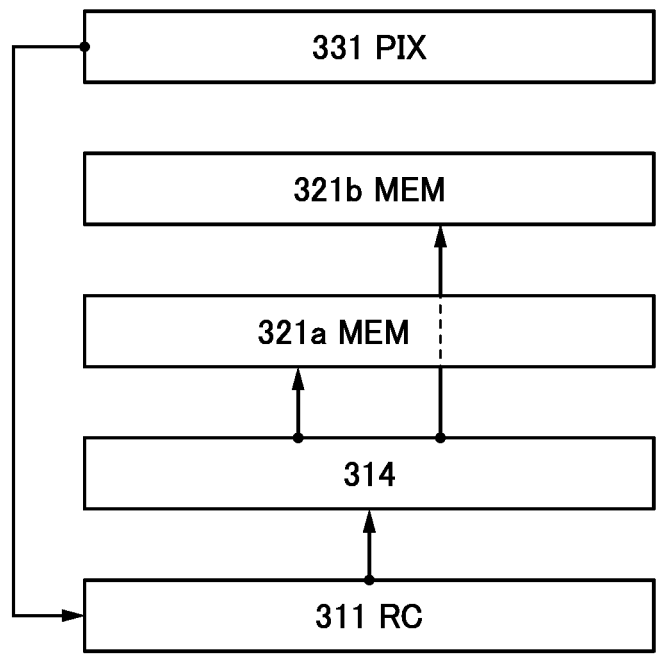
FIG. 5A and FIG. 5B are block diagrams illustrating an imaging device.

The details of the connection relation between the pixel circuit 331, the read circuit 311, the memory circuit 321a, and the memory circuit 321b are described using a block diagram in FIG. 5A. The number of read circuits 311 can be equal to the number of pixel circuits 331, and one read circuit 311 is electrically connected to one pixel circuit 331.

In addition, the read circuit 311 is connected to a plurality of wirings 353, and each of the wirings 353 is electrically connected to one memory cell 322 included in the memory circuit 321a or one memory cell 323 included in the memory circuit 321b. Note that data retention circuits may be provided between the read circuit 311 and the memory cell 322, and between the read circuit 311 and the memory cell 323.

The A/D converter included in the read circuit 311 outputs binary data for a predetermined number of bits in parallel. Accordingly, the A/D converter is connected to the memory cells 322 or the memory cells 323 for the number of bits. For example, in the case where the A/D converter has an 8-bit output, the A/D converter is electrically connected to eight memory cells 322 or eight memory cells 323.

Note that although FIG. 4 and FIG. 5A each illustrate the structure where the read circuit 311 is connected to the memory circuit 321a and the memory circuit 321b, the connection structure of these circuits is not limited thereto. For example, as illustrated in FIG. 5B, the read circuit 311 may be connected to the memory circuit 321a and the memory circuit 321b through the arithmetic circuit 314. Alternatively, the read circuit 311 may be connected to the memory circuit 321a and the memory circuit 321b through an arithmetic circuit that is different from the arithmetic circuit 314. In addition, the arithmetic circuit can also use parts of the memory circuit 321a and the memory circuit 321b as a cache memory. Note that this structure can be also employed in the other structure examples described in this embodiment.

In the imaging device according to one embodiment of the present invention with the above structure, A/D conversion of analog data acquired in all the pixel circuits 331 can be performed in parallel, and converted digital data can be directly written to the memory circuit 321a or the memory circuit 321*b*. In other words, operations from imaging to storage in the memory circuit can be performed at high speed. Alternatively, the imaging operation, an A/D conversion operation, and a read operation can be performed in parallel.

Structure Example 2

Figure 6:
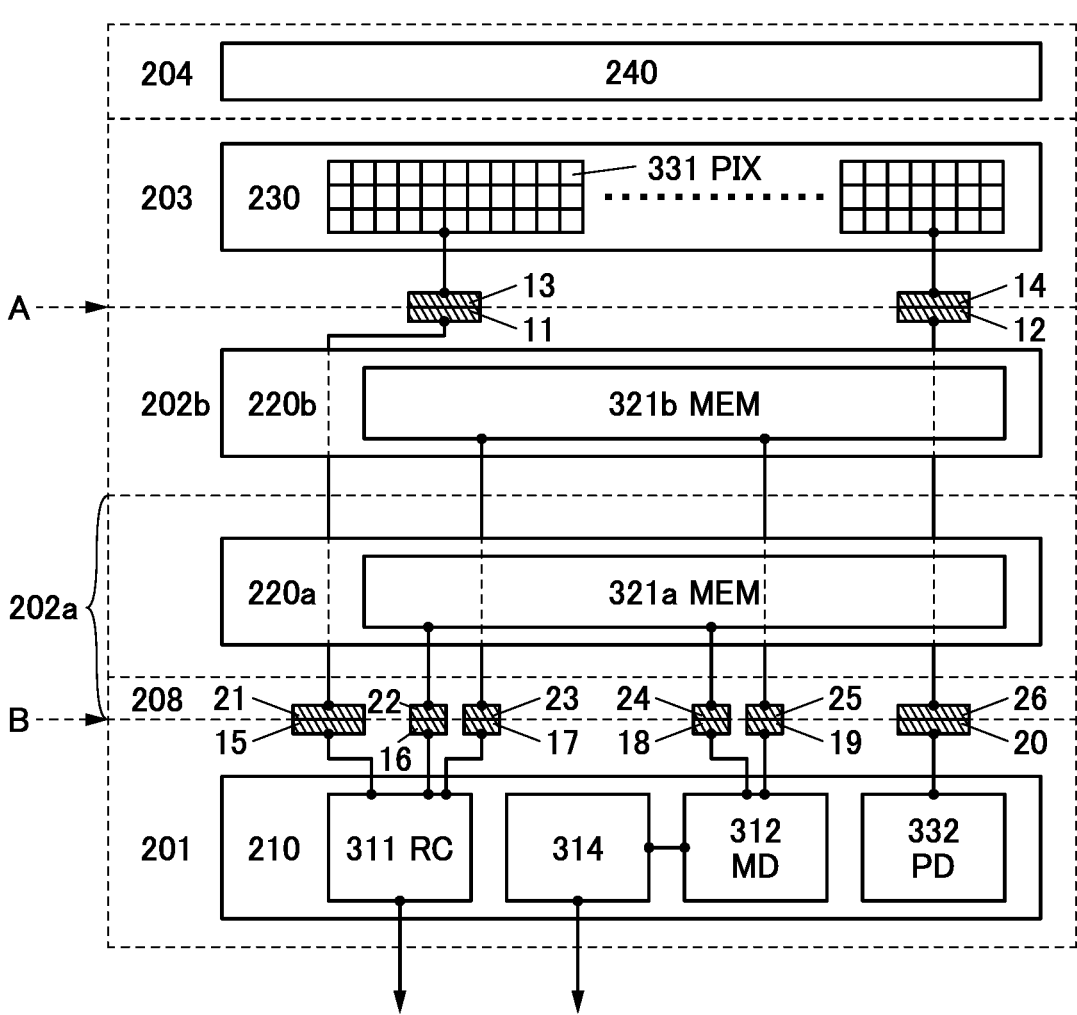
FIG. 6 is a block diagram illustrating an imaging device.

FIG. 6 is a simple block diagram of the structure illustrated in FIG. 3D that illustrates a circuit and the like formed in each layer and their electrical connection. Note that in the circuit, the photoelectric conversion device 240 included in the layer 204 is included in the pixel circuit 331 (PIX) and thus the electrical connection is not illustrated here. In addition, the description of components common to those in Structure Example 1 and the illustration of the support region 208 are omitted.

In the layer 203, a plurality of pixel circuits 331 are arranged in a matrix. The pixel circuits 331 are electrically connected to the read circuit 311 (RC) included in the layer 201 through the conductive layer 13, the conductive layer 11, a conductive layer 21, and a conductive layer 15. In addition, the pixel circuits 331 are electrically connected to the driver circuit 332 (PD) included in the layer 201 through the conductive layer 14, the conductive layer 12, a conductive layer 26, and a conductive layer 20.

The read circuit 311 is electrically connected to the memory circuit 321*a* (MEM) included in the layer 202*a* through a conductive layer 16 and a conductive layer 22. In addition, the read circuit 311 is electrically connected to the memory circuit 321*b* (MEM) included in the layer 202*b* through a conductive layer 17 and a conductive layer 23.

The memory circuit 321*a* is electrically connected to the driver circuit 312 (MD) through a conductive layer 18 and a conductive layer 24. In addition, the memory circuit 321*b* is electrically connected to the driver circuit 312 (MD) through a conductive layer 19 and a conductive layer 25.

Here, the conductive layer 11 and the conductive layer 12 are provided in the layer 202*b*. The conductive layer 13 and the conductive layer 14 are provided in the layer 203. Through a bonding step, the conductive layer 11 and the conductive layer 13, and the conductive layer 12 and the conductive layer 14 are each directly joined to each other. Thus, the conductive layer 11 to the conductive layer 14 are preferably formed of the same metal material.

In addition, the conductive layer 15 to the conductive layer 20 are provided in the layer 201. The conductive layer 21 to the conductive layer 26 are provided in the support region 208 of the layer 202*a*. Through a bonding step, the conductive layer 15 and the conductive layer 21, the conductive layer 16 and the conductive layer 22, the conductive layer 17 and the conductive layer 23, the conductive layer 18 and the conductive layer 24, the conductive layer 19 and the conductive layer 25, and the conductive layer 20 and the conductive layer 26 are each directly joined to each other. Thus, the conductive layer 15 to the conductive layer 26 are preferably formed of the same metal material.

Figure 7A:
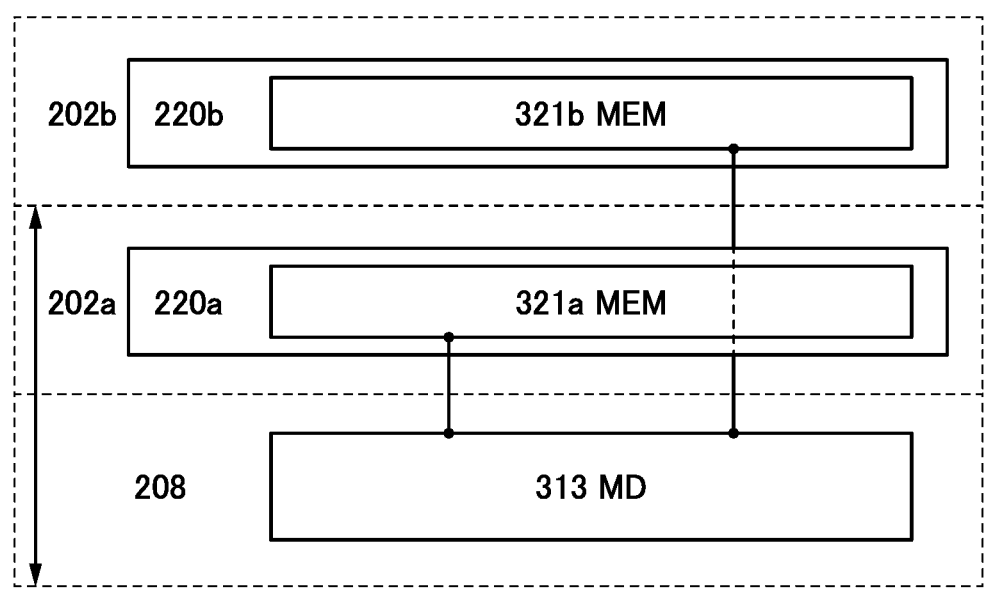
FIG. 7A and FIG. 7B are block diagrams illustrating an imaging device.

Note that in the structure illustrated in FIG. 6, the support region 208 can include a single crystal silicon substrate; thus, a circuit can be also provided in the support region 208. For example, as illustrated in FIG. 7A, a driver circuit 313 of the memory circuit may be provided in the support region 208, and the memory circuit 321*a* and the memory circuit 321*b* may be electrically connected to the driver circuit 313 included in the support region 208.

In that case, the driver circuit 312 is not necessarily provided in the layer 201. Alternatively, one of the memory circuit 321*a* and the memory circuit 321*b* may be electrically connected to the driver circuit 313 included in the support region 208, and the other of the memory circuit 321*a* and the memory circuit 321*b* may be electrically connected to the driver circuit 312 included in the layer 201.

Structure Example 3

Figures 8A, 8B:
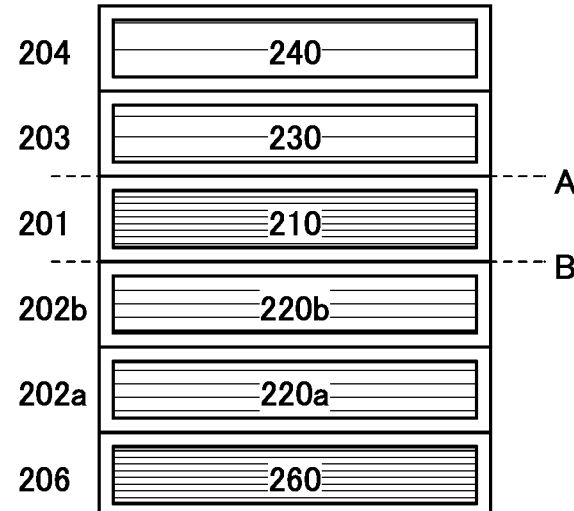
FIG. 8A and FIG. 8B are block diagrams illustrating an imaging device.

FIG. 8A is a structure where the layer 201 is bonded to the layer 203 in the stack of the layer 204 and the layer 203 in the position A and the layer 201 is bonded to the layer 202*b* in a stack where the layer 202*a* and the layer 202*b* are stacked over a layer 206 in the position B.

Here, the layer 206 includes a single crystal silicon substrate, and a memory circuit including a Si transistor can be provided in a region 260. With this structure, memory capacity can be further increased.

FIG. 8B is a simple block diagram of the structure illustrated in FIG. 8A that illustrates a circuit and the like formed in each layer and their electrical connection. Note that in the circuit, the photoelectric conversion device 240 included in the layer 204 is included in the pixel circuit 331 (PIX) and thus the electrical connection is not illustrated here. In addition, the description of components common to those in Structure Example 1 and the like is omitted.

In the layer 203, a plurality of pixel circuits 331 are arranged in a matrix. The pixel circuits 331 are electrically connected to the read circuit 311 (RC) included in the layer 201 through a conductive layer 33 and a conductive layer 31. In addition, the pixel circuits 331 are electrically connected to the driver circuit 332 (PD) included in the layer 201 through a conductive layer 34 and a conductive layer 32.

The read circuit 311 is electrically connected to the memory circuit 321*b* (MEM) included in the layer 202*b* through a conductive layer 35 and a conductive layer 39. In addition, the read circuit 311 is electrically connected to the memory circuit 321*a* (MEM) included in the layer 202*a* through a conductive layer 36 and a conductive layer 40. Furthermore, the read circuit 311 is electrically connected to a memory circuit 325 (MEM) included in the layer 206 through a conductive layer 37 and a conductive layer 41.

The memory circuit 321*a*, the memory circuit 321*b*, and the memory circuit 325 are electrically connected to the driver circuit 312 (MD). In addition, the driver circuit 312 is electrically connected to the arithmetic circuit 314 through a conductive layer 42 and a conductive layer 38.

Here, the conductive layer 31 and the conductive layer 32 are provided in the layer 202*b*. The conductive layer 33 and the conductive layer 34 are provided in the layer 203. Through a bonding step, the conductive layer 31 and the conductive layer 33, and the conductive layer 32 and the conductive layer 34 are each directly joined to each other. Thus, the conductive layer 31 to the conductive layer 34 are preferably formed of the same metal material.

In addition, the conductive layer 35 to the conductive layer 38 are provided in the layer 201. The conductive layer 39 to the conductive layer 42 are provided in the layer 202*b*. Through a bonding step, the conductive layer 35 and the conductive layer 39, the conductive layer 36 and the conductive layer 40, the conductive layer 37 and the conductive layer 41, and the conductive layer 38 and the conductive layer 42 are each directly joined to each other. Thus, the conductive layer 35 to the conductive layer 42 are preferably formed of the same metal material.

Structure Example 4

Figure 9A:
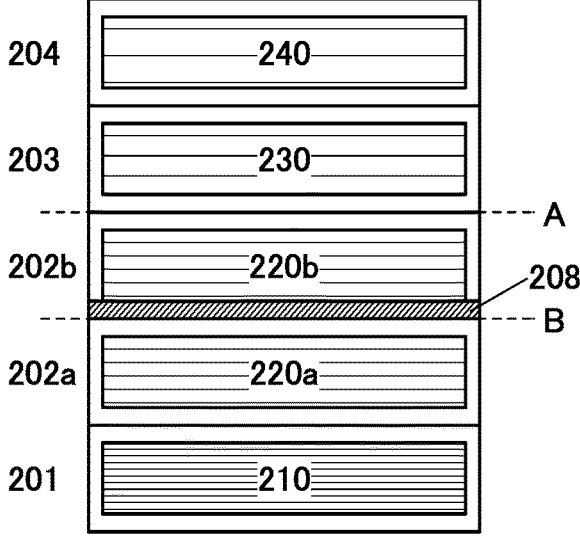
FIG. 9A and FIG. 9B are block diagrams illustrating an imaging device.

FIG. 9A is a structure where the layer 202*b* is bonded to the layer 203 in the stack of the layer 204 and the layer 203 in the position A and the layer 202*a* in the structure where the layer 202*a* is provided over the layer 201 is bonded to the layer 202*b* in the position B. Here, the layer 202*b* includes the support region 208.

The structure is an example where a memory circuit 324 included in the layer 202*a* is used as a primary storage device of the arithmetic circuit 314. In the case where the memory circuit is used as the primary storage device of the arithmetic circuit 314, the length of a wiring between the memory circuit and the arithmetic circuit 314 is preferably made as short as possible. Therefore, the electrical connection between the memory circuit 324 and the arithmetic circuit is preferably made without using the bonding structure.

Figure 9B:
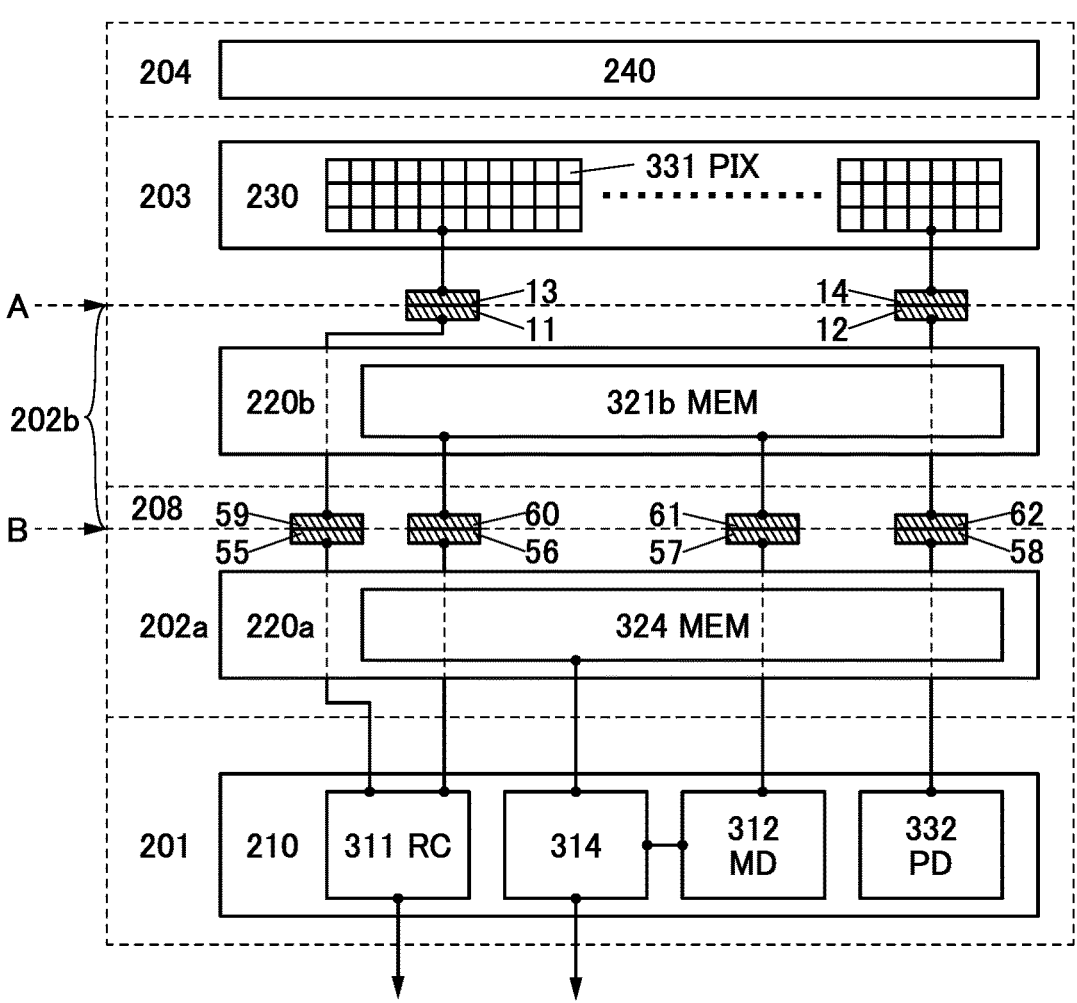

FIG. 9B is a simple block diagram of the structure illustrated in FIG. 9A that illustrates a circuit and the like formed in each layer and their electrical connection. Note that in the circuit, the photoelectric conversion device 240 included in the layer 204 is included in the pixel circuit 331 (PIX) and thus the electrical connection is not illustrated here. In addition, the description of components common to those in Structure Example 1 and the like is omitted.

In the layer 203, a plurality of pixel circuits 331 are arranged in a matrix. The pixel circuits 331 are electrically connected to the read circuit 311 (RC) included in the layer 201 through the conductive layer 13, the conductive layer 11, a conductive layer 59, and a conductive layer 55. In addition, the pixel circuits 331 are electrically connected to the driver circuit 332 (PD) included in the layer 201 through the conductive layer 14, the conductive layer 12, a conductive layer 62, and a conductive layer 58.

The read circuit 311 is electrically connected to the memory circuit 321*b* (MEM) included in the layer 202*b* through a conductive layer 56 and a conductive layer 60.

The memory circuit 321*b* is electrically connected to the driver circuit 312 (MD) through a conductive layer 61 and a conductive layer 57. In addition, the driver circuit 312 is electrically connected to the arithmetic circuit 314. The arithmetic circuit 314 is electrically connected to the memory circuit 324 included in the layer 202*a*. Note that the memory circuit 324 and the driver circuit 312 may be electrically connected to each other so that the memory circuit 324 can be driven by the driver circuit 312.

Here, the conductive layer 11 and the conductive layer 12 are provided in the layer 202*b*. The conductive layer 13 and the conductive layer 14 are provided in the layer 203. Through a bonding step, the conductive layer 11 and the conductive layer 13, and the conductive layer 12 and the conductive layer 14 are each directly joined to each other. Thus, the conductive layer 11 to the conductive layer 14 are preferably formed of the same metal material.

In addition, the conductive layer 55 to the conductive layer 58 are provided in the layer 202*a*. The conductive layer 59 to the conductive layer 62 are provided in the support region 208 included in the layer 202*b*. Through a bonding step, the conductive layer 55 and the conductive layer 59, the conductive layer 56 and the conductive layer 60, the conductive layer 57 and the conductive layer 61, and the conductive layer 58 and the conductive layer 62 are each directly joined to each other. Thus, the conductive layer 55 to the conductive layer 62 are preferably formed of the same metal material.

Figure 7B:
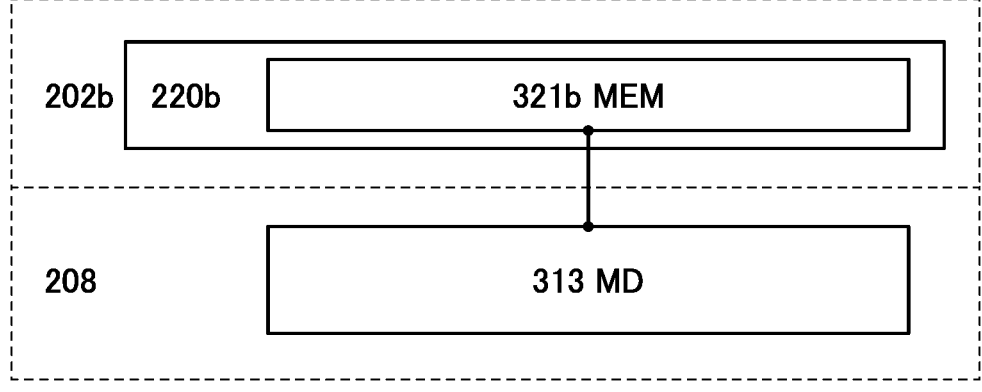

Note that in the structures illustrated in FIG. 9A and FIG. 9B, the support region 208 can include a single crystal silicon substrate; thus, a circuit can be also provided in the support region 208. For example, as illustrated in FIG. 7B, the driver circuit 313 of the memory circuit may be provided in the support region 208, and the memory circuit 321*b* may be electrically connected to the driver circuit 313 included in the support region 208. In that case, the driver circuit 312 is not necessarily provided in the layer 201.

Structure Example 5

Figure 10A:
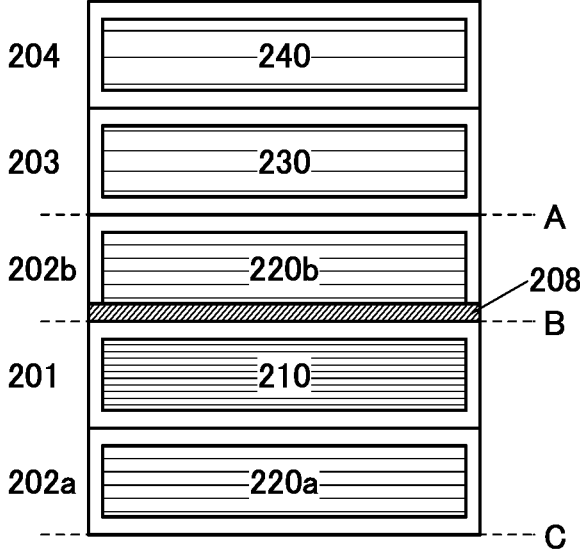
FIG. 10A and FIG. 10B are block diagrams illustrating an imaging device.

FIG. 10A is a structure where the layer 202*b* is bonded to the layer 203 in the stack of the layer 204 and the layer 203 in the position A and the layer 201 in the structure where the layer 202*a* is provided over the layer 201 is bonded to the layer 202*b* in the position B. Here, the layer 202*b* includes the support region 208.

The structure is an example where the memory circuit 324 included in the layer 202*a* is used exclusively as the primary storage device of the arithmetic circuit 314. In addition, in the case where a structure is employed in which the layer 202*a* is provided on a bottom surface side and an electrode (which may be a bump) exposed to the outside is provided, mounting on a printed circuit board or the like can be facilitated. Alternatively, the memory circuit 324 included in the layer 202*a* can be bonded to a stack including another circuit or the like.

Figure 10B:
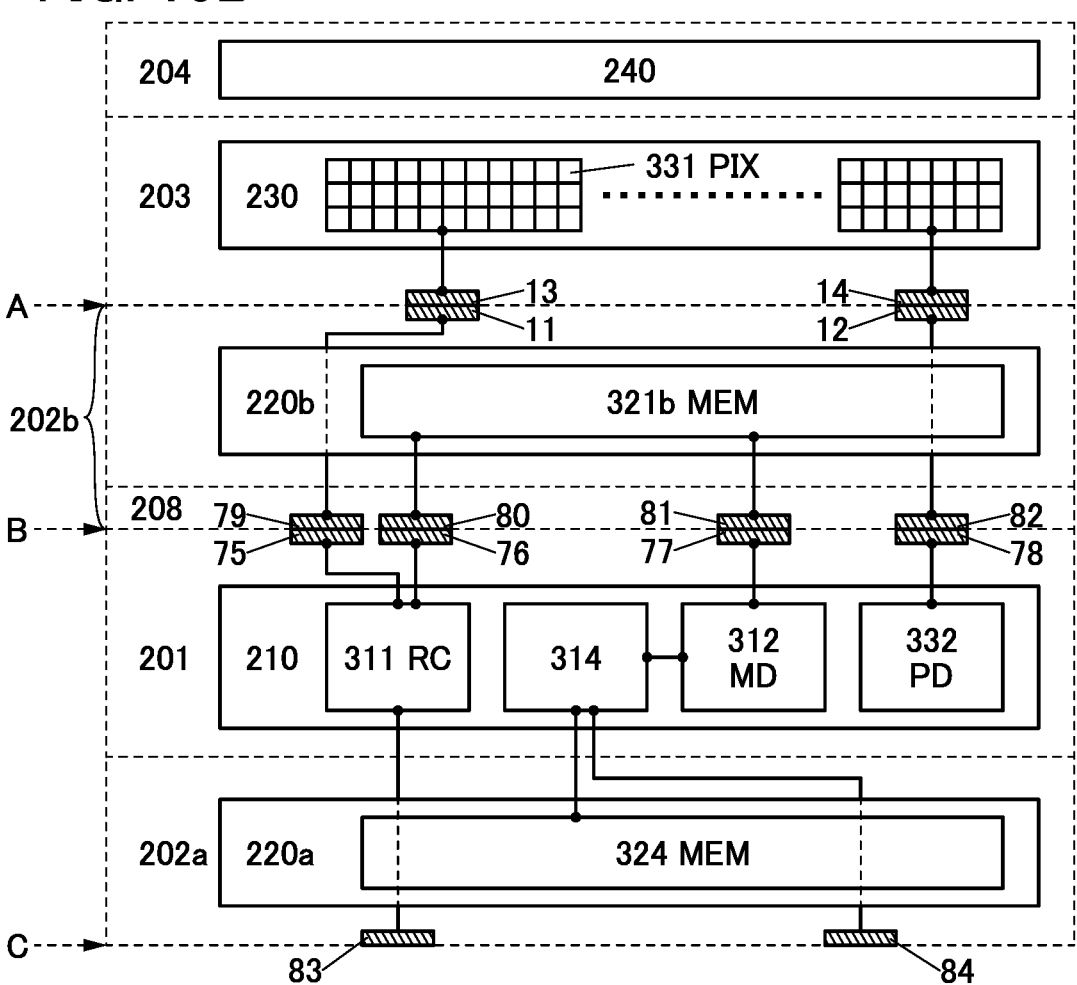

FIG. 10B is a simple block diagram of the structure illustrated in FIG. 10A that illustrates a circuit and the like formed in each layer and their electrical connection. Note that in the circuit, the photoelectric conversion device 240 included in the layer 204 is included in the pixel circuit 331 (PIX) and thus the electrical connection is not illustrated here. In addition, the description of components common to those in Structure Example 1 and the like is omitted. In the layer 203, a plurality of pixel circuits 331 are arranged in a matrix. The pixel circuits 331 are electrically connected to the read circuit 311 (RC) included in the layer 201 through the conductive layer 13, the conductive layer 11, a conductive layer 79, and a conductive layer 75. In addition, the pixel circuits 331 are electrically connected to the driver circuit 332 (PD) included in the layer 201 through the conductive layer 14, the conductive layer 12, a conductive layer 82, and a conductive layer 78.

The read circuit 311 is electrically connected to the memory circuit 321*b* (MEM) included in the layer 202*b* through a conductive layer 76 and a conductive layer 80.

The memory circuit 321*b* is electrically connected to the driver circuit 312 (MD) through a conductive layer 81 and a conductive layer 77. In addition, the driver circuit 312 is electrically connected to the arithmetic circuit 314. The arithmetic circuit 314 is electrically connected to the memory circuit 324 included in the layer 202*a*. Note that the memory circuit 324 and the driver circuit 312 may be electrically connected to each other so that the memory circuit 324 can be driven by the driver circuit 312.

In addition, the read circuit 311 is electrically connected to a conductive layer 83 provided in the layer 202*a*. The arithmetic circuit is electrically connected to a conductive layer 84 provided in the layer 202*a*. The conductive layer 83 and the conductive layer 84 function as terminals for outputting data to the outside. In addition, the conductive layer 83 and the conductive layer 84 can be also used as terminals for mounting on a printed circuit board or the like, or conductive layers for bonding to a layer or a stack including another circuit.

Here, the conductive layer 11 and the conductive layer 12 are provided in the layer 202*b*. The conductive layer 13 and the conductive layer 14 are provided in the layer 203. Through a bonding step, the conductive layer 11 and the conductive layer 13, and the conductive layer 12 and the conductive layer 14 are each directly joined to each other. Thus, the conductive layer 11 to the conductive layer 14 are preferably formed of the same metal material.

In addition, the conductive layer 75 to the conductive layer 78 are provided in the layer 201. The conductive layer 79 to the conductive layer 82 are provided in the support region 208 included in the layer 202b. Through a bonding step, the conductive layer 75 and the conductive layer 79, the conductive layer 76 and the conductive layer 80, the conductive layer 77 and the conductive layer 81, and the conductive layer 78 and the conductive layer 82 are each directly joined to each other. Thus, the conductive layer 75 to the conductive layer 82 are preferably formed of the same metal material.

Note that in the structures illustrated in FIG. 10A and FIG. 10B, the support region 208 can include a single crystal silicon substrate; thus, a circuit can be also provided in the support region 208. For example, as illustrated in FIG. 7B, the driver circuit 313 of the memory circuit may be provided in the support region 208, and the memory circuit 321b may be electrically connected to the driver circuit 313 included in the support region 208. In that case, the driver circuit 312 is not necessarily provided in the layer 201.

<Pixel Circuit>

Figure 11A:
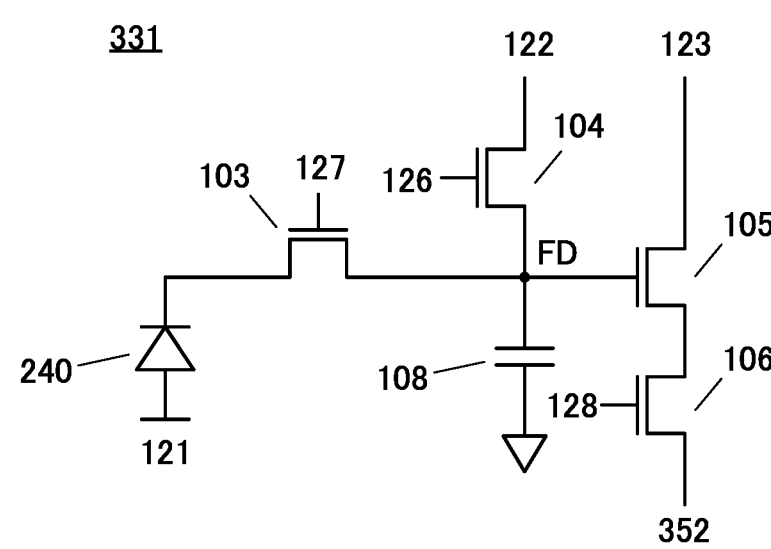
FIG. 11A and FIG. 11B are circuit diagrams each illustrating a pixel circuit.

FIG. 11A is a circuit diagram illustrating an example of the pixel circuit 331. The pixel circuit 331 can include the photoelectric conversion device 240, a transistor 103, a transistor 104, a transistor 105, a transistor 106, and a capacitor 108. Note that a structure in which the capacitor 108 is not provided may be employed. Note that in this specification, a structure in which the photoelectric conversion device 240 is removed from the above components is referred to as a "pixel circuit" in some cases.

One electrode (cathode) of the photoelectric conversion device 240 is electrically connected to one of a source and a drain of the transistor 103. The other of the source and the drain of the transistor 103 is electrically connected to one of a source and a drain of the transistor 104. The one of the source and the drain of the transistor 104 is electrically connected to one electrode of the capacitor 108. The one electrode of the capacitor 108 is electrically connected to a gate of the transistor 105. One of a source and a drain of the transistor 105 is electrically connected to one of a source and a drain of the transistor 106.

Here, a wiring that connects the other of the source and the drain of the transistor 103, the one electrode of the capacitor 108, and the gate of the transistor 105 is a node FD. The node FD can function as a charge detection unit.

The other electrode (anode) of the photoelectric conversion device 240 is electrically connected to a wiring 121. A gate of the transistor 103 is electrically connected to a wiring 127. The other of the source and the drain of the transistor 104 is electrically connected to a wiring 122. The other of the source and the drain of the transistor 105 is electrically connected to a wiring 123. A gate of the transistor 104 is electrically connected to a wiring 126. A gate of the transistor 106 is electrically connected to a wiring 128. The other electrode of the capacitor 108 is electrically connected to a reference potential line such as a GND wiring, for example. The other of the source and the drain of the transistor 106 is electrically connected to a wiring 352.

The wirings 127, 126, and 128 can each have a function of a signal line that controls the conduction of each transistor. The wiring 352 can have a function of an output line.

The wirings 121, 122, and 123 can each have a function of a power supply line. The structure illustrated in FIG. 11A is a structure in which the cathode side of the photoelectric conversion device 240 is electrically connected to the transistor 103 and the node FD is reset to a high potential in the operation; accordingly, the wiring 122 is set to a high potential (a potential higher than that of the wiring 121).

Figure 11B:
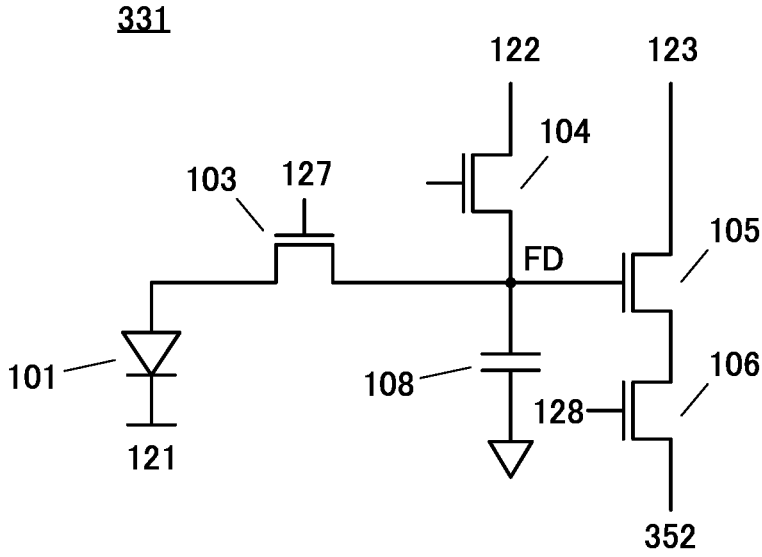

Although FIG. 11A illustrates the structure where the cathode of the photoelectric conversion device 240 is electrically connected to the node FD, a structure may be employed in which the anode side of the photoelectric conversion device 240 is electrically connected to the one of the source and the drain of the transistor 103 as illustrated in FIG. 11B.

Since the node FD is reset to a low potential in the operation in the structure, the wiring 122 is set to a low potential (a potential lower than that of the wiring 121).

The transistor 103 has a function of controlling the potential of the node FD. The transistor 104 has a function of resetting the potential of the node FD. The transistor 105 functions as a component of a source follower circuit and can output the potential of the node FD as image data to the wiring 352. The transistor 106 has a function of selecting a pixel to which the image data is output.

OS transistors are preferably used as the transistor 103 to the transistor 106 included in the pixel circuit 331. The OS transistor has a feature of extremely low off-state current. In particular, when transistors with low off-state current are used as the transistors 103 and 104, a charge retention period at the node FD can be extremely long. Therefore, a global shutter mode in which a charge accumulation operation is performed in all the pixels at the same time can be employed without complicating a circuit structure and an operation method.

<Method for Operating Imaging Device>

Figure 12A:
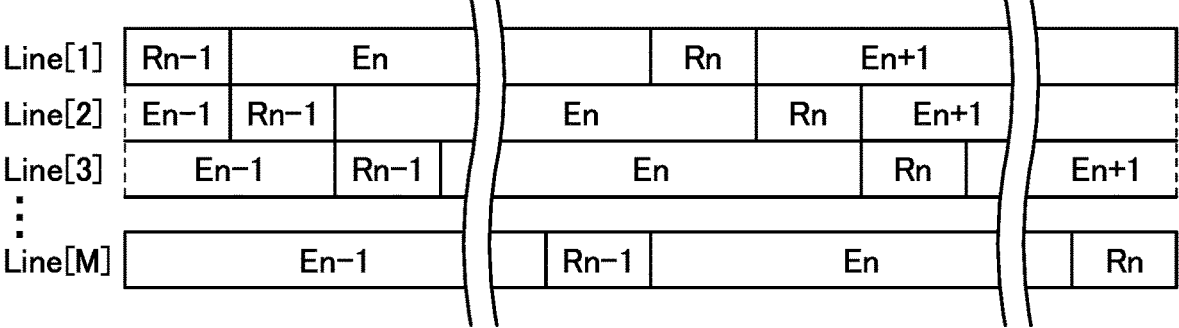
FIG. 12A is a diagram illustrating a rolling shutter operation.
Figure 12B:
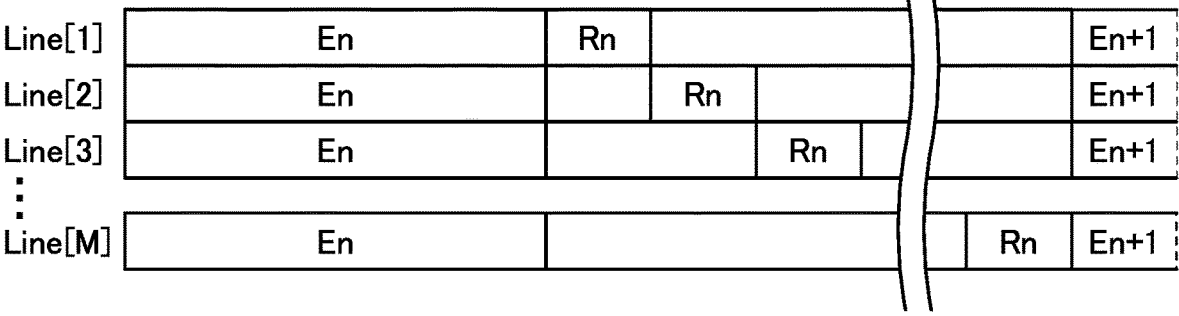
FIG. 12B is a diagram illustrating a global shutter operation.

FIG. 12A is a schematic view of an operation method with a rolling shutter mode, and FIG. 12B is a schematic view of an operation method with a global shutter mode. En denotes exposure (an accumulation operation) in an n-th column (n is a natural number), and Rn denotes a read operation in the n-th column. In FIG. 12A and FIG. 12B, operations from a first row to an M-th row (M is a natural number) are shown.

The rolling shutter mode is an operation method in which exposure and data reading are performed sequentially and a read period of a row overlaps with an exposure period of another row. The read operation is performed immediately after the exposure, so that images can be taken even with a circuit structure having a comparatively short data retention period. However, an image of one frame is composed of data that does not have simultaneity of imaging; therefore, distortion is caused in an image when imaging of a moving object is performed.

On the other hand, the global shutter mode is an operation method in which exposure is performed on all the pixels at the same time, data is retained in each pixel, and data reading is performed row by row. Thus, an undistorted image can be obtained even when imaging of a moving object is performed.

In the case where a transistor with comparatively high off-state current, such as a Si transistor, is used in a pixel circuit, charge easily leaks from a charge detection portion and thus the rolling shutter mode is used in many cases. In order to achieve the global shutter mode using a Si transistor, it is necessary to perform a complicated operation at high speed, for example, to store data in a separate memory circuit. In contrast, when an OS transistor is used in a pixel circuit, charge hardly leaks from the charge detection portion; thus, the global shutter mode can be easily achieved.

Note that the imaging device according to one embodiment of the present invention can also operate in the rolling shutter mode.

Note that the pixel circuit 331 may have a structure in which an OS transistor and a Si transistor are combined freely. Alternatively, all the transistors may be Si transistors.

<Pixel Circuit Operation>

Figure 13A:
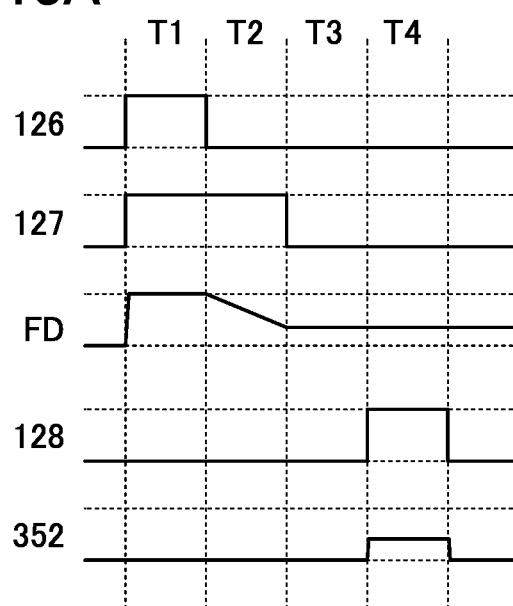
FIG. 13A and FIG. 13B are timing charts each showing the operation of the pixel circuit.

Next, an operation example of the pixel circuit 331 illustrated in FIG. 11A is described using a timing chart in FIG. 13A. Note that in the description of the timing chart in this specification, a high potential is denoted by "H" and a low potential is denoted by "L." The wiring 121 is always supplied with "L," and the wirings 122 and 123 are always supplied with "H."

In a period T1, the potential of the wiring 126 is set to "H," the potential of the wiring 127 is set to "H," and the potential of the wiring 128 is set to "L," so that the transistors 103 and 104 are brought into conduction and the potential "H" of the wiring 122 is supplied to the node FD (reset operation).

In a period T2, the potential of the wiring 126 is set to "L," the potential of the wiring 127 is set to "H," and the potential of the wiring 128 is set to "L," so that the transistor 104 is brought out of conduction and the supply of a reset potential is blocked. Furthermore, the potential of the node FD is decreased in accordance with the operation of the photo-electric conversion device 240 (accumulation operation).

In a period T3, the potential of the wiring 126 is set to "L," the potential of the wiring 127 is set to "L," and the potential of the wiring 128 is set to "L," so that the transistor 103 is brought out of conduction and the potential of the node FD is fixed and retained (retention operation). At this time, OS transistors with low off-state current are used as the transistor 103 and the transistor 104 that are connected to the node FD, so that unnecessary charge leakage from the node FD can be inhibited and data retention time can be extended.

In a period T4, the potential of the wiring 126 is set to "L," the potential of the wiring 127 is set to "L," and the potential of the wiring 128 is set to "H," so that the transistor 106 is brought into conduction and the potential of the node FD is read to the wiring 352 by the source follower operation of the transistor 105 (read operation).

The above is the operation example of the pixel circuit 331 illustrated in FIG. 11A.

Figure 13B:
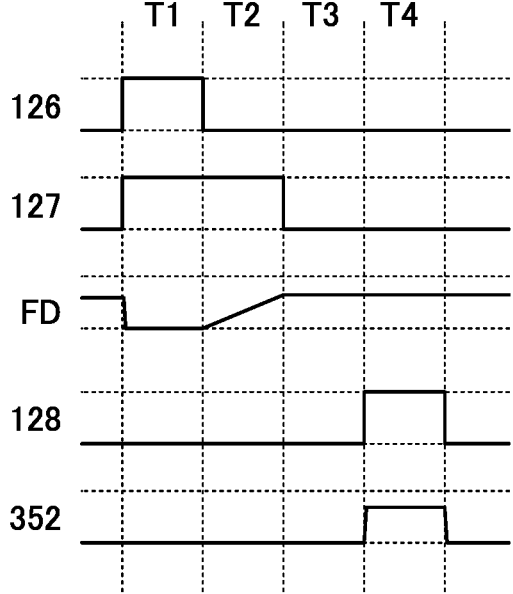

The pixel circuit 331 illustrated in FIG. 11B can operate in accordance with a timing chart in FIG. 13B. Note that the wirings 121 and 123 are always supplied with "H," and the wiring 122 is always supplied with "L." A basic operation is similar to that described above with the timing chart in FIG. 13A.

Figure 14A:
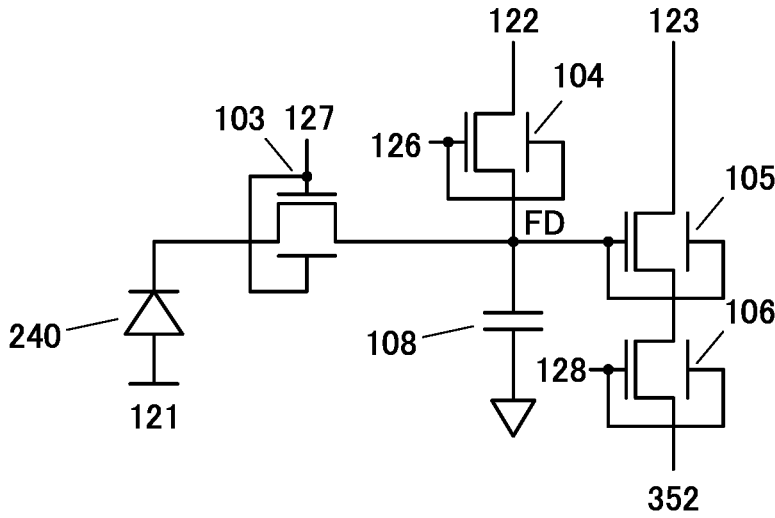
FIG. 14A and FIG. 14B are circuit diagrams each illustrating the pixel circuit.
Figure 14B:
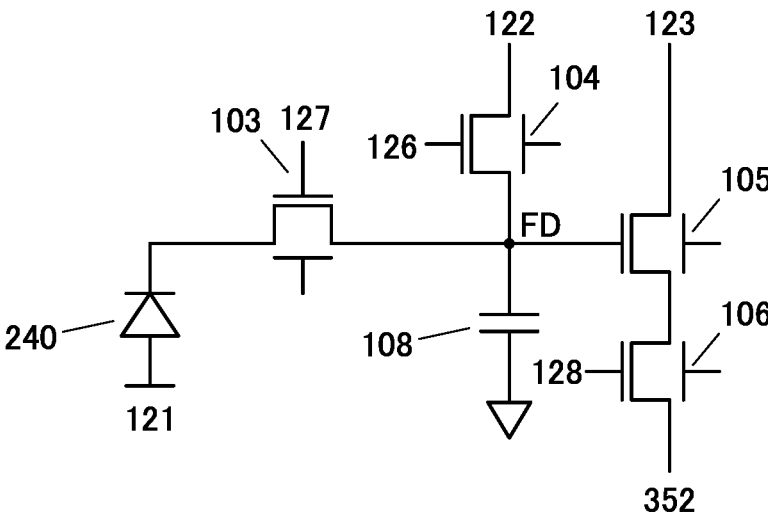

In one embodiment of the present invention, as illustrated in examples of FIG. 14A and FIG. 14B, a structure in which transistors are provided with back gates may be employed. FIG. 14A illustrates a structure in which the back gates are electrically connected to front gates, which has an effect of increasing on-state current. FIG. 14B illustrates a structure in which the back gates are electrically connected to wirings each capable of supplying a constant potential, which enables the control of the threshold voltage of the transistors by the potentials of the back gates.

In addition, a structure in which transistors can operate properly may be employed by combining FIG. 14A and FIG. 14B, for example. Furthermore, the pixel circuit 331 may include a transistor without a back gate.

<Read Circuit>

Figure 15:
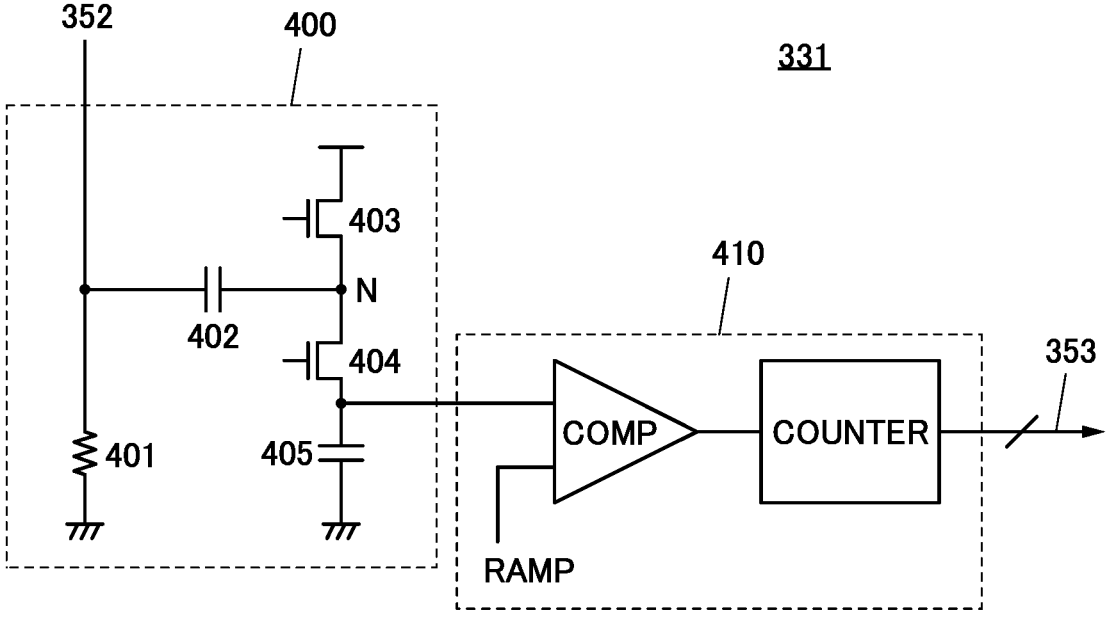
FIG. 15 illustrates a circuit diagram and a block diagram illustrating a read circuit.

FIG. 15 is a diagram illustrating an example of the read circuit 311 connected to the pixel circuit 331, and shows a circuit diagram of a CDS circuit 400 and a block diagram of an A/D converter 410 electrically connected to the CDS circuit 400. Note that the CDS circuit and the A/D converter illustrated in FIG. 15 are examples, and may each have another structure. Furthermore, another component for writing data to a memory circuit may be included as the read circuit 311.

The CDS circuit 400 can include a resistor 401 for voltage conversion, a capacitor 402 for capacitive coupling, a transistor 403 for supplying a potential $V_0$, a transistor 404 for retaining a potential supplied to the A/D converter 410, and a capacitor 405 for retaining a potential. An input of the CDS circuit 400 is electrically connected to the pixel circuit 331, and an output of the CDS circuit 400 is electrically connected to a comparator circuit (COMP) of the A/D converter 410.

When the potential of the wiring 352 is $V_{res}$ (the pixel circuit 331 is in a reset state), the potential of a node N (a connection point of the transistors 403 and 404 and the capacitor 402) is set to $V_0$. Then, the node N is brought into a floating state and the potential of the wiring 352 becomes V data (the pixel circuit 331 outputs image data); therefore, the potential of the node N becomes $V_0+V_{data}-V_{res}$. Consequently, in the CDS circuit 400, the potential in the reset state can be subtracted from the potential of imaging data output from the pixel circuit 331, so that a noise component can be reduced.

The A/D converter 410 can include the comparator circuit (COMP) and a counter circuit (COUNTER). In the A/D converter 410, a signal potential input from the CDS circuit 400 to the comparator circuit (COMP) and a swept reference potential (RAMP) are compared. Then, the counter circuit (COUNTER) operates in accordance with the output of the comparator circuit (COMP), and a digital signal is output to a plurality of wirings 353.

<Memory Circuit 1>

FIG. 16A is a diagram illustrating a memory circuit 321m that can be employed as the memory circuit 321a, the memory circuit 321b, or the memory circuit 324. In addition, FIG. 16A shows a connection relationship between memory cells 321c included in the memory circuit 321m, and the row driver 341 (RD) and the column driver 342 (CD) that are included in the driver circuit 312. The row driver 341 and the column driver 342 are driver circuits of the memory cells 321c. Note that a sense amplifier or the like may be used for data reading.

The memory circuit 321m includes m×n memory cells 321c in total; m memory cells (m is an integer greater than or equal to 1) in a column and n memory cells (n is an integer greater than or equal to 1) in a row, and the memory cells 321c are arranged in a matrix.

FIG. 16B to FIG. 16D are diagrams illustrating a memory cell 321cl to a memory cell 321c3 that can be applied to the memory cells 321c. Note that in the following description, a bit line and the like can be connected to the column driver 342. In addition, a word line and the like can be connected to the row driver 341.

For each of the row driver 341 and the column driver 342, a decoder or a shift register can be used, for example. Note that a plurality of row drivers 341 and a plurality of column drivers 342 may be provided.

FIG. 16B illustrates a circuit configuration example of the memory cell 321cl of a DRAM type. The memory cell 321cl includes a transistor 271 and a capacitor 274.

One of a source and a drain of the transistor 271 is connected to one electrode of the capacitor 274. The other of the source and the drain of the transistor 271 is connected to a wiring BIL. A gate of the transistor 271 is connected to a wiring WL. A back gate of the transistor 271 is connected to a wiring BGL. The other electrode of the capacitor 274 is connected to a wiring GNDL. The wiring GNDL is a wiring for applying a low-level potential (reference potential).

The wiring BIL functions as a bit line. The wiring WL functions as a word line. The wiring BGL functions as a wiring for applying a potential to the back gate of the transistor 271. By applying an appropriate potential to the wiring BGL, the threshold voltage of the transistor 271 can be increased or decreased. Alternatively, the wiring BGL may be electrically connected to the wiring WL. By applying the same potential to the wiring WL and the wiring BGL, the current characteristics of the transistor 271 can be improved.

Data writing and reading are performed in such a manner that a high-level potential is applied to the wiring WL to bring the transistor 271 into conduction so that the wiring BIL is electrically connected to the one electrode of the capacitor 274. For example, a sense amplifier is electrically connected to the wiring BIL, and the potential of the wiring BIL that is amplified by the sense amplifier can be read.

An OS transistor or a Si transistor can be used as the transistor 271. In this specification and the like, a DRAM using an OS transistor is referred to as a DOSRAM (Dynamic Oxide Semiconductor Random Access Memory).

An OS transistor using an oxide semiconductor including indium, gallium, and zinc has a feature of extremely low off-state current. The use of an OS transistor as the transistor 271 enables the leakage current of the transistor 271 to be extremely low. That is, written data can be retained for a long time with the transistor 271; thus, the frequency of refresh of the memory cell can be reduced. Alternatively, a refresh operation for the memory cell can be unnecessary.

FIG. 16C illustrates a circuit structure example of the memory cell 321c2 that is of a gain cell type including two transistors and one capacitor (also referred to as "2Tr1C-type"). The memory cell 321c2 includes a transistor 273, a transistor 272, and a capacitor 275.

One of a source and a drain of the transistor 273 is connected to one electrode of the capacitor 275. The other of the source and the drain of the transistor 273 is connected to a wiring WBL. A gate of the transistor 273 is connected to the wiring WL. A back gate of the transistor 273 is connected to the wiring BGL. The other electrode of the capacitor 275 is connected to a wiring RL. The one of the source and the drain of the transistor 273 is connected a wiring RBL. The other of the source and the drain of the transistor 273 is connected to a wiring SL. A gate of the transistor 272 is connected to the one electrode of the capacitor 274.

The wiring WBL functions as a write bit line. The wiring RBL functions as a read bit line. The wiring WL functions as a word line. The wiring RL functions as a wiring for applying a predetermined potential to the other electrode of the capacitor 274. A reference potential is preferably applied to the wiring RL at the time of data writing and during data retention.

The wiring BGL functions as a wiring for applying a potential to the back gate of the transistor 273. By applying an appropriate potential to the wiring BGL, the threshold voltage of the transistor 273 can be increased or decreased. Alternatively, the wiring BGL may be electrically connected to the wiring WL. By applying the same potential to the wiring WL and the wiring BGL, the current characteristics of the transistor 273 can be improved.

Data writing is performed in such a manner that a high-level potential is applied to the wiring WL to bring the transistor 273 into conduction so that the wiring WBL is electrically connected to the one electrode of the capacitor 274. Specifically, when the transistor 273 is in a conduction state, a potential corresponding to information to be recorded is applied to the wiring WBL, so that the potential is written to the one electrode of the capacitor 275 and the gate of the transistor 272. After that, a low-level potential is applied to the wiring WL to bring the transistor 273 out of conduction, so that the potential of the one electrode of the capacitor 275 and the potential of the gate of the transistor 272 are retained.

Data reading is performed by applying a predetermined potential to the wiring RL and the wiring SL. Current flowing between the source and the drain of the transistor 272 and the potential of the one of the source and the drain of the transistor 273 are determined by the potential of the gate of the transistor 272 and the potential of the other of the source and the drain of the transistor 273. Thus, by reading the potential of the wiring RBL connected to the one of the source and the drain of the transistor 273, the potential retained at the one electrode of the capacitor 275 (or the gate of the transistor 272) can be read. In other words, information written to this memory cell can be read from the potential retained at the one electrode of the capacitor 275 (or the gate of the transistor 272). Alternatively, existence or absence of information written to this memory cell can be found.

Alternatively, as illustrated in FIG. 16D, a structure may be employed in which the wiring WBL and the wiring RBL are combined into one wiring BIL. The memory cell 321c3 illustrated in FIG. 16D has a structure in which one wiring BIL corresponds to the wiring WBL and the wiring RBL in the memory cell 321c2 and the other of the source and the drain of the transistor 273 and the one of the source and the drain of the transistor 273 are connected to the wiring BIL. In other words, the memory cell 321c3 has a structure in which one wiring BIL operates as a write bit line and a read bit line.

Note that also in each of the memory cell 321c2 and the memory cell 321c3, an OS transistor is preferably used as the transistor 273. A memory device using a 2Tr1C-type memory cell using an OS transistor as the transistor 273, such as the memory cell 321c or a memory cell 321d, is referred to as a NOSRAM (Non-volatile Oxide Semiconductor Random Access Memory). Note that the circuit structure of the memory cell can be changed as appropriate.

In addition, FIG. 16E is a diagram illustrating the memory cell 321d that can be used in the memory circuit 325. The memory circuit 325 is a DRAM, and the memory cell 321d includes a transistor 278 and a capacitor 279. The memory cell 321d can be operated in a manner similar to the memory cell 321cl. Note that a transistor 276 is a Si transistor; thus, neither the wiring BGL nor a transistor back gate is provided.

<Memory Circuit 2>

Figure 17A:
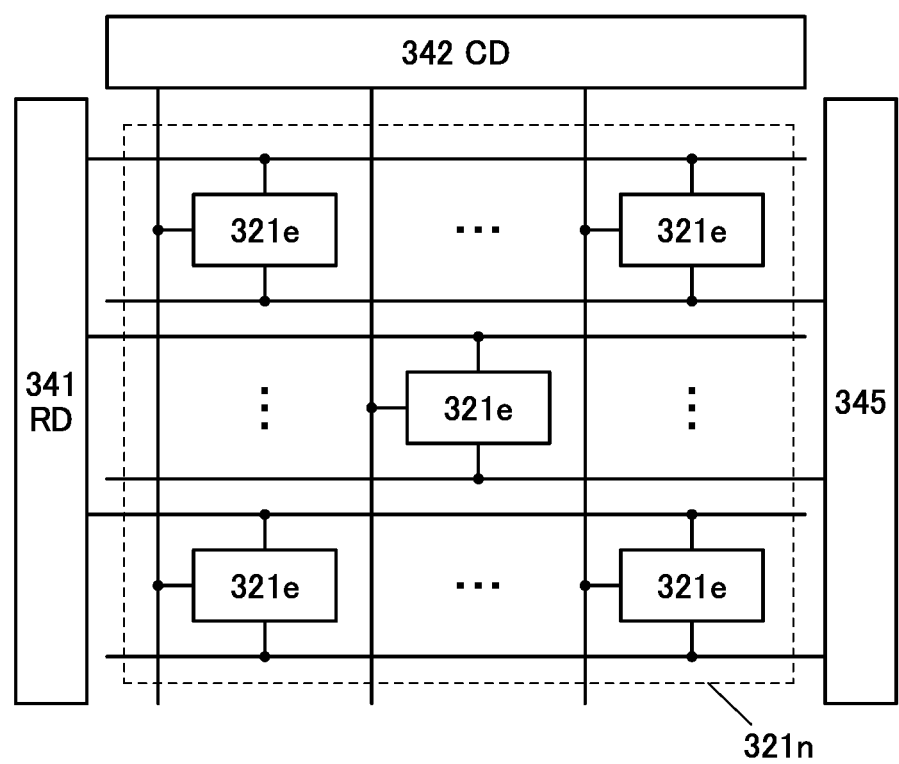
FIG. 17A is a diagram illustrating a memory circuit.

Alternatively, a structure illustrated in FIG. 17A may be used for each of the memory circuit 321a, the memory circuit 321b, the memory circuit 324, the memory circuit 325, and their driver circuits. A memory cell 321e illustrated in FIG. 17B can be used for a memory circuit 321n having the structure illustrated in FIG. 17A.

The memory cell 321e includes the transistor 276 and a capacitor 277. One of a source and a drain of the transistor 276 is connected to one electrode of the capacitor 277. The other of the source and the drain of the transistor 276 is connected to the wiring BIL. A gate of the transistor 276 is connected to the wiring WL. In addition, the other electrode of the capacitor 277 is connected to a wiring PL.

The wiring BIL functions as a bit line. The wiring WL functions as a word line. The wiring PL is a wiring for applying a plate potential required for data writing or data reading to the capacitor 277. A circuit 345 illustrated in FIG. 17A is a circuit that supplies a plate potential, and can be provided in the region 210 included in the layer 201 in a manner similar to the row driver 341 and the column driver 342. In addition, a sense amplifier may be electrically connected to the wiring BIL. The potential of the wiring BIL that is amplified by the sense amplifier can be read.

An OS transistor, a Si transistor, or the like can be used as the transistor 276. In the case where an OS transistor is used as the transistor 276, it is preferable to provide a back gate that is electrically connected to the wiring BGL, as illustrated in FIG. 13C. By applying an appropriate potential to the wiring BGL, the threshold voltage of the transistor 271 can be increased or decreased. Alternatively, the wiring BGL may be electrically connected to the wiring WL. By applying the same potential as the potential of the wiring WL to the wiring BGL, the current characteristics of the transistor 271 can be improved.

In addition, OS transistors have characteristics of high breakdown voltage. Thus, with the use of an OS transistor as the transistor 276, high voltage can be applied to the transistor 276 even when the transistor 276 is miniaturized. Miniaturization of the transistor 276 can reduce the occupation area of the memory cell 321e.

The capacitor 277 contains a material that can have ferroelectricity as a dielectric layer between the two electrodes. In the following description, the dielectric layer of the capacitor 277 is referred to as a ferroelectric layer. In addition, a capacitor including a ferroelectric layer can be referred to as a ferroelectric capacitor. Furthermore, a structure in which a switch such as a transistor is combined with a ferroelectric capacitor can be referred to as a ferroelectric memory.

Examples of the material that can have ferroelectricity include a material where an element J1 (here, the element J1 is zirconium (Zr), silicon (Si), aluminum (Al), gadolinium (Gd), yttrium (Y), lanthanum (La), strontium (Sr), or the like) is added to hafnium oxide, zirconium oxide, $HfZrO_X$ (X is a real number greater than 0), or hafnium oxide and a material where an element J2 (here, the element J2 is hafnium (Hf), silicon (Si), aluminum (Al), gadolinium (Gd), yttrium (Y), lanthanum (La), strontium (Sr), or the like) is added to zirconium oxide.

Alternatively, as the material that can have ferroelectricity, piezoelectric ceramics with a perovskite structure, such as lead titanate (PT), barium strontium titanate (BST), strontium titanate, lead zirconate titanate (PZT), strontium bismuth tantalate (SBT), bismuth ferrite (BFO), or barium titanate, may be used. Alternatively, as the material that can have ferroelectricity, a mixture or a compound containing a plurality of materials selected from the materials described above can be used, for example. Alternatively, the ferroelectric layer can have a stacked-layer structure of a plurality of materials selected from the materials described above.

In particular, as the material that can have ferroelectricity, a material that contains hafnium oxide, or hafnium oxide and zirconium oxide can have ferroelectricity even the material is processed into a thin film with several nanometers. When the ferroelectric layer can be formed of a thin film, compatibility with a transistor miniaturization step can be improved.

Alternatively, in the case where $HfZrO_X$ is used as the material that can have ferroelectricity, it is preferable to deposit $HfZrO_X$ by an atomic layer deposition (ALD) method, especially a thermal ALD method. In addition, in the case where the material that can have ferroelectricity is deposited by a thermal ALD method, it is preferable to use a material that does not contain hydrocarbon (also referred to as Hydro Carbon or HC) as a precursor. In the case where either one or both hydrogen and carbon are contained in the material that can have ferroelectricity, crystallization of the material that can have ferroelectricity is inhibited in some cases. Therefore, it is preferable to use a precursor that does not contain hydrocarbon as described above so that the concentration of either one or both hydrogen and carbon in the material that can have ferroelectricity is reduced. For example, a chlorine-based material can be given as the precursor that does not contain hydrocarbon. Note that in the case where a material containing hafnium oxide and zirconium oxide ($HfZrO_X$) is used as the material that can have ferroelectricity, $HfCl_4$ and/or $ZrCl_4$ is used as the precursor.

Note that in the case where a film using the material that can have ferroelectricity is deposited, impurities in the film, here, at least one or more of hydrogen, hydrocarbon, and carbon are thoroughly eliminated, so that a highly purified intrinsic film having ferroelectricity can be formed. Note that the highly purified intrinsic film having ferroelectricity has extremely high manufacturing process compatibility with a highly purified intrinsic oxide semiconductor to be described in a later embodiment. Thus, a highly productive method for manufacturing a semiconductor apparatus can be provided.

In addition, in the case where $HfZrO_X$ is used as the material that can have ferroelectricity, it is preferable to deposit hafnium oxide and zirconium oxide alternately by a thermal ALD method so that their composition ratio is 1:1.

In addition, in the case where the material that can have ferroelectricity is deposited by a thermal ALD method, $H_2O$ or $O_3$ can be used as an oxidizing agent. Note that the oxidizing agent of the thermal ALD method is not limited thereto. For example, one or more selected from $O_2$, $O_3$, $N_2O$, $NO_2$, $H_2O$, and $H_2O_2$ may be contained as the oxidizing agent of the thermal ALD method.

In addition, the crystalline structure of the material that can have ferroelectricity is not particularly limited. For example, as the crystalline structure of the material that can have ferroelectricity, one or more selected from a cubic crystalline structure, a tetragonal crystalline structure, an orthorhombic crystalline structure, and a monoclinic crystalline structure are used. In particular, the material that can have ferroelectricity preferably has an orthorhombic crystalline structure because the material exhibits ferroelectricity. Alternatively, the material that can have ferroelectricity may have a hybrid structure including an amorphous structure and a crystalline structure.

Figure 18A:
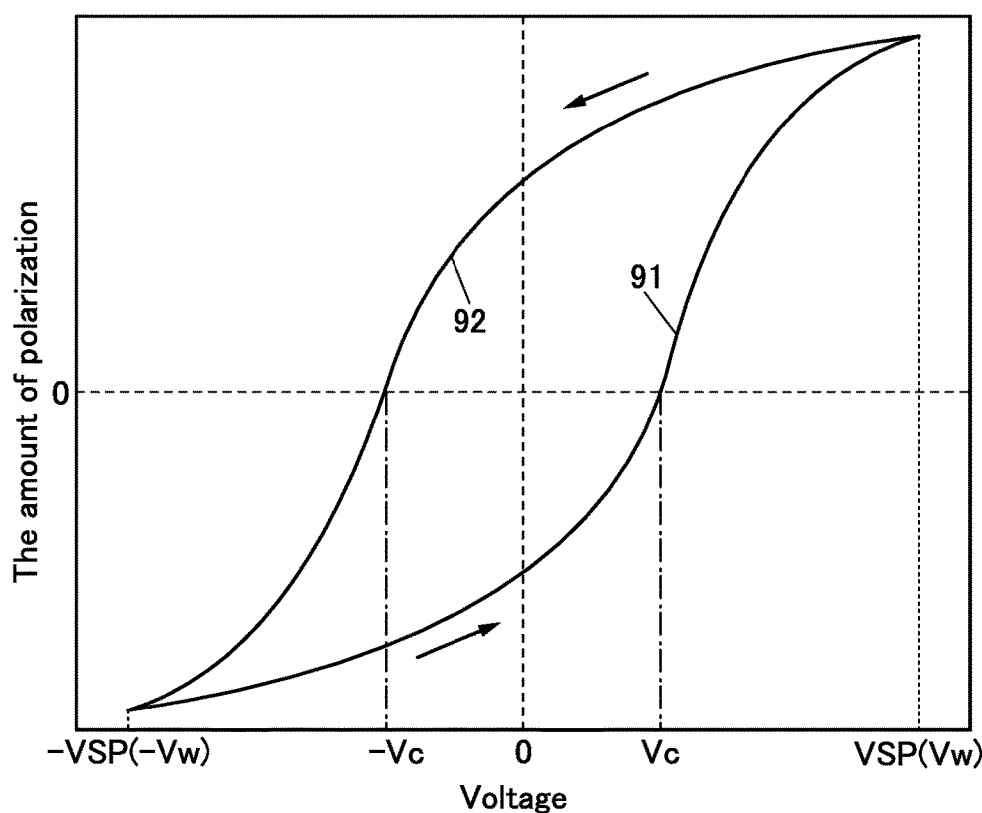
FIG. 18A is a diagram showing the hysteresis characteristics of a ferroelectric layer.

FIG. 18A is a graph showing an example of hysteresis characteristics of the ferroelectric layer. In FIG. 18A, the horizontal axis represents voltage to be applied to the ferroelectric layer. The voltage can be a difference between the potential of the one electrode of the capacitor 277 and the potential of the other electrode of the capacitor 277, for example. In addition, in FIG. 18A, the vertical axis represents the polarization amount of the ferroelectric layer.

As shown in FIG. 18A, the hysteresis characteristics of the ferroelectric layer can be shown by a curve 91 and a curve 92. Voltages at intersections of the curve 91 and the curve 92 are VSP and −VSP. VSP and −VSP can have different polarities.

When voltage applied to the ferroelectric layer increases after voltage that is lower than or equal to −VSP is applied to the ferroelectric layer, the polarization amount of the ferroelectric layer increases along the curve 91. Meanwhile, when voltage applied to the ferroelectric layer decreases after voltage that is higher than or equal to VSP is applied to the ferroelectric layer, the polarization amount of the ferroelectric layer decreases along the curve 92. Here, VSP and −VSP can each be referred to as saturated polarization voltage. Note that for example, VSP is sometimes referred to as first saturated polarization voltage, and −VSP is sometimes referred to as second saturated polarization voltage. In addition, although the absolute value of the first saturated polarization voltage equals the absolute value of the second saturated polarization voltage in FIG. 18A, the absolute value of the first saturated polarization voltage and the absolute value of the second saturated polarization voltage may differ from each other.

Here, voltage (coercive voltage) at which the polarization amount of the ferroelectric layer becomes 0 when the polarization amount of the ferroelectric layer changes along the curve 91 is denoted by Vc. In addition, voltage (coercive voltage) at which the polarization amount of the ferroelectric layer becomes 0 when the polarization amount of the ferroelectric layer changes along the curve 92 is denoted by −Vc. The value of Vc and the value of −Vc can be values between −VSP and VSP. Note that for example, Vc is sometimes referred to as first coercive voltage, and −Vc is sometimes referred to as second coercive voltage. In addition, although an example in which the absolute value of the first coercive voltage equals the absolute value of the second coercive voltage is shown in FIG. 18A, the absolute value of the first coercive voltage and the absolute value of the second coercive voltage may differ from each other.

As described above, the voltage to be applied to the ferroelectric layer of the capacitor 277 can be represented by a difference between the potential of the one electrode of the capacitor 277 and the potential of the other electrode of the capacitor 277. The other electrode of the capacitor 277 is electrically connected to the wiring PL. Therefore, by controlling the potential of the wiring PL, the voltage to be applied to the ferroelectric layer of the capacitor 277 can be controlled.

<Example of Method for Driving Memory Cell>

Figures 17B, 17C:
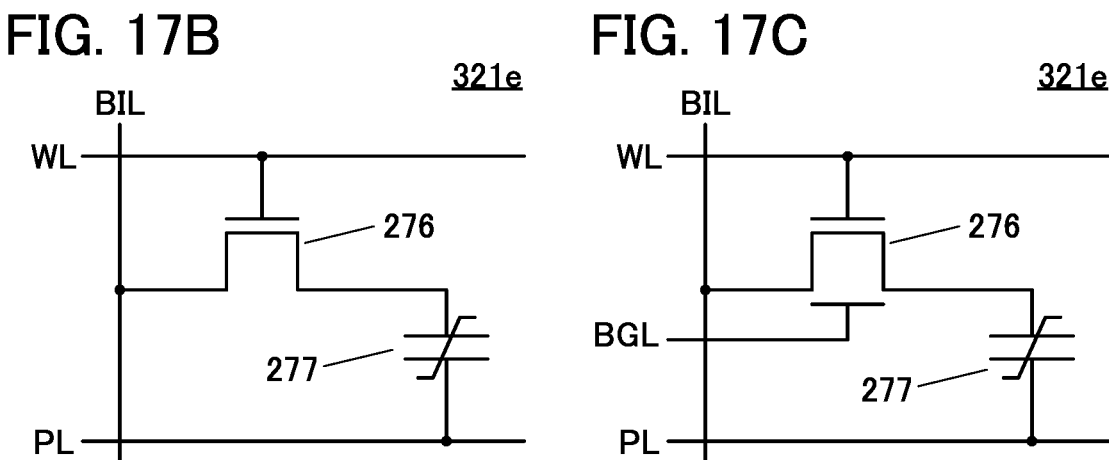
FIG. 17B and FIG. 17C are diagrams illustrating memory cells.

An example of a method for driving the memory cell 321e illustrated in FIG. 17B is described below. In the following description, the voltage to be applied to the ferroelectric layer of the capacitor 277 is a difference between the potential of the one electrode of the capacitor 277 and the potential of the other electrode of the capacitor 277 (the wiring PL). In addition, the transistor 276 is an n-channel transistor.

Figure 18B:
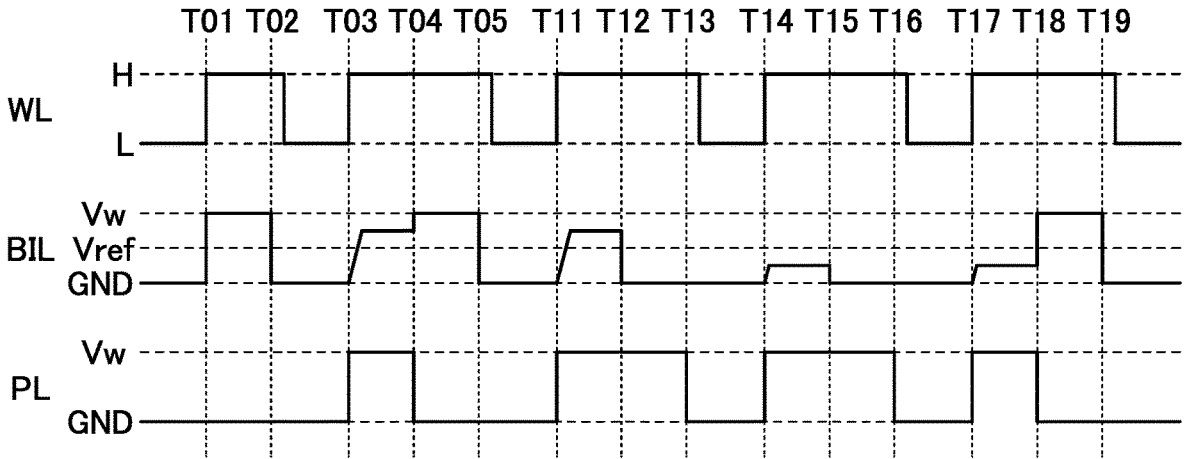
FIG. 18B is a timing chart showing the operation of the memory cell.

FIG. 18B is a timing chart showing an example of the method for driving the memory cell 321e illustrated in FIG. 17B. FIG. 18B shows an example in which binary digital data is written to and read from the memory cell 321e.

Note that a sense amplifier is electrically connected to the wiring BIL, and Vref is supplied as a reference potential to the sense amplifier. For example, in the case where the potential of the wiring BIL is higher than Vref, data "1" can be read. Alternatively, in the case where the potential of the wiring BIL is lower than Vref, data "0" can be read. First, an operation of writing the data "1" to the memory cell 321e from Time T01 to Time T03 is described.

When the potential of the wiring WL is set to a high potential H from Time T01 to Time T02, the transistor 276 is set in an on state. In addition, the potential of the wiring BIL is set to Vw. Since the transistor 276 is in the on state, the potential of the one electrode of the capacitor 277 becomes Vw. Furthermore, the potential of the wiring PL is set to GND. Through the operation, the voltage to be applied to the ferroelectric layer of the capacitor 277 becomes "Vw−GND." Accordingly, the data "1" can be written to the memory cell 321e.

Here, Vw is preferably higher than or equal to VSP, and can equal VSP, for example. In addition, although GND can be, for example, a ground potential or 0 V, GND may be a different potential.

Then, when the potential of the wiring BIL and the potential of the wiring PL are set to GND at Time T02, the voltage to be applied to the ferroelectric layer of the capacitor 277 becomes 0 V. When the voltage "Vw−GND" to be applied to the ferroelectric layer of the capacitor 277 is higher than or equal to VSP from Time T01 to Time T02, the polarization amount of the ferroelectric layer of the capacitor 277 from Time T02 to Time T03 changes to the position of 0 V along the curve 92 illustrated in FIG. 18A. Accordingly, the polarization direction in the ferroelectric layer of the capacitor 277 is kept.

After the potential of the wiring BIL and the potential of the wiring PL are set to GND, the potential of the wiring WL is set to a low potential L, so that the transistor 276 is set in an off state. Accordingly, the write operation is completed, and the data "1" is retained in the memory cell 321e.

Next, a data read operation from Time T03 to Time T04 is described.

When the potential of the wiring WL is set to the high potential H from Time T03 to Time T04, the transistor 276 is set in an on state. In addition, the potential of the wiring PL is set to Vw. When the potential of the wiring PL is set to Vw, the voltage to be applied to the ferroelectric layer of the capacitor 277 becomes "GND−Vw."

At this time, since the voltage to be applied to the ferroelectric layer of the capacitor 277 is inverted from "Vw−GND" into "GND−Vw," polarization inversion occurs in the ferroelectric layer of the capacitor 277. Current flows through the wiring BIL during the polarization inversion; thus, the potential of the wiring BIL becomes higher than Vref. Therefore, through the operation of the sense amplifier, the data "1" retained in the memory cell 321e can be read. Note that although the case where Vref is higher than GND and lower than Vw is described, Vref may be higher than Vw, for example.

Next, a data rewrite operation from Time T04 to Time T05 is described.

The data "1" retained in the memory cell 321e is lost because the read operation is destructive reading by inversion of the polarization direction. Therefore, when the potential of the wiring BIL is set to M'w and the potential of the wiring PL is set to GND from Time T04 to Time T05, the data "1" is rewritten to the memory cell 321e.

The potential of the wiring BIL and the potential of the wiring PL are set to GND at Time T05. After that, the potential of the wiring WL is set to the low potential L. Accordingly, the rewrite operation is completed, and the data "1" is retained in the memory cell 321e.

Next, a read operation and an operation of writing the data "0" to the memory cell 321e from Time T11 to Time T13 are described.

The potential of the wiring WL is set to the high potential H and the potential of the wiring PL is set to Vw from Time T11 to Time T12. Since the data "1" is retained in the memory cell 321e, the potential of the wiring BIL becomes higher than Vref, and the data "1" retained in the memory cell 321e is read.

The potential of the wiring BIL is set to GND from Time T12 to Time T13. Since the transistor 276 is in the on state, the potential of the one electrode of the capacitor 277 is set to GND. Furthermore, the potential of the wiring PL is set to Vw. Through the operation, the voltage to be applied to the ferroelectric layer of the capacitor 277 becomes "GND–Vw." Accordingly, the data "0" can be written to the memory cell 321e.

Then, when the potential of the wiring BIL and the potential of the wiring PL are set to GND at Time T13, the voltage to be applied to the ferroelectric layer of the capacitor 277 becomes 0 V. When the voltage "GND–Vw" to be applied to the ferroelectric layer of the capacitor 277 is lower than or equal to –VSP from Time T12 to Time T13, the polarization amount of the ferroelectric layer of the capacitor 277 from Time T13 to Time T14 changes to the position of 0 V along the curve 91 illustrated in FIG. 18A. Accordingly, the polarization direction in the ferroelectric layer of the capacitor 277 is kept.

After the potential of the wiring BIL and the potential of the wiring PL are set to GND, the potential of the wiring WL is set to the low potential L, so that the transistor 276 is set in an off state. Accordingly, the write operation is completed, and the data "0" is retained in the memory cell 321e.

Next, a data read operation from Time T14 to Time T15 is described.

When the potential of the wiring WL is set to the high potential H from Time T14 to Time T15, the transistor 276 is set in an on state. In addition, the potential of the wiring PL is set to Vw. When the potential of the wiring PL is set to Vw, the voltage to be applied to the ferroelectric layer of the capacitor 277 becomes "GND–Vw."

At this time, since the voltage to be applied to the ferroelectric layer of the capacitor 277 is the same as "GND–Vw" during the data writing, polarization inversion does not occur in the ferroelectric layer of the capacitor 277. Thus, the amount of current flowing through the wiring BIL becomes smaller than that when the polarization inversion occurs in the ferroelectric layer of the capacitor 277. Therefore, the amount of increase in the potential of the wiring BIL becomes smaller. Specifically, the potential of the wiring BIL becomes lower than or equal to Vref, and through the operation of the sense amplifier, the data "O" retained in the memory cell 321e can be read.

Next, a data rewrite operation from Time T15 to Time T17 is described.

The potential of the wiring BIL is set to GND and the potential of the wiring PL is set to Vw from Time T15 to Time T16. Through the operation, the data "O" is rewritten to the memory cell 321e.

The potential of the wiring BIL and the potential of the wiring PL are set to GND from Time T16 to Time T17. After that, the potential of the wiring WL is set to the low potential L. Accordingly, the rewrite operation is completed, and the data "O" is retained in the memory cell 321e.

Next, data reading and an operation of writing the data "1" to the memory cell 321e from Time T17 to Time T19 are described.

The potential of the wiring WL is set to the high potential H and the potential of the wiring PL is set to Vw from Time T17 to Time T18. Since the data "0" is retained in the memory cell 321e, the potential of the wiring BIL becomes lower than Vref, and the data "0" retained in the memory cell 321e is read.

The potential of the wiring BIL is set to Vw from Time T18 to Time T19. Since the transistor 276 is in the on state, the potential of the one electrode of the capacitor 277 is set to Vw. Furthermore, the potential of the wiring PL is set to GND. Through the operation, the voltage to be applied to the ferroelectric layer of the capacitor 277 becomes "Vw–GND." Accordingly, the data "1" can be written to the memory cell 321e.

The potential of the wiring BIL and the potential of the wiring PL are set to GND at or after Time T19. After that, the potential of the wiring WL is set to the low potential L. Accordingly, the write operation is completed, and the data "1" is retained in the memory cell 321e.

Although the above is an operation example of the memory cell 321e, operations such as data writing, reading, and rewriting may be performed by a different method.

<Stacked Structure 1>

Next, a stacked structure of the imaging device is described using a cross-sectional view. Note that in the following description, the same reference numeral is used to denote through wirings provided in the same layer.

Figure 19:
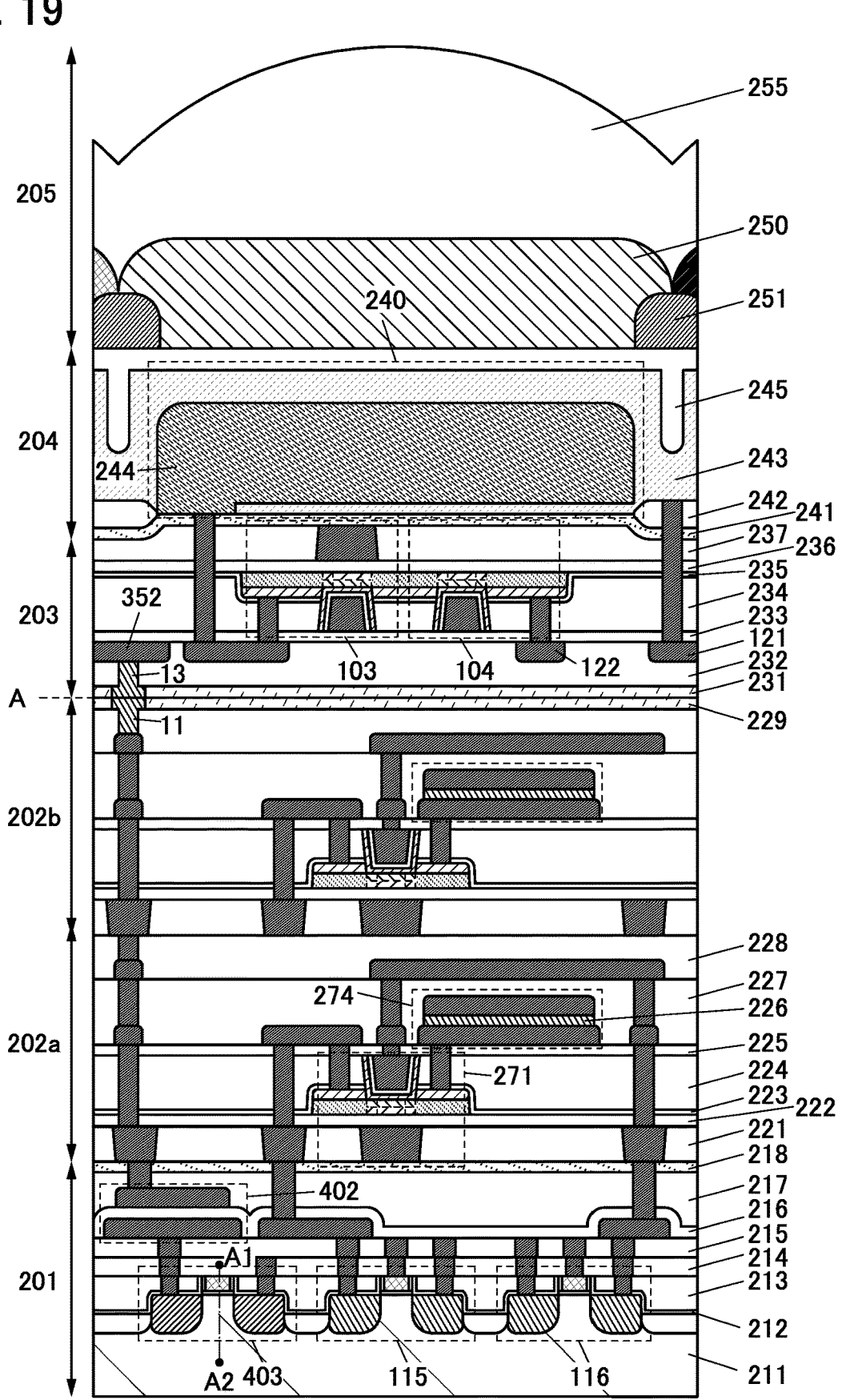
FIG. 19 is a cross-sectional view illustrating a pixel.

FIG. 19 is an example of a cross-sectional view of the stacks illustrated in FIG. 2C and FIG. 4A. Note that FIG. 19 also illustrates the layer 205.

<Layer 201>

The layer 201 includes the read circuit 311, the driver circuit 312, the driver circuit 332, and the arithmetic circuit 314 that are provided over a silicon substrate 211. Here, as parts of the circuits, the capacitor 402 and the transistor 403 that are included in the CDS circuit of the read circuit 311, a transistor 115 included in the read circuit 311, and a transistor 116 included in the driver circuit 332 are shown. One electrode of the capacitor 402 is electrically connected to one of a source and a drain of the transistor 403.

Insulating layers 212, 213, 214, 215, 216, 217, and 218 are provided in the layer 201. The insulating layer 212 has a function of a protective film. The insulating layers 213, 214, 215, and 217 each have functions of an interlayer insulating film and a planarization film. The insulating layer 216 has a function of a dielectric layer of the capacitor 402. The insulating layer 218 has a function of a blocking film.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used. As the blocking film, a film that has a function of preventing hydrogen diffusion is preferably used.

In a Si device, hydrogen is necessary to terminate dangling bonds; however, hydrogen in the vicinity of an OS transistor is one of the factors in generating carriers in an oxide semiconductor layer, which decreases reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

Figure 20A:
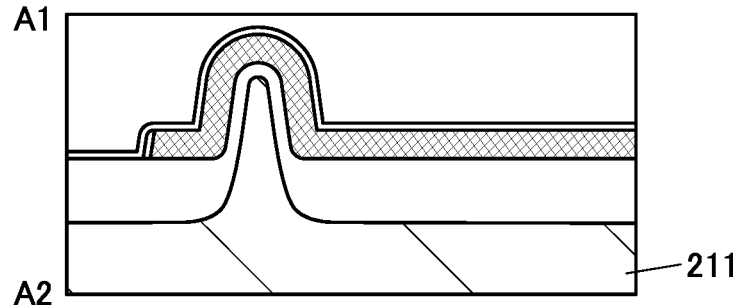
FIG. 20A to FIG. 20C are diagrams illustrating Si transistors.

Si transistors illustrated in FIG. 19 are fin-type transistors including channel formation regions in the silicon substrate 211, and FIG. 20A illustrates a cross section (a cross section along A1-A2 shown in FIG. 19) in a channel width direction.

Figure 20B:
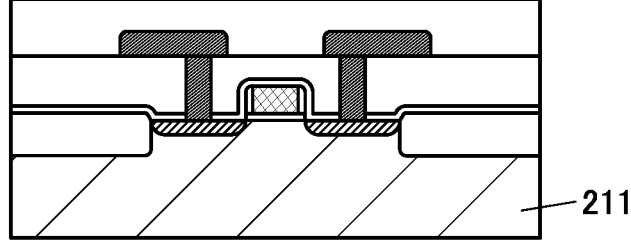

Note that the Si transistors may each be a planar-type transistor as illustrated in FIG. 20B.

Figure 20C:
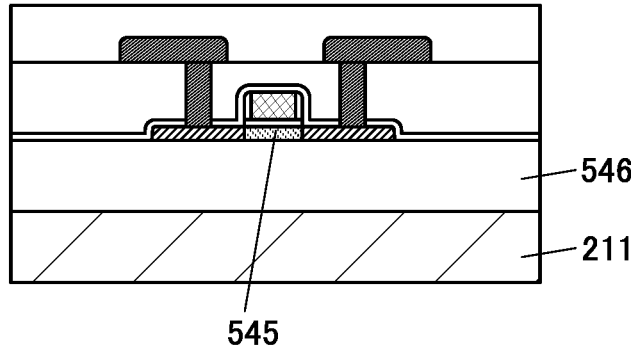

Alternatively, as illustrated in FIG. 20C, a transistor including a semiconductor layer 545 of a silicon thin film may be used. The semiconductor layer 545 can be single crystal silicon (SOI (Silicon on Insulator)) formed on an insulating layer 546 on the silicon substrate 211, for example.

Note that as a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing the above metal element as its component; an alloy containing a combination of the above metal elements; or the like is selected and used as appropriate. The conductor is not limited to a single layer, and may be a plurality of layers including different materials.

<Layer 202*a*>

The layer 202*a* is formed over the layer 201. The layer 202*a* includes the memory circuit 321*a* including OS transistors. Here, the transistor 271 and the capacitor 274 that are included in the memory cell 321*cl* illustrated in FIG. 16B are illustrated as part of the memory circuit 321*a*. Note that the memory cell 321*c*2 illustrated in FIG. 16C, the memory cell 321*c*3 illustrated in FIG. 16D, or the memory cell 321*e* illustrated in FIG. 17B or FIG. 17C can be also used for the memory circuit 321*a*.

Insulating layers 221, 222, 223, 224, 225, 227, and 228 are provided in the layer 202*a*. The insulating layers 221, 224, 225, 227, and 228 each have functions of an interlayer insulating film and a planarization film. The insulating layer 222 has a function of a gate insulating film. The insulating layer 223 has a function of a protective film. As the gate insulating film, a silicon oxide film or the like can be used.

The one of the source and the drain of the transistor 271 is electrically connected to one of a source and a drain of the transistor 115 in the layer 201. The gate of the transistor 271 is electrically connected to one of a source and a drain of the transistor 116 in the layer 201. The other of the source and the drain of the transistor 276 is electrically connected to the one electrode of the capacitor 274. The capacitor 274 includes a ferroelectric layer 226 between the one electrode and the other electrode.

The details of an OS transistor are illustrated in FIG. 21A. The OS transistor illustrated in FIG. 21A has a self-aligned structure in which a source electrode 705 and a drain electrode 706 are formed through provision of an insulating layer over a stack of an oxide semiconductor layer and a conductive layer and provision of an opening portion reaching the oxide semiconductor layer.

The OS transistor can include a gate electrode 701 and a gate insulating film 702 in addition to a channel formation region 708, a source region 703, and a drain region 704 that are formed in the oxide semiconductor layer. At least the gate insulating film 702 and the gate electrode 701 are provided in the opening portion. An oxide semiconductor layer 707 may be also provided in the groove.

As illustrated in FIG. 21B, the OS transistor may have a self-aligned structure in which the source region 703 and the drain region 704 are formed in a semiconductor layer with the gate electrode 701 as a mask.

Alternatively, as illustrated in FIG. 21C, the OS transistor may be a non-self-aligned top-gate transistor including a region where the gate electrode 701 and the source electrode 705 or the drain electrode 706 overlap each other.

Although a structure in which the OS transistor includes a back gate 535 is illustrated, a structure without a back gate may be employed. As illustrated in a cross-sectional view of a transistor in a channel width direction in FIG. 21D, the back gate 535 may be electrically connected to a front gate of the transistor that is provided to face the back gate 535. Note that FIG. 21D illustrates an example of a B1-B2 cross section shown in FIG. 21A, and the same applies to transistors having other structures. Alternatively, a structure where a fixed potential different from the potential supplied to the front gate can be supplied to the back gate 535 may be employed.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS, a CAC-OS, or the like described later can be used, for example. A CAAC-OS has a crystal structure including stable atoms and is suitable for a transistor or the like that puts emphasis on reliability. In addition, a CAC-OS exhibits excellent mobility characteristics and thus is suitable for a transistor or the like that is driven at high speed.

In an OS transistor, a semiconductor layer has a large energy gap, and thus the OS transistor exhibits extremely low off-state current characteristics of several yoctoamperes per micrometer (the value of current per micrometer of channel width). In addition, an OS transistor has features such that impact ionization, an avalanche breakdown, a short-channel effect, and the like do not occur, which are different from those of a Si transistor, and enables formation of a circuit having high breakdown voltage and high reliability. Moreover, variations in electrical characteristics due to crystallinity unevenness, which are caused in Si transistors, are less likely to occur in OS transistors.

A semiconductor layer included in an OS transistor can be, for example, a film represented by an In-M-Zn-based oxide that contains indium, zinc, and M (one or more of metals such as aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide may be formed by an ALD (Atomic layer deposition) method.

It is preferable that the atomic ratio of metal elements in a sputtering target used to form an In-M-Zn oxide by a sputtering method satisfy In≥M and Zn≥M. The atomic ratio of metal elements of such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements contained in the sputtering target in a range of ±40%.

An oxide semiconductor with low carrier density is used for the semiconductor layer. For example, for the semiconductor layer, an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. The oxide semiconductor has low density of defect states and can be referred to as an oxide semiconductor having stable characteristics.

Note that the composition is not limited to those, and an oxide semiconductor having appropriate composition may be used depending on required semiconductor characteristics and electrical characteristics of the transistor (field-effect mobility, threshold voltage, or the like). In addition, to obtain the required semiconductor characteristics of the transistor, it is preferable that the carrier density, impurity concentration, defect density, atomic ratio between a metal element and oxygen, interatomic distance, density, and the like of the semiconductor layer be set to be appropriate.

When silicon or carbon, which is one of the Group 14 elements, is contained in the oxide semiconductor that constitutes the semiconductor layer, oxygen vacancies are increased, and the semiconductor layer becomes n-type. Thus, the concentration (concentration obtained by secondary ion mass spectrometry) of silicon or carbon in the semiconductor layer is set lower than or equal to $2\times10^{18}$ atoms/cm$^3$, preferably lower than or equal to $2\times10^{17}$ atoms/cm$^3$.

In addition, alkali metal and alkaline earth metal might generate carriers when bonded to an oxide semiconductor, in which case the off-state current of the transistor might be increased. Thus, the concentration (concentration obtained by secondary ion mass spectrometry) of alkali metal or alkaline earth metal in the semiconductor layer is set lower than or equal to $1\times10^{18}$ atoms/cm$^3$, preferably lower than or equal to $2\times10^{16}$ atoms/cm$^3$.

Furthermore, when nitrogen is contained in the oxide semiconductor that constitutes the semiconductor layer, electrons serving as carriers are generated and the carrier density is increased, so that the semiconductor layer easily becomes n-type. As a result, a transistor using an oxide semiconductor that contains nitrogen is likely to have normally-on characteristics. Therefore, the concentration (concentration obtained by secondary ion mass spectrometry) of nitrogen in the semiconductor layer is preferably set lower than or equal to $5\times10^{18}$ atoms/cm$^3$.

In addition, when hydrogen is contained in an oxide semiconductor included in the semiconductor layer, hydrogen reacts with oxygen bonded to a metal atom to be water, and thus sometimes causes an oxygen vacancy in the oxide semiconductor. When a channel formation region in the oxide semiconductor includes oxygen vacancies, the transistor sometimes has normally-on characteristics. Furthermore, in some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defect quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" described in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

Moreover, the semiconductor layer may have a non-single-crystal structure, for example. The non-single-crystal structure includes, for example, a CAAC-OS (C-Axis Aligned Crystalline Oxide Semiconductor) including a c-axis aligned crystal, a polycrystalline structure, a micro-crystalline structure, or an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide semiconductor film having an amorphous structure has a completely amorphous structure and no crystal part, for example.

Note that the semiconductor layer may be a mixed film including two or more kinds selected from a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more kinds of regions selected from the above regions in some cases.

The composition of a CAC (Cloud-Aligned Composite)-OS, which is one embodiment of a non-single-crystal semiconductor layer, is described below.

The CAC-OS is, for example, a composition of a material in which elements that constitute an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that the oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as InO$_{X1}$ (X1 is a real number greater than 0)) or indium zinc oxide (hereinafter referred to as In$_{X2}$Zn$_{Y2}$O$_{Z2}$ (each of X2, Y2, and Z2 is a real number greater than 0)) and gallium oxide (hereinafter referred to as GaO$_{X3}$ (X3 is a real number greater than 0)), gallium zinc oxide (hereinafter referred to as $Ga_{X4}Zn_{Y4}O_{Z4}$ (each of X4, Y4, and 74 is a real number greater than 0)), or the like so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite oxide semiconductor having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of an oxide semiconductor. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where $GaO_{X3}$ is a main component and the region where $In_{X2}Zn_{Y2}O_{Z2}$ or $InO_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using $\theta/2\theta$ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in a plan—View direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility (u) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, so that high on-state current (Ion) and high field-effect mobility (u) can be achieved.

In addition, a semiconductor apparatus using the CAC-OS has high reliability. Thus, the CAC-OS is suitable for a constituent material of a variety of semiconductor apparatuses.

<Layer 202*b*>

The layer 202*b* is formed over the layer 202*a*. The layer 202*b* includes the memory circuit 321*b* including OS transistors. The basic structure of the layer 202*b* is similar to that of the layer 202*a*, and only differences are described.

As layers that are the closest to the layer 203 in the layer 202*b*, an insulating layer 229 and the conductive layer 11 are provided. The insulating layer 229 and the conductive layer 11 each have a function of a bonding layer. The bonding layer will be described later. The conductive layer 11 is electrically connected to the other electrode of the capacitor 402 in the layer 201.

<Layer 203>

The layer 203 is formed on the layer 204. The layer 203 includes the pixel circuit 331 including OS transistors. Here, the transistor 103 and the transistor 104 are illustrated as part of the pixel circuit 331.

Insulating layers 231, 232, 233, 234, 235, 236, and 237 are provided in the layer 203. Moreover, the conductive layer 13 is provided.

The insulating layer 231 and the conductive layer 13 each have a function of a bonding layer. The insulating layers 232, 233, 234, and 237 each have functions of an interlayer insulating film and a planarization film. The insulating layer 235 has a function of a protective film. The insulating layer 236 has a function of a gate insulating film.

The conductive layer 13 is electrically connected to the wiring 352 functioning as the output line of the pixel circuit 331.

<Layer 204>

The layer 204 includes the photoelectric conversion device 240 and insulating layers 241, 242, and 245.

The photoelectric conversion device 240 is a pn-junction photodiode formed on a silicon substrate and includes a p-type region 243 and an n-type region 244. The photoelectric conversion device 240 is an embedded photodiode, which can suppress dark current and reduce noise with the thin p-type region 243 provided on a surface side (current extraction side) of the n-type region 244.

The insulating layer 241 has a function of a blocking layer. The insulating layer 242 has a function of an element isolation layer. The insulating layer 245 has a function of suppressing carrier leakage.

The silicon substrate is provided with a groove that separates pixels, and the insulating layer 245 is provided on a top surface of the silicon substrate and in the groove. Providing the insulating layer 245 can suppress leakage of carriers generated in the photoelectric conversion device 240 to an adjacent pixel. In addition, the insulating layer 245 also has a function of suppressing entry of stray light. Therefore, color mixing can be suppressed with the insulating layer 245. Note that an anti-reflection film may be provided between the top surface of the silicon substrate and the insulating layer 245.

The element isolation layer can be formed by a LOCOS (LOCal Oxidation of Silicon) method, an STI (Shallow Trench Isolation) method, or the like. As the insulating layer 245, for example, an inorganic insulating film of silicon oxide, silicon nitride, or the like or an organic insulating film of a polyimide resin, an acrylic resin, or the like can be used. Note that the insulating layer 245 may have a multilayer structure.

The n-type region 244 (corresponding to the cathode) of the photoelectric conversion device 240 is electrically connected to the one of the source and the drain of the transistor 103 in the layer 203. The p-type region 243 (anode) is electrically connected to the wiring 121 functioning as the power supply line in the layer 203.

<Layer 205>

The layer 205 is formed over the layer 204. The layer 205 includes a light-blocking layer 251, an optical conversion layer 250, and a microlens array 255.

The light-blocking layer 251 can inhibit the influx of light into an adjacent pixel. As the light-blocking layer 251, a metal layer of aluminum, tungsten, or the like can be used. In addition, the metal layer and a dielectric film having a function of an anti-reflection film may be stacked.

Figure 27A:
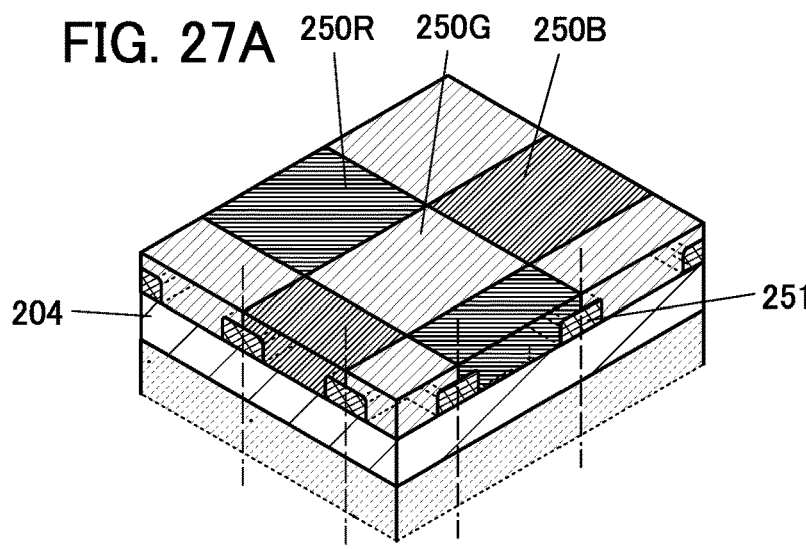
FIG. 27A to FIG. 27C are perspective views (cross-sectional views) illustrating pixels.

When the photoelectric conversion device 240 has sensitivity to visible light, a color filter can be used as the optical conversion layer 250. When color filters with colors of R (red), G (green), B (blue), Y (yellow), C (cyan), M (magenta), and the like are assigned to respective pixels, a color image can be obtained. For example, as illustrated in a perspective view (including a cross section) of FIG. 27A, a color filter 250R (red), a color filter 250G (green), and a color filter 250B (blue) can be assigned to different pixels.

In addition, when a wavelength cut filter is used as the optical conversion layer 250 in the appropriate combination of the photoelectric conversion device 240 and the optical conversion layer 250, the imaging device can capture images in a variety of wavelength regions.

For example, when an infrared filter that blocks light having a wavelength shorter than or equal to that of visible light is used as the optical conversion layer 250, an infrared imaging device can be obtained. Alternatively, when a filter that blocks light having a wavelength shorter than or equal to that of near infrared light is used as the optical conversion layer 250, a far-infrared imaging device can be obtained. Alternatively, when an ultraviolet filter that blocks light having a wavelength longer than or equal to that of visible light is used as the optical conversion layer 250, an ultraviolet imaging device can be obtained.

Figure 27B:
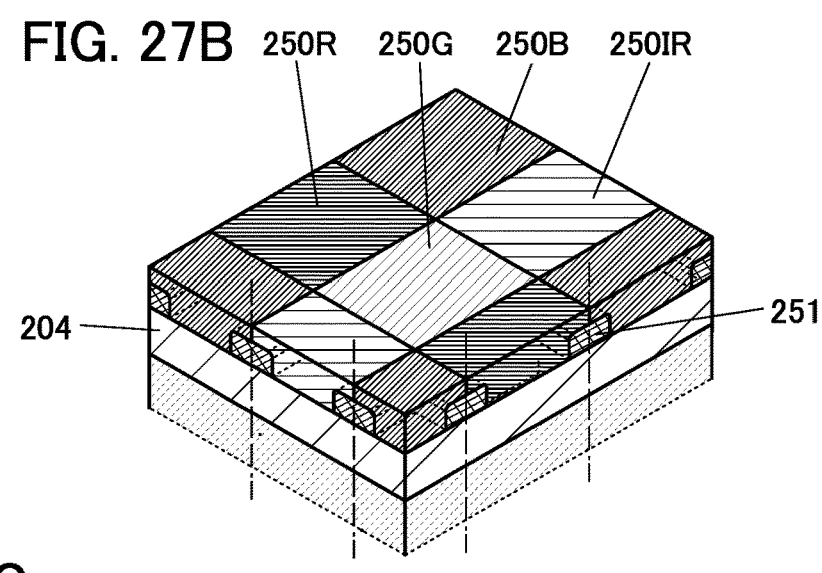

Note that different optical conversion layers may be provided in one imaging device. For example, as illustrated in FIG. 27B, the color filter 250R (red), the color filter 250G (green), the color filter 250B (blue), and an infrared filter 250IR can be assigned to different pixels. With this structure, a visible light image and an infrared light image can be obtained simultaneously.

Figure 27C:
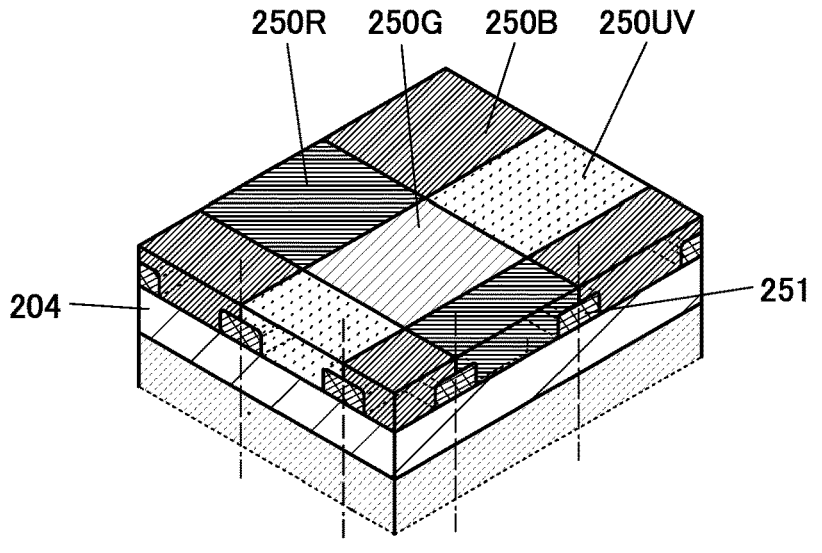

Alternatively, as illustrated in FIG. 27C, the color filter 250R (red), the color filter 250G (green), the color filter 250B (blue), and an ultraviolet filter 250UV can be assigned to different pixels. With this structure, a visible light image and an ultraviolet light image can be obtained simultaneously.

In addition, when a scintillator is used as the optical conversion layer 250, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 240 senses the light to obtain image data. Furthermore, the imaging device having this structure may be used in a radiation detector or the like.

The scintillator contains a substance that, when irradiated with radiation such as X-rays or gamma-rays, absorbs energy of the radiation to emit visible light or ultraviolet light. For example, a resin or ceramics in which $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, $ZnO$, or the like is dispersed can be used.

Image capturing utilizing infrared light or ultraviolet light can provide the imaging device with an inspection function, a security function, a sensor function, or the like. For example, by image capturing utilizing infrared light, non-destructive inspection of products, sorting of agricultural products (a sugar content meter function or the like), vein authentication, medical inspection, or the like can be performed. Furthermore, by image capturing utilizing ultraviolet light, ultraviolet light released from a light source or a frame can be detected, so that the light source, a heat source, a production apparatus, or the like can be controlled, for example.

The microlens array 255 is provided over the optical conversion layer 250. Light passing through each individual lens of the microlens array 255 goes through the optical conversion layer 250 directly under the lens, and the photoelectric conversion device 240 is irradiated with the light. With the microlens array 255, collected light can be incident on the photoelectric conversion device 240; thus, photoelectric conversion can be efficiently performed. The microlens array 255 is preferably formed using a resin, glass, or the like having a high light transmitting property with respect to light with an intended wavelength.

<Bonding>

Next, bonding of the layer 202b and the layer 203 is described.

The insulating layer 229 and the conductive layer 11 are provided in the layer 202b. The conductive layer 11 includes a region embedded in the insulating layer 229. Furthermore, surfaces of the insulating layer 229 and the conductive layer 11 are planarized to be level with each other.

The insulating layer 231 and the conductive layer 13 are provided in the layer 203. The conductive layer 13 includes a region embedded in the insulating layer 232. Furthermore, surfaces of the insulating layer 231 and the conductive layer 13 are planarized to be level with each other.

Here, a main component of the conductive layer 11 and a main component of the conductive layer 13 are preferably the same metal element. Furthermore, the insulating layer 229 and the insulating layer 231 are preferably formed of the same component.

For the conductive layers 11 and 13, Cu, Al, Sn, Zn, W, Ag, Pt, Au, or the like can be used, for example. Preferably, Cu, Al, W, or Au is used for easy bonding. In addition, for the insulating layers 229 and 231, silicon oxide, silicon oxynitride, silicon nitride oxide, silicon nitride, titanium nitride, or the like can be used.

That is, the same metal material described above is preferably used for the conductive layer 11 and the conductive layer 13. Furthermore, the same insulating material described above is preferably used for the insulating layer 229 and the insulating layer 231. With this structure, bonding where a boundary between the layer 202b and the layer 203 is a bonding position (position A) can be performed.

Note that the conductive layer 11 and the conductive layer 13 may each have a multilayer structure of a plurality of layers; in this case, outer layers (bonding surfaces) are formed of the same metal material. Furthermore, the insulating layer 229 and the insulating layer 231 may each have a multilayer structure of a plurality of layers; in this case, outer layers (bonding surfaces) are formed of the same insulating material.

Through the bonding, electrical connection between the conductive layer 11 and the conductive layer 13 can be obtained. Moreover, connection between the insulating layer 229 and the insulating layer 231 with mechanical strength can be obtained.

For bonding metal layers to each other, a surface activated bonding method in which an oxide film, a layer adsorbing impurities, and the like on surfaces are removed by sputtering treatment or the like and the cleaned and activated surfaces are brought into contact to be bonded to each other can be used. Alternatively, a diffusion bonding method in which surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used in which, after high planarity is obtained by polishing or the like, surfaces of the insulating layers subjected to hydrophilicity treatment with oxygen plasma or the like are brought into contact to be temporarily bonded to each other, and then dehydrated by heat treatment to perform final bonding. The hydrophilic bonding method can also cause bonding at an atomic level; thus, mechanically excellent bonding can be obtained.

When the layer 202b and the layer 203 are bonded to each other, the insulating layers and the metal layers coexist on their bonding surfaces; therefore, the surface activated bonding method and the hydrophilic bonding method are performed in combination, for example.

For example, it is possible to use a method in which the surfaces are made clean after polishing, the surfaces of the metal layers are subjected to anti-oxidation treatment and then hydrophilicity treatment, and bonding is performed. Furthermore, hydrophilicity treatment may be performed on the surfaces of the metal layers being hardly oxidizable metal such as Au. Note that a bonding method other than the above methods may be used.

The bonding allows the pixel circuit 331 included in the layer 203 to be electrically connected to the read circuit 311 included in the layer 201.

<Modification Example of Stacked Structure 1>

Figure 22:
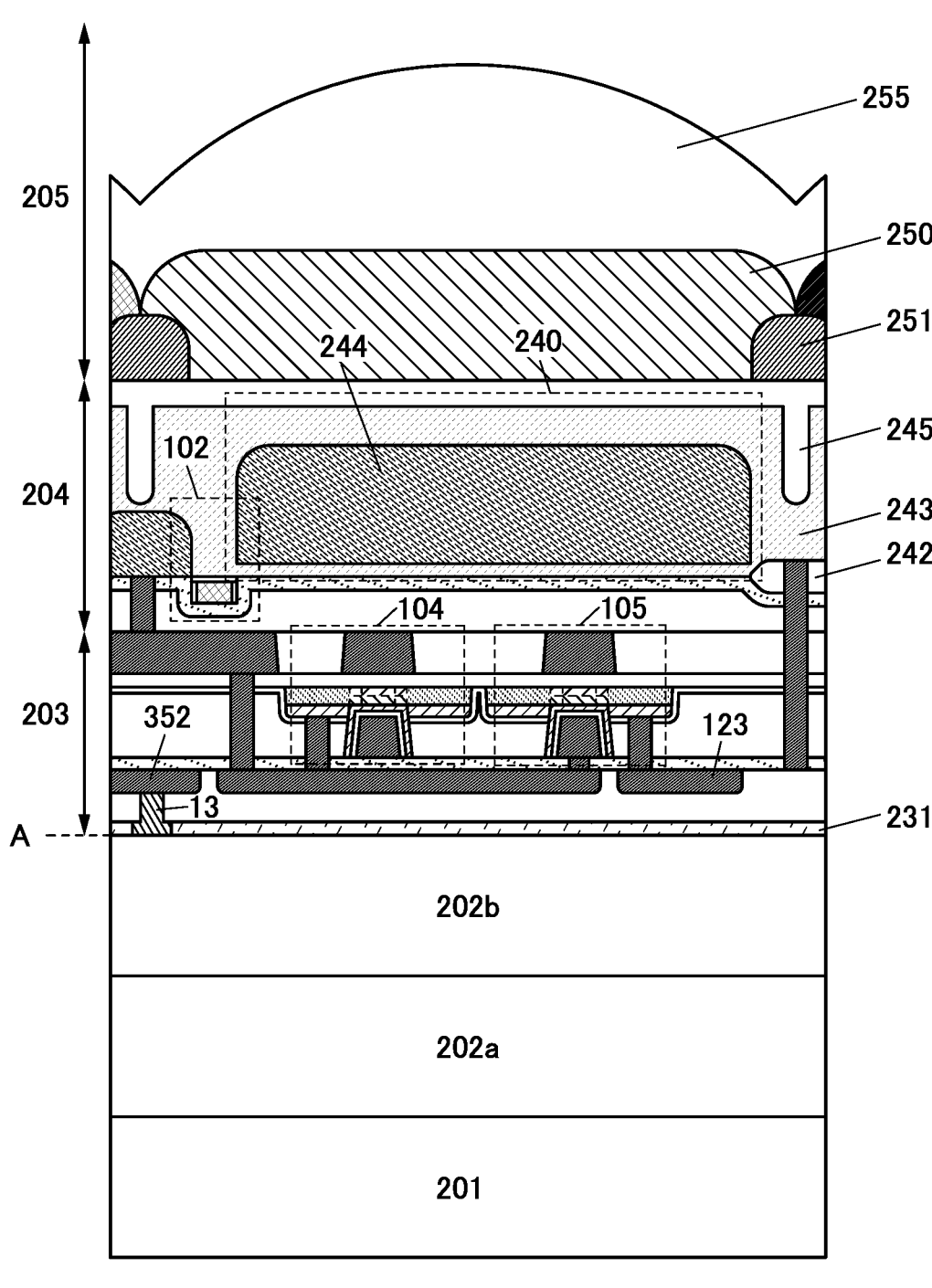
FIG. 22 is a cross-sectional view illustrating a pixel.

FIG. 22 illustrates a modification example in which the layer 203 and the layer 204 have structures different from those in Stacked Structure 1 illustrated in FIG. 19. Note that the details of the layer 201, the layer 202a, and the layer 202b are omitted. The modification example illustrated in FIG. 22 has a structure in which the transistor 103 included in the pixel circuit 331 is provided in the layer 204. The transistor 103 is formed using a Si transistor in the layer 204. The one of the source and the drain of the transistor 103 is directly connected to the photoelectric conversion device 240, and the other of the source and the drain of the transistor 103 functions as the node FD.

In that case, the transistors other than the transistor 103 included in the pixel circuit 331 are provided in the layer 203. The transistor 104 and the transistor 105 are illustrated in FIG. 22.

<Stacked Structure 2>

Figure 23:
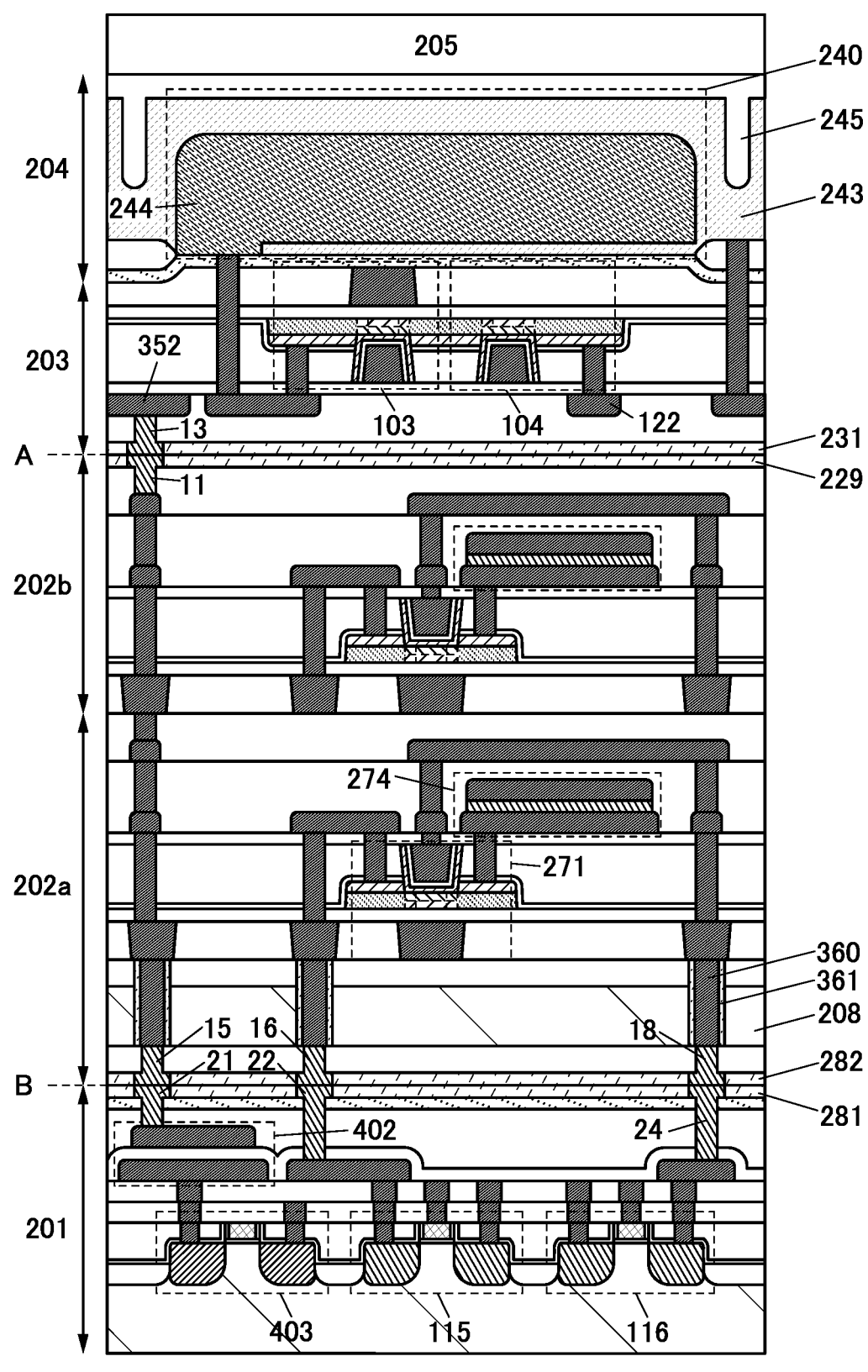
FIG. 23 is a cross-sectional view illustrating a pixel.

FIG. 23 is an example of a cross-sectional view of the stack illustrated in FIG. 3D and FIG. 6. Note that the details of the layer 205 are omitted. The basic structures in the layer 201 to the layer 205 are similar to those in Stacked Structure 1, and only differences are described.

As layers that are the closest to the layer 202a in the layer 201, an insulating layer 281, the conductive layer 21, the conductive layer 22, and the conductive layer 24 are provided. The insulating layer 281, the conductive layer 21, the conductive layer 22, and the conductive layer 24 each have a function of a bonding layer.

As layers that are the closest to the layer 201 in the layer 202a, an insulating layer 282, the conductive layer 15, the conductive layer 16, and the conductive layer 18 are provided. The insulating layer 282, the conductive layer 15, the conductive layer 16, and the conductive layer 18 each have a function of a bonding layer.

In the layer 202a, the support region 208 including single crystal silicon substrate is provided between the insulating layer 282 and the transistor 271. Each of the conductive layer 15, the conductive layer 16, and the conductive layer 18 is electrically connected to one of end portions of a through wiring 360 that penetrates the single crystal silicon substrate. The other of the end portions of the through wiring 360 is electrically connected to a wiring that is connected to the pixel circuit, the memory circuit, or the like. In addition, insulating layers 361 are formed on side surfaces of the through wiring 360.

When the conductive layer 15 and the conductive layer 21 are joined to each other in the position B, the capacitor 402 can be electrically connected to the wiring 352. In addition, when the conductive layer 16 and the conductive layer 22 are joined to each other, the transistor 115 can be electrically connected to the transistor 271. Furthermore, when the conductive layer 18 and the conductive layer 24 are joined to each other, the transistor 116 can be electrically connected to the transistor 271.

Note that for a bonding method, and the conductive layers and the insulating layers that function as bonding layers, the description of the bonding between the layer 202b and the layer 203 can be referred to.

<Stacked Structure 3>

Figure 24:
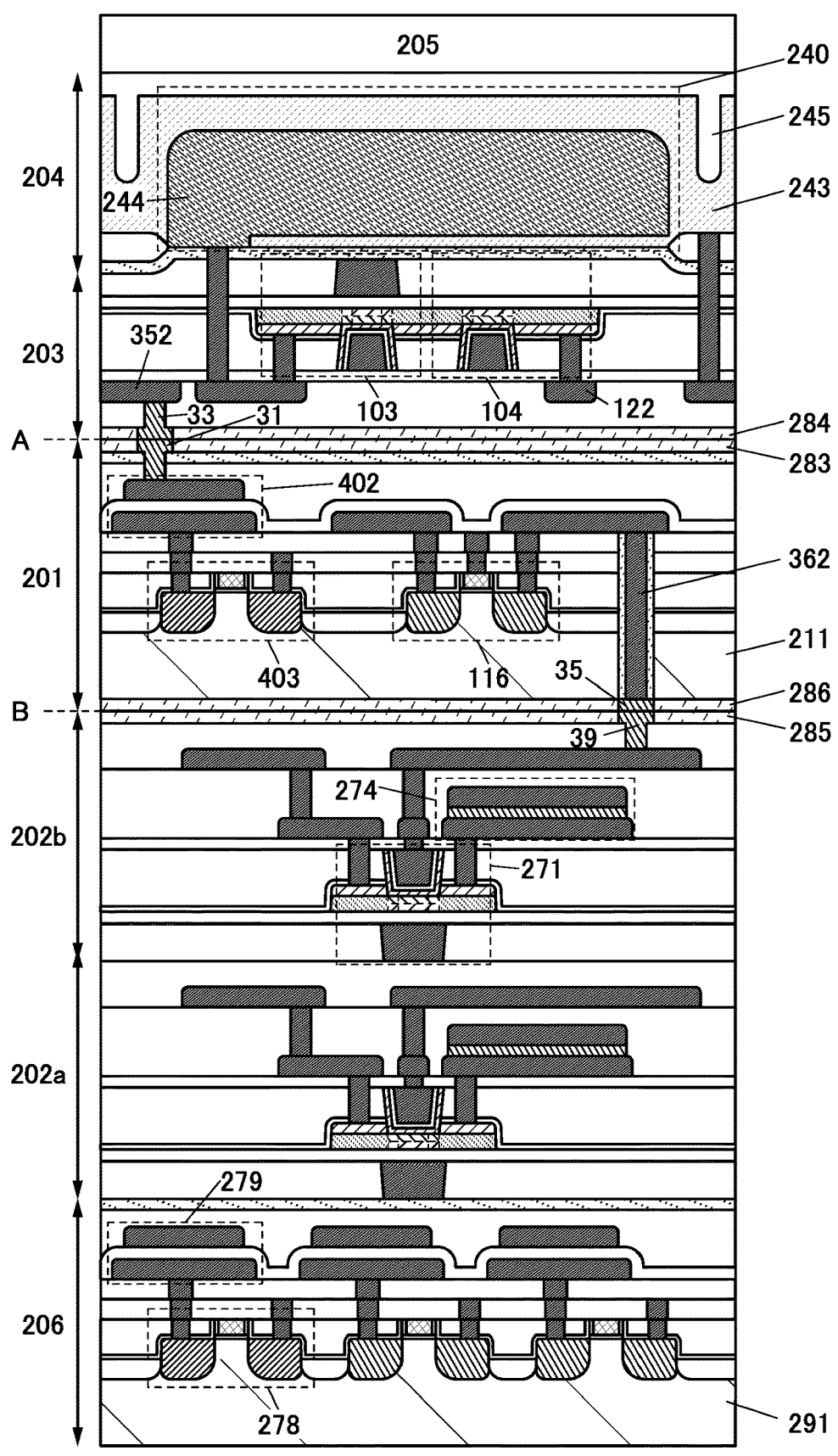
FIG. 24 is a cross-sectional view illustrating a pixel.

FIG. 24 is an example of a cross-sectional view of the stack illustrated in FIG. 8A and FIG. 8B. The details of the layer 205 are omitted. The basic structures in the layer 201 to the layer 204 are similar to those in Stacked Structure 1, and only differences are described. Note that FIG. 24 illustrates the transistor 403, the transistor 116, and the capacitor 402 in the layer 201. In addition, in the layer 206, the transistor 278 and the capacitor 279 that are provided on a silicon substrate 291 are illustrated. The transistor 278 and the capacitor 279 are DRAM components.

As layers that are the closest to the layer 203 in the layer 201, an insulating layer 283 and the conductive layer 31 are provided. The insulating layer 283 and the conductive layer 31 each have a function of a bonding layer.

As layers that are the closest to the layer 201 in the layer 203, an insulating layer 284 and the conductive layer 33 are provided. The insulating layer 284 and the conductive layer 33 each have a function of a bonding layer.

When the conductive layer 31 and the conductive layer 33 are joined to each other in the position A, the capacitor 402 can be electrically connected to the wiring 352.

As layers that are the closest to the layer 202b in the layer 201, an insulating layer 286 and the conductive layer 35 are provided. The insulating layer 286 and the conductive layer 35 each have a function of a bonding layer. Note that the conductive layer 35 is electrically connected to the transistor 116 through a through wiring 362 that penetrates the silicon substrate 211.

As layers that are the closest to the layer 201 in the layer 202b, an insulating layer 285 and the conductive layer 39 are provided. The insulating layer 285 and the conductive layer 39 each have a function of a bonding layer.

When the conductive layer 35 and the conductive layer 39 are joined to each other in the position B, the transistor 116 can be electrically connected to the transistor 271.

Note that for a bonding method, and the conductive layers and the insulating layers that function as bonding layers, the description of the bonding between the layer 202b and the layer 203 can be referred to.

<Stacked Structure 4>

Figure 25:
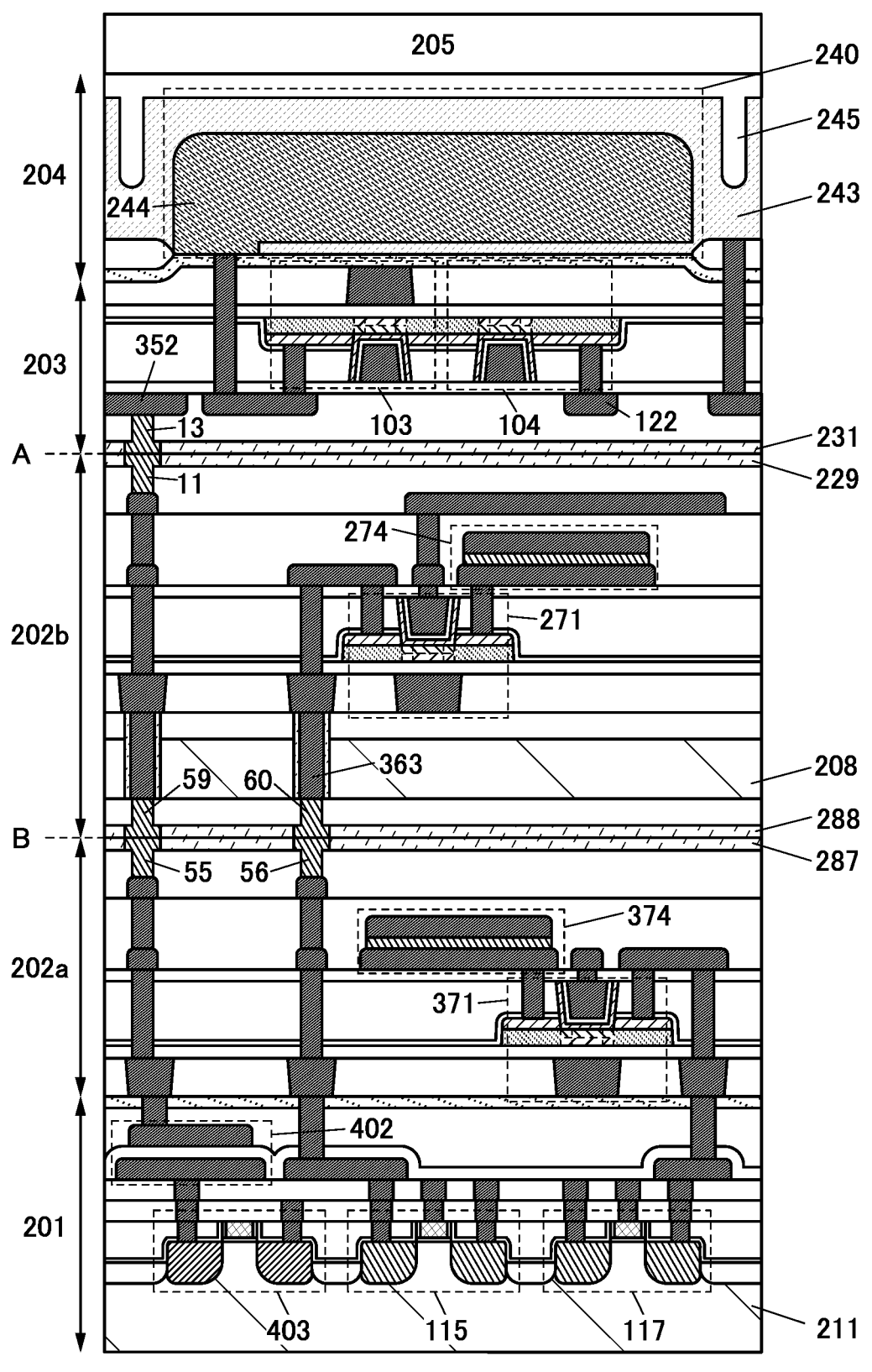
FIG. 25 is a cross-sectional view illustrating a pixel.

FIG. 25 is an example of a cross-sectional view of the stack illustrated in FIG. 9A and FIG. 9B. The details of the layer 205 are omitted. The basic structures in the layer 201 to the layer 204 are similar to those in Stacked Structure 1, and only differences are described. Note that FIG. 25 illustrates the transistor 403, the transistor 115, a transistor 117, and the capacitor 402 in the layer 201. Here, the transistor 117 is a component included in the arithmetic circuit.

As layers that are the closest to the layer 202a in the layer 202b, an insulating layer 288, the conductive layer 59, and the conductive layer 60 are provided. The insulating layer 288, the conductive layer 59, and the conductive layer 60 each have a function of a bonding layer.

As layers that are the closest to the layer 202b in the layer 202a, an insulating layer 287, the conductive layer 55, and the conductive layer 56 are provided. The insulating layer 287, the conductive layer 55, and the conductive layer 56 each have a function of a bonding layer.

In the layer 202b, the support region 208 including the single crystal silicon substrate is provided between the insulating layer 288 and the transistor 271. Each of the conductive layer 59 and the conductive layer 60 is electrically connected to one of end portions of a through wiring 363 that penetrates the single crystal silicon substrate. The other of the end portions of the through wiring 363 is electrically connected to a wiring that is connected to the pixel circuit, the memory circuit, or the like.

When the conductive layer 55 and the conductive layer 59 are joined to each other in the position B, the capacitor 402 can be electrically connected to the wiring 352. In addition, when the conductive layer 56 and the conductive layer 60 are joined to each other, the transistor 115 can be electrically connected to the transistor 271.

Note that for a bonding method, and the conductive layers and the insulating layers that function as bonding layers, the description of the bonding between the layer 202b and the layer 203 can be referred to.

The transistor 117 that is included in the arithmetic circuit provided in the layer 201 is electrically connected to a transistor 371 included in the layer 202a. The transistor 371 and a capacitor 374 that are included in the layer 202a are components of the memory circuit, and the memory circuit can be used as a primary storage device of the arithmetic circuit.

<Stacked Structure 5>

Figure 26:
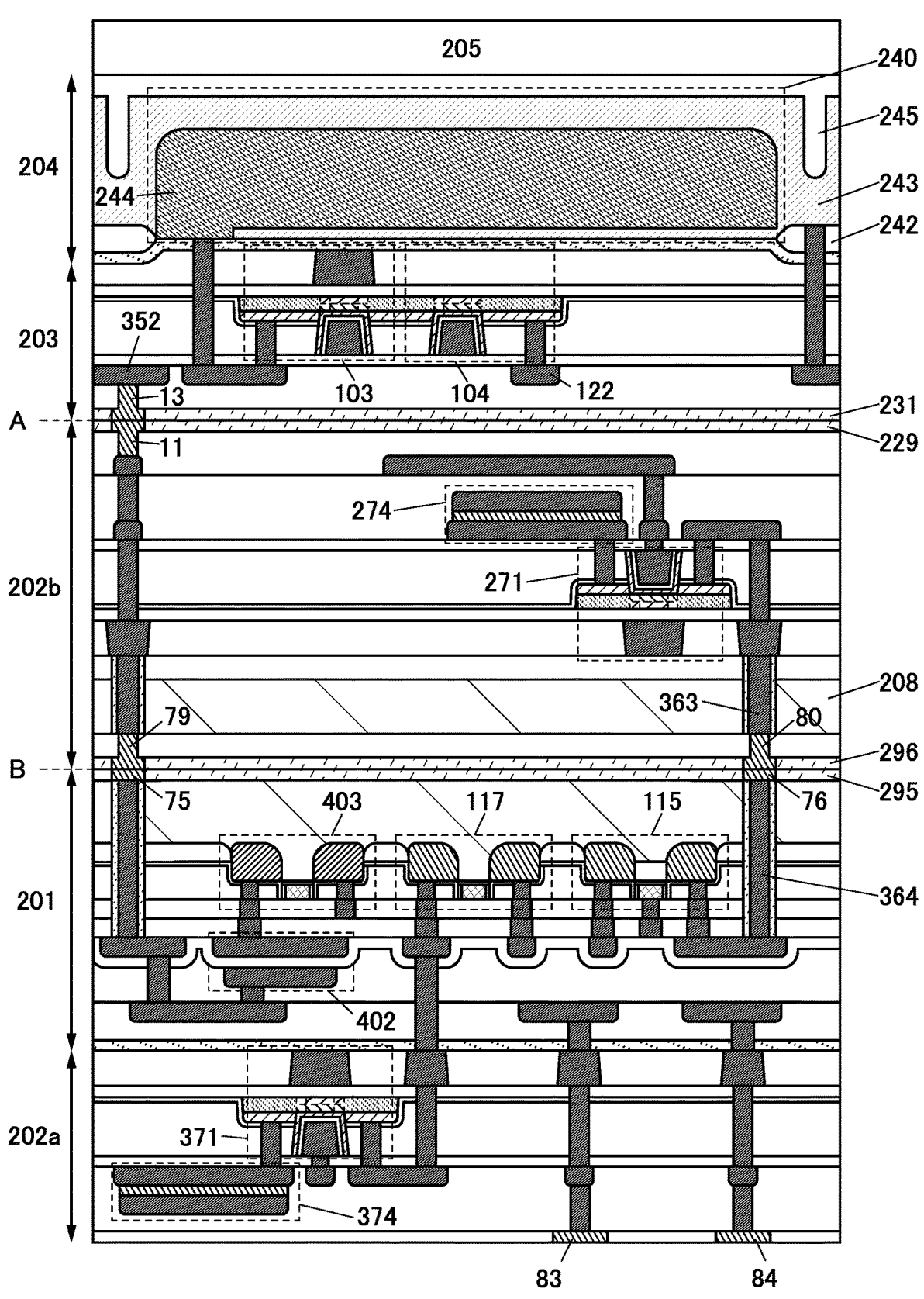
FIG. 26 is a cross-sectional view illustrating a pixel.

FIG. 26 is an example of a cross-sectional view of the stack illustrated in FIG. 10A and FIG. 10B. The details of the layer 205 are omitted. The basic structures in the layer 201 to the layer 204 are similar to those in Stacked Structure 1, and only differences are described. Note that FIG. 25 illustrates the transistor 403, the transistor 115, the transistor 117, and the capacitor 402 in the layer 201. Here, the transistor 117 is a component included in the arithmetic circuit.

As layers that are the closest to the layer 201 in the layer 202b, an insulating layer 296, the conductive layer 79, and the conductive layer 80 are provided. The insulating layer 296, the conductive layer 79, and the conductive layer 80 each have a function of a bonding layer.

As layers that are the closest to the layer 202b in the layer 201, an insulating layer 295, the conductive layer 75, and the conductive layer 76 are provided. The insulating layer 295, the conductive layer 75, and the conductive layer 76 each have a function of a bonding layer.

In the layer 202b, the support region 208 including the single crystal silicon substrate is provided between the insulating layer 296 and the transistor 271. Each of the conductive layer 79 and the conductive layer 80 is electrically connected to one of end portions of a through wiring 364 that penetrates the single crystal silicon substrate. The other of the end portions of the through wiring 364 is electrically connected to a wiring that is connected to the pixel circuit, the memory circuit, or the like.

When the conductive layer 75 and the conductive layer 79 are joined to each other in the position B, the capacitor 402 can be electrically connected to the wiring 352. In addition, when the conductive layer 76 and the conductive layer 80 are joined to each other, the transistor 115 can be electrically connected to the transistor 271.

Note that for a bonding method, and the conductive layers and the insulating layers that function as bonding layers, the description of the bonding between the layer 202*b* and the layer 203 can be referred to.

Note that the conductive layer 83 and the conductive layer 84 that are exposed to the outside are provided in the layer 202*a*. The conductive layer 83 and the conductive layer 84 can be electrically connected to a wiring included in the layer 201. The wiring can be electrically connected to the read circuit 311, the arithmetic circuit 314, or the like included in the layer 201.

Although this embodiment illustrates the structure where the read circuit of the pixel circuit, the pixel driver circuit, the driver circuit of the memory circuit, and the arithmetic device are provided in the layer 201, the present invention is not limited thereto. For example, a neural network, a communication circuit, a CPU, or the like may be provided in the layer 201 or the layer 201.

A normally-off CPU (also referred to as "Noff-CPU") can be achieved using an OS transistor and a Si transistor. Note that the Noff-CPU is an integrated circuit including a normally-off transistor, which is in a non-conduction state (also referred to as an off state) even when gate voltage is 0 V.

In the Noff-CPU, power supply to a circuit that does not need to operate can be stopped so that the circuit can be set in a standby state. The circuit set in the standby state because of the stop of power supply does not consume power. Thus, the power usage of the Noff-CPU can be minimized. Moreover, the Noff-CPU can retain data necessary for an operation, such as setting conditions, for a long time even when power supply is stopped. The return from the standby state requires only restart of power supply to the circuit and does not require rewriting of setting conditions or the like. In other words, a high-speed return from the standby state is possible. As described here, the power consumption of the Noff-CPU can be reduced without a significant decrease in operating speed.

This embodiment can be combined with the description of the other embodiments as appropriate.

Embodiment 2

In this embodiment, examples of a package and a camera module in each of which an image sensor chip is placed will be described. For the image sensor chip, the structure of the imaging device according to one embodiment of the present invention can be used.

Figure 28A:
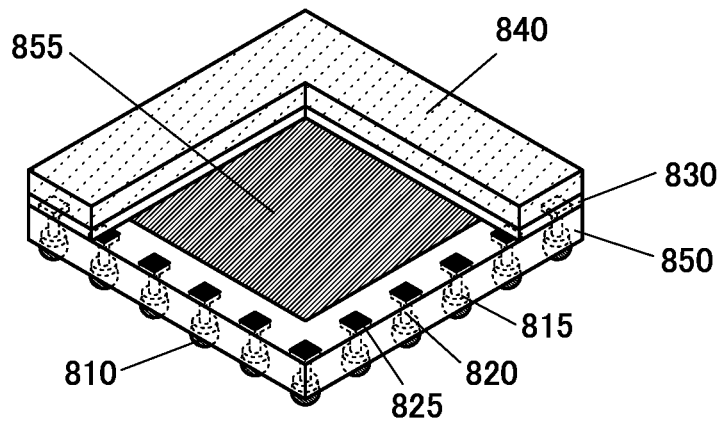
FIG. 28A is a diagram illustrating a package in which an imaging device is placed.

FIG. 28A is an external perspective view of a package containing an image sensor chip. The package is a CSP (Chip Size Package), which includes a bare chip 850 of an image sensor, cover glass 840, an adhesive 830 that bonds them, and the like.

Electrode pads 825 provided on the outside of a pixel array 855 are electrically connected to back electrodes 815 via through electrodes 820. The electrode pads 825 are electrically connected to a circuit constituting the image sensor, with wirings or wires. Note that the bare chip 850 may be a stacked chip in which a circuit having a variety of functions is stacked.

The example in FIG. 28A illustrates a BGA (Ball Grid Array) with a structure in which bumps 810 are formed with solder balls on the back electrodes 815. Note that, without being limited to the BGA, an LGA (Land Grid Array), a PGA (Pin Grid Array), or the like may be employed. Alternatively, a package in which the bare chip 850 is mounted on a QFN (Quad Flat No-lead package) or a QFP (Quad Flat Package) may be used.

Figure 28B:
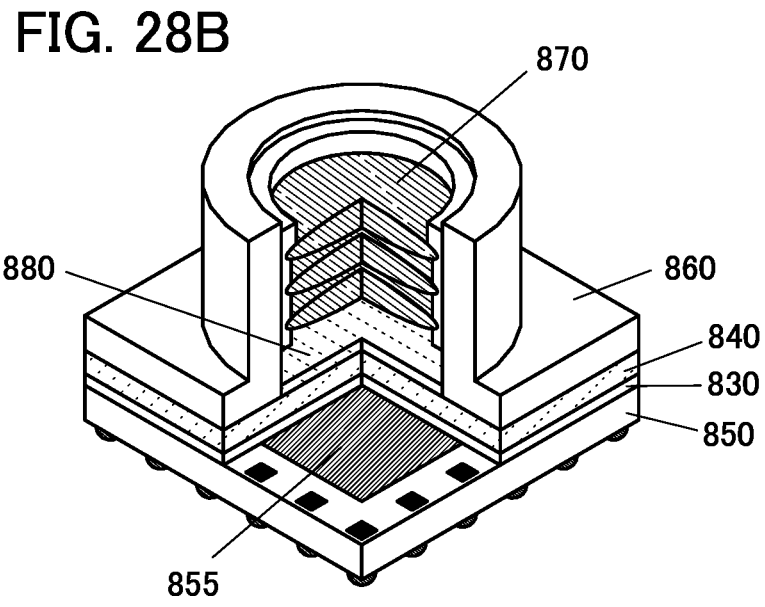
FIG. 28B is a diagram illustrating a module in which the imaging device is placed.

In addition, FIG. 28B is an external perspective view from the top surface side of a camera module with a combination of an image sensor chip and a lens. The camera module includes a lens cover 860, a plurality of lenses 870, and the like over the structure of FIG. 28A. Furthermore, an optical filter 880 that absorbs light with a certain wavelength is provided as needed between the lens 870 and the cover glass 840. For example, in the case where the image sensor mainly performs visible light imaging, an infrared cut filter or the like can be used as the optical filter 880.

The image sensor chip placed in a package having the above form can be easily mounted on a printed circuit board and the like; therefore, the image sensor chip can be incorporated into a variety of semiconductor apparatuses and electronic devices.

This embodiment can be combined with the description of the other embodiments as appropriate.

Embodiment 3

As electronic devices that can use the imaging device according to one embodiment of the present invention, display devices, personal computers, image memory devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 29A to FIG. 29F illustrate specific examples of these electronic devices.

FIG. 29A is an example of a cellular phone, which includes a housing 981, a display portion 982, operation buttons 983, an external connection port 984, a speaker 985, a microphone 986, a camera 987, and the like. The display portion 982 of the cellular phone is provided with a touch sensor. All operations including making a call and inputting text can be performed by touch on the display portion 982 with a finger, a stylus, or the like. The imaging device according to one embodiment of the present invention can be employed in the cellular phone.

FIG. 29B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device according to one embodiment of the present invention can be employed in the portable data terminal.

FIG. 29C is a surveillance camera, which includes a support base 951, a camera unit 952, a protection cover 953, and the like. By setting the camera unit 952 provided with a rotating mechanism and the like on a ceiling, an image of all the surroundings can be taken. The imaging device according to one embodiment of the present invention can be employed for capturing an image by the camera unit. Note that a surveillance camera is a name in common use and does not limit the use thereof. A device that has a function of a surveillance camera is also called a camera or a video camera, for example.

FIG. 29D is a dashboard camera, which includes a frame 941, a camera 942, operation buttons 943, an attaching member 944, and the like. When the attaching member 944 is set on a front window or the like of a motor vehicle, the landscape ahead in driving can be recorded. Note that a display panel displaying a recorded image is provided on a rear surface, which is not illustrated. The imaging device according to one embodiment of the present invention can be employed in the camera 942.

FIG. 29E is a digital camera, which includes a housing 961, a shutter button 962, a microphone 963, a light-emitting portion 967, a lens 965, and the like. The imaging device according to one embodiment of the present invention can be employed in the digital camera.

FIG. 29F is a wrist-watch-type information terminal, which includes a display portion 932, a housing/wristband 933, a camera 939, and the like. The display portion 932 is provided with a touch panel for performing the operation of the information terminal. The display portion 932 and the housing/wristband 933 have flexibility and fit a body well. The imaging device according to one embodiment of the present invention can be employed in the information terminal.

Figure 30A:
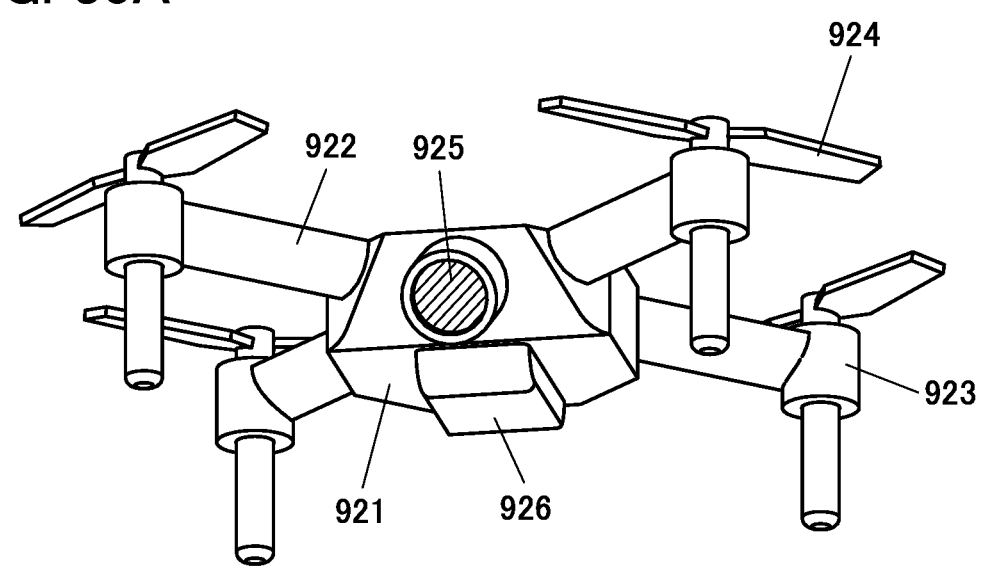
FIG. 30A and FIG. 30B are diagrams illustrating moving objects.

FIG. 30A is a drone as an example of a moving vehicle, which includes a frame 921, an arm 922, a rotor 923, a blade 924, a camera 925, a battery 926, and the like and has a function of flying autonomously, a function of staying still in midair, and the like. The imaging device according to one embodiment of the present invention can be employed in the camera 925.

Figure 30B:
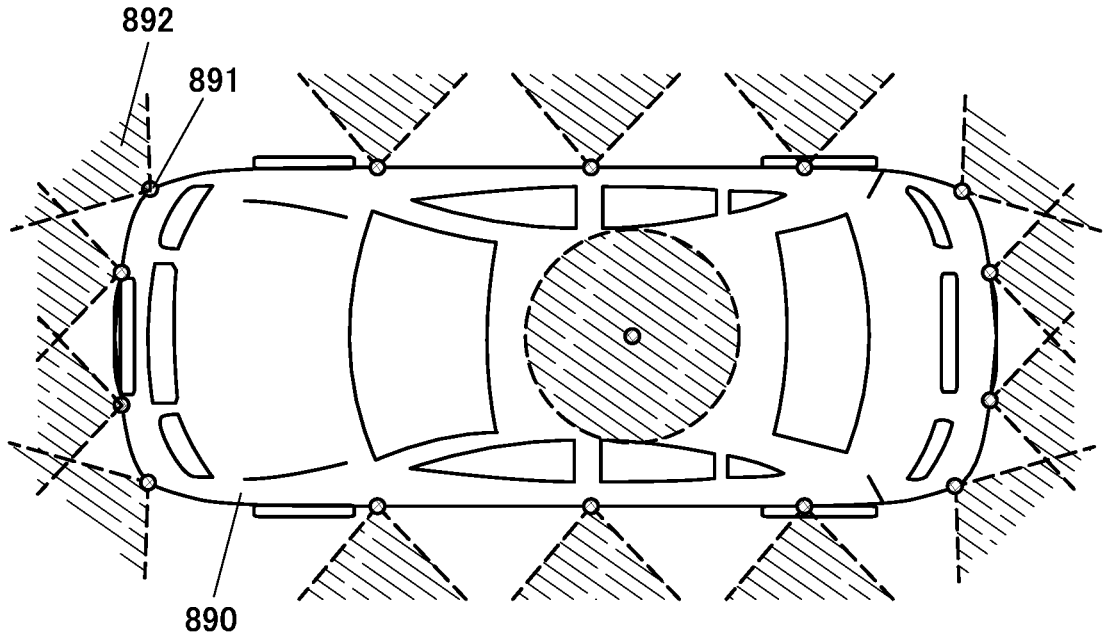

FIG. 30B illustrates an external view of a motor vehicle as an example of a moving vehicle. A motor vehicle 890 includes a plurality of cameras 891 and the like, and can obtain information on the front, rear, left, and right sides and the upper side of the motor vehicle 890. The imaging device according to one embodiment of the present invention can be employed in the cameras 891. The motor vehicle 890 is also provided with a variety of sensors such as an infrared radar, a millimeter wave radar, and a laser radar (not illustrated) and the like. The motor vehicle 890 judges traffic conditions there around such as the presence of a guardrail or a pedestrian by analyzing images in a plurality of imaging directions 892 taken by the cameras 891, and thus can perform autonomous driving. It can be also used for a system for navigation, risk prediction, or the like.

When arithmetic processing with a neural network or the like is performed on the obtained image data in the imaging device according to one embodiment of the present invention, for example, processing such as an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection can be performed.

Note that the motor vehicle may be any of a motor vehicle having an internal-combustion engine, an electric vehicle, a hydrogen vehicle, and the like. Furthermore, the moving vehicle is not limited to a motor vehicle. Examples of the moving vehicle also include a train, a monorail train, a ship, and a flying vehicle (a helicopter, an unmanned aircraft, an airplane, and a rocket), and these moving vehicles can include a system utilizing artificial intelligence when equipped with a computer of one embodiment of the present invention.

This embodiment can be combined with the description of the other embodiments as appropriate.

REFERENCE NUMERALS

11: conductive layer, 12: conductive layer, 13: conductive layer, 14: conductive layer, 15: conductive layer, 16:

conductive layer, 17: conductive layer, 18: conductive layer, 19: conductive layer, 20: conductive layer, 21: conductive layer, 22: conductive layer, 23: conductive layer, 24: conductive layer, 25: conductive layer, 26: conductive layer, 31: conductive layer, 32: conductive layer, 33: conductive layer, 34: conductive layer, 35: conductive layer, 36: conductive layer, 37: conductive layer, 38: conductive layer, 39: conductive layer, 40: conductive layer, 41: conductive layer, 42: conductive layer, 55: conductive layer, 56: conductive layer, 57: conductive layer, 58: conductive layer, 59: conductive layer, 60: conductive layer, 61: conductive layer, 62: conductive layer, 75: conductive layer, 76: conductive layer, 77: conductive layer, 78: conductive layer, 79: conductive layer, 80: conductive layer, 81: conductive layer, 82: conductive layer, 83: conductive layer, 84: conductive layer, 91: curve, 92: curve, 102: transistor, 103: transistor, 104: transistor, 105: transistor, 106: transistor, 108: capacitor, 115: transistor, 116: transistor, 117: transistor, 121: wiring, 122: wiring, 123: wiring, 126: wiring, 127: wiring, 128: wiring, 201: layer, 202$a$: layer, 202$b$: layer, 203: layer, 204: layer, 205: layer, 206: layer, 208: support region, 210: region, 211: silicon substrate, 212: insulating layer, 213: insulating layer, 214: insulating layer, 215: insulating layer, 216: insulating layer, 217: insulating layer, 218: insulating layer, 220$a$: region, 220$b$: region, 221: insulating layer, 222: insulating layer, 223: insulating layer, 224: insulating layer, 225: insulating layer, 227: insulating layer, 228: insulating layer, 229: insulating layer, 230: region, 231: insulating layer, 232: insulating layer, 233: insulating layer, 234: insulating layer, 235: insulating layer, 236: insulating layer, 240: photoelectric conversion device, 241: insulating layer, 242: insulating layer, 243: p-type region, 244: n-type region, 245: insulating layer, 250: optical conversion layer, 250B: color filter, 250G: color filter, 250IR: infrared filter, 250R: color filter, 250UV: ultraviolet filter, 251: light-blocking layer, 255: microlens array, 260: region, 271: transistor, 272: transistor, 273: transistor, 274: capacitor, 275: capacitor, 276: transistor, 277: capacitor, 278: transistor, 279: capacitor, 281: insulating layer, 282: insulating layer, 283: insulating layer, 284: insulating layer, 285: insulating layer, 286: insulating layer, 287: insulating layer, 288: insulating layer, 291: silicon substrate, 295: insulating layer, 296: insulating layer, 311: circuit, 312: driver circuit, 313: driver circuit, 314: arithmetic circuit, 321$a$: memory circuit, 321$b$: memory circuit, 321$c$: memory cell, 321$cl$: memory cell, 321$c2$: memory cell, 321$c3$: memory cell, 321$d$: memory cell, 321$e$: memory cell, 321$m$: memory circuit, 321$n$: memory circuit, 322: memory cell, 323: memory cell, 324: memory circuit, 325: memory circuit, 331: pixel circuit, 332: driver circuit, 341: row driver, 342: column driver, 343: gate driver, 344: source driver, 345: circuit, 352: wiring, 353: wiring, 360: through wiring, 361: insulating layer, 362: through wiring, 363: through wiring, 364: through wiring, 371: transistor, 374: capacitor, 400: CDS circuit, 401: resistor, 402: capacitor, 403: transistor, 404: transistor, 405: capacitor, 410: A/D converter, 535: back gate, 545: semiconductor layer, 546: insulating layer, 701: gate electrode, 702: gate insulating film, 703: source region, 704: drain region, 705: source electrode, 706: drain electrode, 707: oxide semiconductor layer, 708: channel formation region, 810: bump, 815: rear electrode, 820: through electrode, 825: electrode pad, 830: adhesive, 840: cover glass, 850: bare chip, 855: pixel array, 860: lens cover, 870: lens, 880: optical filter, 890: motor vehicle, 891: camera, 892: imaging direction, 911: housing, 912: display portion, 913: speaker, 919: camera, 921: frame, 922: arm, 923: rotor, 924: blade, 925: camera, 926: battery, 932: display portion, 933: housing/wristband, 939: camera, 941: frame, 942: camera, 943: operation button, 944: member, 951: support base, 952: camera unit, 953: protection cover, 961: housing, 962: shutter button, 963: microphone, 965: lens, 967: light-emitting portion, 981: housing, 982: display portion, 983: operation button, 984: external connection port, 985: speaker, 986: microphone, and 987: camera.

The invention claimed is:

1. An imaging device comprising:
a first layer;
a second layer;
a third layer;
a fourth layer; and
a fifth layer,
wherein the first layer and the fifth layer overlap each other,
wherein the second layer, the third layer, and the fourth layer are provided between the first layer and the fifth layer,
wherein the second layer is provided between the first layer and the third layer,
wherein the fourth layer is provided between the third layer and the fifth layer,
wherein the first layer includes a read circuit, a first driver circuit, and a second driver circuit,
wherein the second layer includes a first transistor included in a first memory circuit,
wherein the third layer includes a second transistor included in a second memory circuit, a first conductive layer, and a second conductive layer,
wherein the fourth layer includes a third transistor included in a pixel circuit, a third conductive layer, and a fourth conductive layer,
wherein the fifth layer includes a photoelectric conversion device included in the pixel circuit,
wherein the pixel circuit is electrically connected to the read circuit through the first conductive layer and the third conductive layer,
wherein the pixel circuit is electrically connected to the first driver circuit through the second conductive layer and the fourth conductive layer,
wherein the first memory circuit and the second memory circuit are electrically connected to the read circuit and the second driver circuit,
wherein the first transistor, the second transistor, and the third transistor each include a metal oxide in a channel formation region,
wherein the first conductive layer and the third conductive layer are directly joined to each other, and
wherein the second conductive layer and the fourth conductive layer are directly joined to each other.

2. The imaging device according to claim 1,
wherein the first layer includes an arithmetic circuit, and
wherein the arithmetic circuit is electrically connected to the second driver circuit.

3. The imaging device according to claim 1,
wherein the first conductive layer to the fourth conductive layer are formed of the same metal material, and
wherein the metal material is Cu, Al, W, or Au.

4. The imaging device according to claim 1, wherein the first layer and the fifth layer each include a single crystal silicon substrate.

5. The imaging device according to claim 1, wherein the metal oxide includes In, Zn, and M, M being one or more of Al, Ti, Ga, Ge, Sn, Y, Zr, La, Ce, Nd, and Hf.

6. An electronic device comprising the imaging device according to claim 1 and a display portion.

7. An imaging device comprising:
a first layer;
a second layer;
a third layer;
a fourth layer; and
a fifth layer,
wherein the first layer and the fifth layer overlap each other,
wherein the second layer, the third layer, and the fourth layer are provided between the first layer and the fifth layer,
wherein the second layer is provided between the first layer and the third layer,
wherein the fourth layer is provided between the third layer and the fifth layer,
wherein the first layer includes a read circuit, a first driver circuit, a second driver circuit, a first conductive layer, a second conductive layer, a third conductive layer, a fourth conductive layer, a fifth conductive layer, and a sixth conductive layer,
wherein the second layer includes a first transistor included in a first memory circuit, a seventh conductive layer, an eighth conductive layer, a ninth conductive layer, a tenth conductive layer, an eleventh conductive layer, and a twelfth conductive layer,
wherein the third layer includes a second transistor included in a second memory circuit, a thirteenth conductive layer, and a fourteenth conductive layer,
wherein the fourth layer includes a third transistor included in a pixel circuit, a fifteenth conductive layer, and a sixteenth conductive layer,
wherein the fifth layer includes a photoelectric conversion device included in the pixel circuit,
wherein the pixel circuit is electrically connected to the read circuit through the first conductive layer, the seventh conductive layer, the thirteenth conductive layer, and the fifteenth conductive layer,
wherein the pixel circuit is electrically connected to the first driver circuit through the second conductive layer, the eighth conductive layer, the fourteenth conductive layer, and the sixteenth conductive layer,
wherein the first memory circuit is electrically connected to the read circuit through the third conductive layer and the ninth conductive layer,
wherein the first memory circuit is electrically connected to the second driver circuit through the fourth conductive layer and the tenth conductive layer,
wherein the second memory circuit is electrically connected to the read circuit through the fifth conductive layer and the eleventh conductive layer,
wherein the second memory circuit is electrically connected to the second driver circuit through the sixth conductive layer and the twelfth conductive layer,
wherein the first transistor, the second transistor, and the third transistor each include a metal oxide in a channel formation region,
wherein the first conductive layer and the seventh conductive layer are directly joined to each other, wherein the second conductive layer and the eighth conductive layer are directly joined to each other, wherein the third conductive layer and the ninth conductive layer are directly joined to each other, wherein the fourth conductive layer and the tenth conductive layer are directly joined to each other, wherein the fifth conductive layer and the eleventh conductive layer are directly joined to each other, wherein the sixth conductive layer and the twelfth conductive layer are directly joined to each other, wherein the thirteenth conductive layer and the fifteenth conductive layer are directly joined to each other, and wherein the fourteenth conductive layer and the sixteenth conductive layer are directly joined to each other.

8. The imaging device according to claim 7, wherein the first layer includes an arithmetic circuit, and wherein the arithmetic circuit is electrically connected to the second driver circuit.

9. The imaging device according to claim 7, wherein the first conductive layer to the twelfth conductive layer are formed of the same first metal material, wherein the thirteenth conductive layer to the sixteenth conductive layer are formed of the same second metal material, wherein the first metal material is Cu, Al, W, or Au, and wherein the second metal material is Cu, Al, W, or Au.

10. The imaging device according to claim 7, wherein the second layer includes a support region including a single crystal silicon substrate, and wherein the seventh conductive layer to the twelfth conductive layer are provided in the support region.

11. The imaging device according to claim 7, wherein the first layer and the fifth layer each include a single crystal silicon substrate.

12. The imaging device according to claim 7, wherein the metal oxide includes In, Zn, and M, M being one or more of Al, Ti, Ga, Ge, Sn, Y, Zr, La, Ce, Nd, and Hf.

13. An electronic device comprising the imaging device according to claim 7 and a display portion.

14. An imaging device comprising:

a first layer;

a second layer;

a third layer;

a fourth layer; and a fifth layer, wherein the first layer and the fifth layer overlap each other, wherein the second layer, the third layer, and the fourth layer are provided between the first layer and the fifth layer, wherein the second layer is provided between the first layer and the third layer, wherein the fourth layer is provided between the third layer and the fifth layer, wherein the first layer includes a read circuit, a first driver circuit, a second driver circuit, and an arithmetic circuit, wherein the second layer includes a first transistor included in a first memory circuit, a first conductive layer, a second conductive layer, a third conductive layer, and a fourth conductive layer, wherein the third layer includes a second transistor included in a second memory circuit, a fifth conductive layer, a sixth conductive layer, a seventh conductive layer, an eighth conductive layer, a ninth conductive layer, and a tenth conductive layer, wherein the fourth layer includes a third transistor included in a pixel circuit, an eleventh conductive layer, and a twelfth conductive layer, wherein the fifth layer includes a photoelectric conversion device included in the pixel circuit, wherein the pixel circuit is electrically connected to the read circuit through the first conductive layer, the fifth conductive layer, the ninth conductive layer, and the eleventh conductive layer, wherein the pixel circuit is electrically connected to the first driver circuit through the second conductive layer, the sixth conductive layer, the tenth conductive layer, and the twelfth conductive layer, wherein the first memory circuit is electrically connected to the arithmetic circuit, wherein the second memory circuit is electrically connected to the read circuit through the third conductive layer and the seventh conductive layer, wherein the second memory circuit is electrically connected to the second driver circuit through the fourth conductive layer and the eighth conductive layer, wherein the first transistor, the second transistor, and the third transistor each include a metal oxide in a channel formation region, wherein the first conductive layer and the fifth conductive layer are directly joined to each other, wherein the second conductive layer and the sixth conductive layer are directly joined to each other, wherein the third conductive layer and the seventh conductive layer are directly joined to each other, wherein the fourth conductive layer and the eighth conductive layer are directly joined to each other, wherein the ninth conductive layer and the eleventh conductive layer are directly joined to each other, and wherein the tenth conductive layer and the twelfth conductive layer are each directly joined to each other.

15. The imaging device according to claim 14, wherein the first conductive layer to the eighth conductive layer are formed of the same first metal material, wherein the ninth conductive layer to the twelfth conductive layer are formed of the same second metal material, wherein the first metal material is Cu, Al, W, or Au, and wherein the second metal material is Cu, Al, W, or Au.

16. The imaging device according to claim 14, wherein the third layer includes a support region including a single crystal silicon substrate, and wherein the fifth conductive layer to the eighth conductive layer are provided in the support region.

17. The imaging device according to claim 14, wherein the first layer and the fifth layer each include a single crystal silicon substrate.

18. The imaging device according to claim 14, wherein the metal oxide includes In, Zn, and M, M being one or more of Al, Ti, Ga, Ge, Sn, Y, Zr, La, Ce, Nd, and Hf.

19. An electronic device comprising the imaging device according to claim 14 and a display portion.

* * * * *